US012566519B2

(12) United States Patent
Jeon et al.

(10) Patent No.:  US 12,566,519 B2
(45) Date of Patent:  Mar. 3, 2026

(54) ELECTRONIC DEVICE

(71) Applicant: SAMSUNG DISPLAY CO., LTD.,
Yongin-si (KR)

(72) Inventors: Hyunjee Jeon, Yongin-si (KR);
Sanghyun Lim, Yongin-si (KR)

(73) Assignee: SAMSUNG DISPLAY CO., LTD.,
Yongin-si (KR)

( * ) Notice: Subject to any disclaimer, the term of this
patent is extended or adjusted under 35
U.S.C. 154(b) by 0 days.

(21) Appl. No.: 18/895,651

(22) Filed: Sep. 25, 2024

(65) Prior Publication Data

US 2025/0216980 A1     Jul. 3, 2025

(30) Foreign Application Priority Data

Dec. 28, 2023    (KR) ........................ 10-2023-0194849

(51) Int. Cl.
　　*G06F 3/041*　　　(2006.01)
　　*G06F 3/046*　　　(2006.01)
　　*G09G 3/3233*　　　(2016.01)
　　*H10K 59/131*　　　(2023.01)
　　*H10K 59/40*　　　(2023.01)

(52) U.S. Cl.
　　CPC .......... *G06F 3/0418* (2013.01); *G06F 3/0412*
　　　(2013.01); *G06F 3/04166* (2019.05); *G06F*
　　　*3/046* (2013.01); *G09G 3/3233* (2013.01);
　　　*G09G 2300/0426* (2013.01); *G09G 2300/0819*
　　　(2013.01); *G09G 2300/0842* (2013.01); *G09G*
　　　*2300/0861* (2013.01); *G09G 2320/0238*
　　　(2013.01); *H10K 59/131* (2023.02); *H10K*
　　　*59/40* (2023.02)

(58) Field of Classification Search
CPC .. G06F 3/0418; G06F 3/0412; G06F 3/04166;
　　　G06F 3/046; G09G 3/3233; G09G
　　　2300/0426; G09G 2300/0819; G09G
　　　2300/0842; G09G 2300/0861; G09G
　　　2320/0238; H10K 59/131; H10K 59/40
See application file for complete search history.

(56) References Cited

U.S. PATENT DOCUMENTS

| | | | |
|---|---|---|---|
| 11,650,695 B2 | 5/2023 | Lim | |
| 2008/0150914 A1* | 6/2008 | Yamamoto | .............. G06F 3/046 |
| | | | 345/175 |
| 2014/0078101 A1 | 3/2014 | Katsurahira | |

(Continued)

FOREIGN PATENT DOCUMENTS

| | | |
|---|---|---|
| JP | 2020095075 | 6/2020 |
| JP | 7355881 | 9/2023 |

(Continued)

*Primary Examiner* — Hong Zhou
(74) *Attorney, Agent, or Firm* — F. CHAU &
ASSOCIATES, LLC

(57)　　　　　　ABSTRACT

An electronic device includes a base layer, a light emitting
element, an input sensor, a data line and a charging elec-
trode. The charging electrode is disposed below the light-
emitting element and includes a plurality of first line por-
tions, each of which crosses the data line in a plan view. The
charging electrode generates an induced magnetic field
when a first one of the plurality of first line portions receives
a first driving signal and a second one of the plurality of line
portions receives a second driving signal whose is phase is
delayed from the first driving signal.

30 Claims, 40 Drawing Sheets

(56) References Cited

U.S. PATENT DOCUMENTS

| | | | | |
|---|---|---|---|---|
| 2014/0168154 A1* | 6/2014 | Wang | ..................... | G06F 3/0412 |
| | | | | 345/174 |
| 2016/0349921 A1* | 12/2016 | Mizuhashi | .............. | G06F 3/046 |
| 2019/0012017 A1* | 1/2019 | Kurasawa | ............ | G09G 3/3696 |
| 2022/0197440 A1* | 6/2022 | Son | ........................ | G06F 3/0418 |
| 2022/0334700 A1* | 10/2022 | Lim | .................... | G06F 3/04164 |
| 2022/0404931 A1* | 12/2022 | Kim | .................... | G06F 3/04164 |
| 2024/0094842 A1* | 3/2024 | Kim | ..................... | G06F 3/0446 |
| 2024/0231532 A1* | 7/2024 | Kim | ........................ | G06F 3/046 |

FOREIGN PATENT DOCUMENTS

| | | |
|---|---|---|
| KR | 10-2151545 | 9/2020 |
| KR | 10-2023-0023857 | 2/2023 |

* cited by examiner

| | CH1 | CH2 | CH3 | CH4 | CH5 | CH6 | CH7 | CH8 | CH9 | CH10 |
|---|---|---|---|---|---|---|---|---|---|---|
| t10 | SG2 | FL | SG1 | FL | FL | FL | FL | FL | FL | FL |
| t20 | FL | SG2 | FL | SG1 | FL | FL | FL | FL | FL | FL |
| t30 | FL | FL | SG2 | FL | SG1 | FL | FL | FL | FL | FL |
| t40 | FL | FL | FL | SG2 | FL | SG1 | FL | FL | FL | FL |
| t50 | FL | FL | FL | FL | SG2 | FL | SG1 | FL | FL | FL |
| t60 | FL | FL | FL | FL | FL | SG2 | FL | SG1 | FL | FL |
| t70 | FL | FL | FL | FL | FL | FL | SG2 | FL | SG1 | FL |
| t80 | FL | FL | FL | FL | FL | FL | FL | SG2 | FL | SG1 |

FIG. 18A

ELECTRONIC DEVICE

CROSS-REFERENCE TO RELATED APPLICATIONS

This U.S. non-provisional patent application claims priority under 35 U.S.C. § 119 to Korean Patent Application No. 10-2023-0194849, filed on Dec. 28, 2023, the disclosure of which is incorporated by reference in its entirety herein.

TECHNICAL FIELD

The present disclosure is directed to an electronic device including an input sensor.

DISCUSSION OF RELATED ART

Multimedia electronic devices such as televisions, mobile phones, tablet computers, laptops, navigation systems, and game consoles include a display device for displaying images. The electronic devices may include a touch-based input system for enabling a user to intuitively, and conveniently input information or a command, different from a general input system such as a button, a keyboard, or a mouse.

A sensor layer of the touch-based input system may sense a touch or pressure of an object (e.g., a finger or pen). For example, the pen may be used for sketching or drawing. The pen may generate a magnetic field when brought close to a charging electrode of the display device. However, interference may occur between a data line of the display device and the charging electrode.

SUMMARY

The present disclosure provides an electronic device capable of sensing inputs by different types of input means that is less susceptible to interference.

An embodiment of the inventive concept provides an electronic device including a base layer, a light-emitting element disposed above the base layer, an input sensor disposed above the light-emitting element, a data line disposed above the base layer, and a charging electrode disposed below the light-emitting element. The charging electrode includes a plurality of first line portions. Each of the first line portions cross the data line in a plan view. The charging electrode generates an indicated magnetic field when a first one of the plurality of first line portions receives a first driving signal and a second one of the plurality of first line portions receives a second driving signal whose phase is delayed from the first driving signal.

In an embodiment of the inventive concept, an electronic device includes: a base layer including a plurality of pixel regions including a first pixel region and a second pixel region disposed in a first direction; a plurality of light-emitting elements including a first light-emitting element corresponding to the first pixel region and a second light-emitting element corresponding to the second pixel region and disposed above the base layer; a plurality of data lines including a first data line extending in a second direction crossing the first direction and corresponding to the first pixel region and a second data line extending in the second direction and corresponding to the second pixel region; a charging electrode disposed below the first light-emitting element and the second light-emitting element and including a plurality of first line portions extending in the second direction; and an offset electrode disposed below the first light-emitting element and the second light-emitting element and including a plurality of offset lines extending in the second direction. The plurality of first line portions include a (1-1)-th line portion disposed on one side of the first data line and a (1-2)-th line portion disposed on one side of the second data line in the first direction, and the plurality of offset lines include a first offset line disposed on the other side of the first data line and a second offset line disposed on the other side of the second data line in the first direction, wherein the first data line is disposed between the (1-1)-th line portion and the first offset line in the first direction, and the second data line is disposed between the (1-2)-th line portion and the second offset line in the first direction. The charging electrode generates an induced magnetic field when the (1-1)-th line portion receives a first driving signal and the (1-2)-th line portion receives a second driving signal whose phase is delayed from the first driving signal. An amplitude of a composite signal of the first driving signal and a first offset signal is less than an amplitude of the first driving signal when the (1-1)-th line portion receives the first driving signal and the first offset line receives the first offset signal.

BRIEF DESCRIPTION OF THE FIGURES

The above and other objects and features of the present disclosure will become apparent by describing in detail embodiments thereof with reference to the accompanying drawings. In the drawings:

FIG. 17C is a table showing signals provided to the sensor layer according to an embodiment of the inventive concept;

FIG. 18A is a plan view illustrating three adjacent channels according to an embodiment of the inventive concept;

DETAILED DESCRIPTION

Figure 1A:
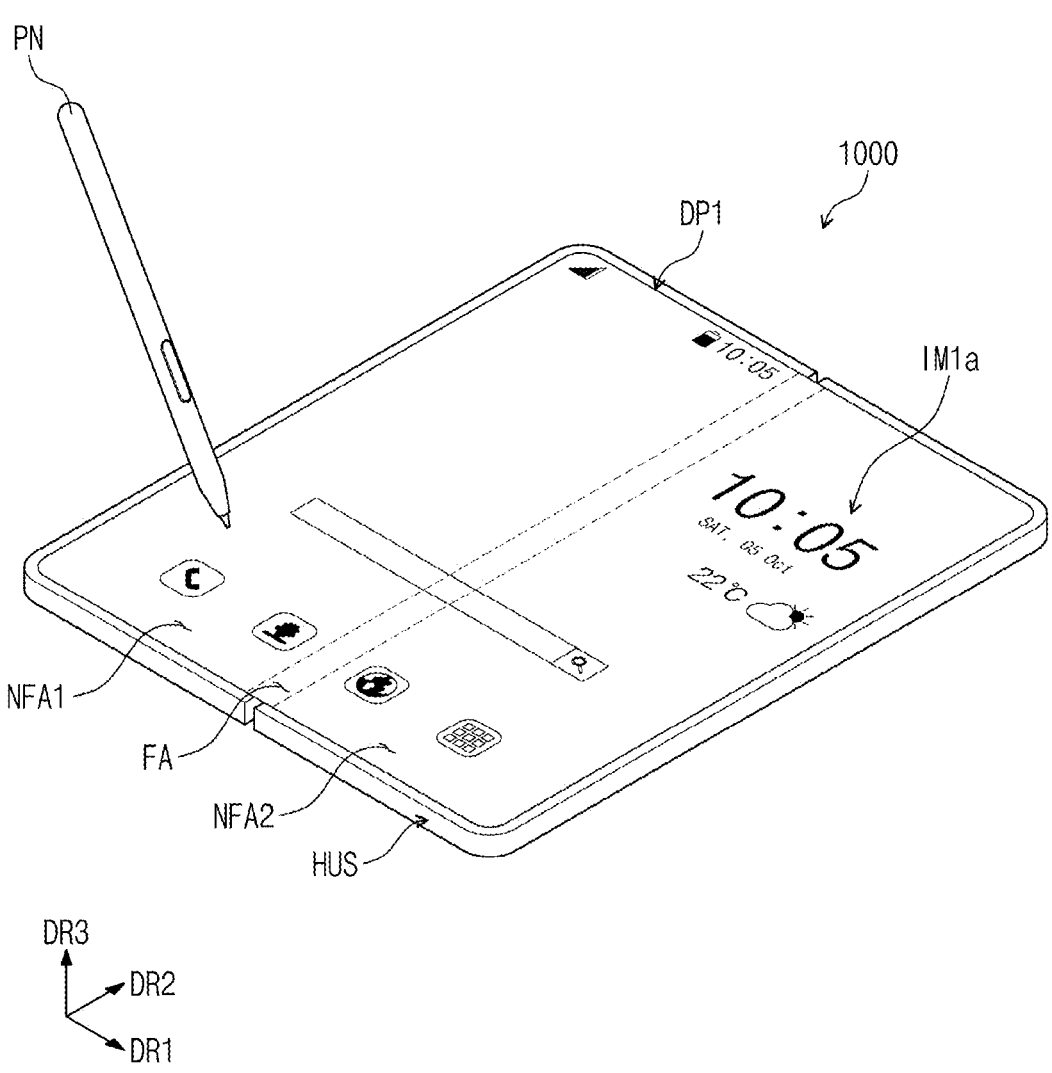
FIG. 1A is a perspective view of an electronic device according to an embodiment of the inventive concept.

In this specification, it will be understood that when an element (or region, layer, portion, etc.) is referred to as being "on", "connected to" or "coupled to" another element, it can be directly on, connected or coupled to the other element, or intervening elements may be present. Like reference numerals refer to like elements throughout. As used herein, the term "and/or" includes any and all combinations that the associated configurations can define.

Hereinafter, embodiments of the inventive concept will be described with reference to the accompanying drawings.

Figure 1B:
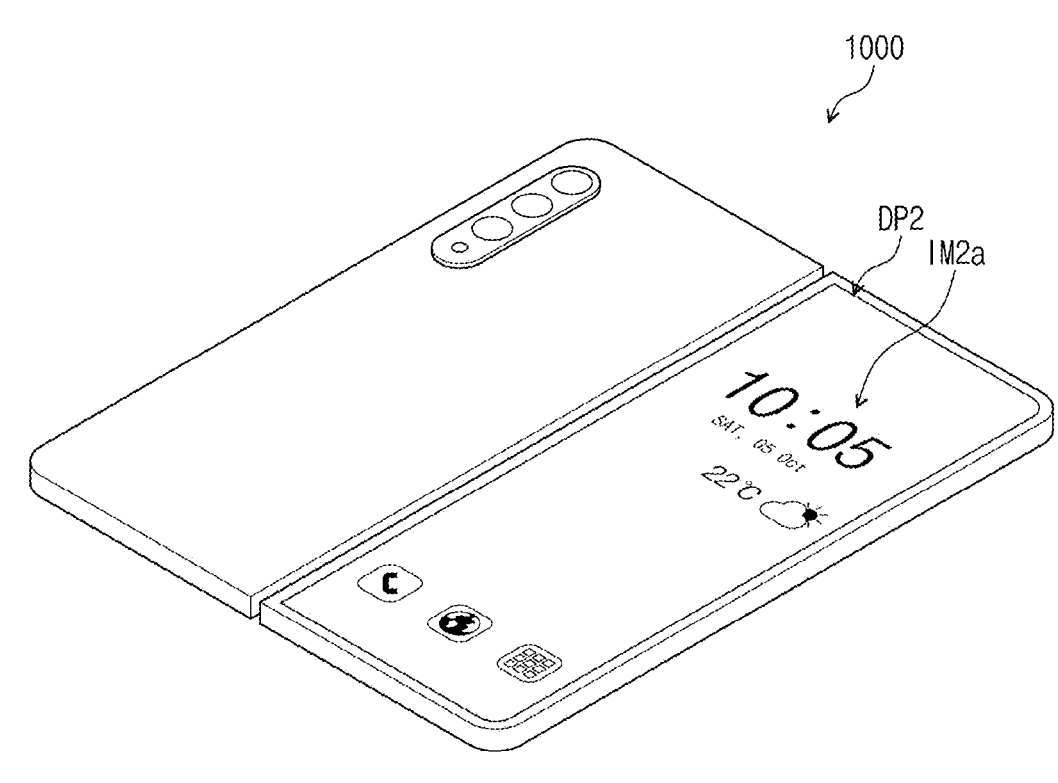
FIG. 1B is a rear perspective view of the electronic device according to an embodiment of the inventive concept.
Figure 2:
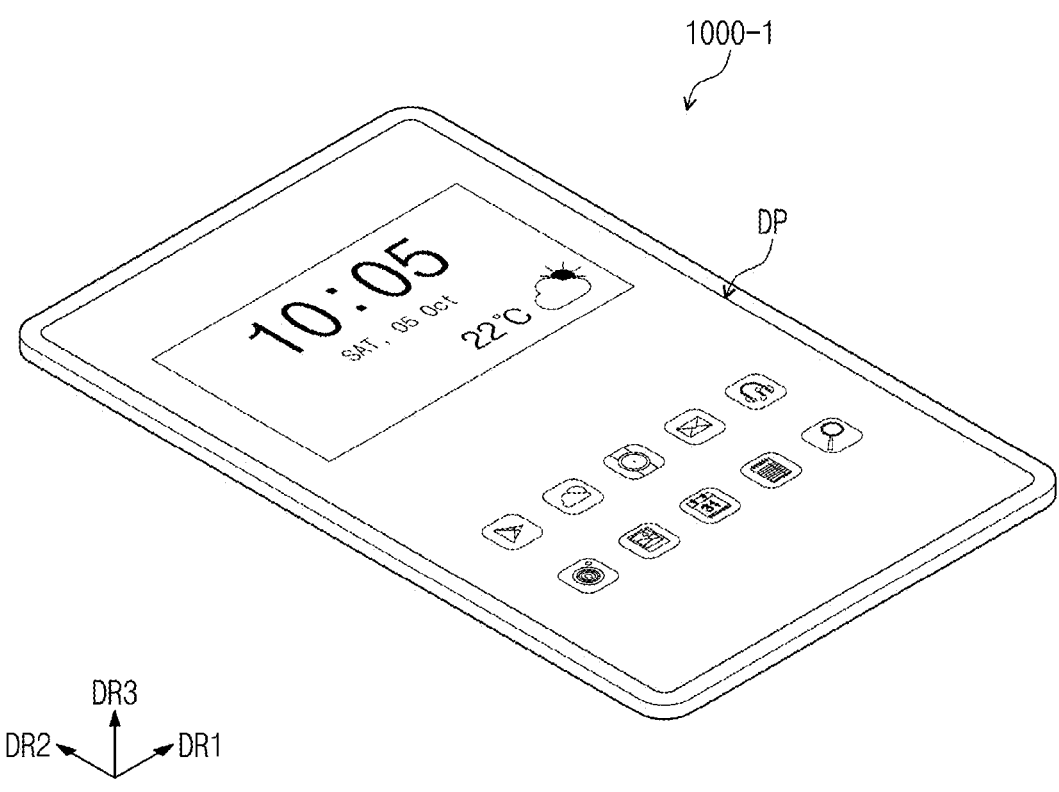
FIG. 2 is a perspective view of an electronic device according to an embodiment of the inventive concept.

FIG. 1A is a perspective view of an electronic device 1000 according to an embodiment of the inventive concept. FIG. 1B is a rear perspective view of the electronic device 1000 according to an embodiment of the inventive concept. FIG. 2 is a perspective view of an electronic device 1000-1 according to an embodiment of the inventive concept.

Referring to FIGS. 1A and 1B, in this embodiment, the electronic device 1000 may be a display device that is activated according to an electrical signal. For example, the electronic device 1000 may display an image and sense an input applied from the outside. An external input may be a user's input. The external input may include various types of inputs, such as an input by a body part of a user or an input by an input means such as a pen.

The electronic device 1000 may include a first display panel DP1 and a second display panel DP2. The first display panel DP1 and the second display panel DP2 may be separate panels. The first display panel DP1 may be referred to as a main display panel, and the second display panel DP2 may be referred to as an auxiliary display panel or an external display panel. Each of the first display panel DP1 and the second display panel DP2 may be coupled to a housing HUS.

The area of the second display panel DP2 may be smaller than the area of the first display panel DP1. When the electronic device 1000 is unfolded, the first display panel DP1 may have a plane substantially parallel to a first direction DR1 and a second direction DR2. The thickness direction of the electronic device 1000 may be parallel to a third direction DR3 crossing the first direction DR1 and the second direction DR2. Accordingly, the front (or upper) and rear (or lower) surfaces of members constituting the electronic device 1000 may be defined based on the third direction DR3.

The first display panel DP1 may include a folding region FA that is folded and unfolded, and a plurality of non-folding regions NFA1 and NFA2 spaced apart from each other with the folding region FA interposed therebetween. The second display panel DP2 may overlap any one of the plurality of non-folding regions NFA1 and NFA2. For example, the second display panel DP2 may overlap a first non-folding region NFA1.

The display direction of a first image IM1a displayed on a portion of the first display panel DP1, for example, the first non-folding region NFA1 and the display direction of a second image IM2a displayed on the second display panel DP2 may be opposite to each other. For example, the first image IM1a may be displayed in the third direction DR3, and the second image IM2a may be displayed in a fourth direction DR4 (see FIG. 1B) which is opposite to the third direction DR3.

In an embodiment of the inventive concept, the folding region FA may be bent based on a folding axis extending in a direction parallel to the long side of the electronic device 1000, for example, in a direction parallel to the second direction DR2. In a state in which the electronic device 1000 is folded, the folding region FA has a predetermined curvature and a predetermined curvature radius. The first non-folding region NFA1 and a second non-folding region NFA2 face each other, and the electronic device 1000 may be inner-folded so that the first display panel DP1 is not exposed to the outside. That is, the first display panel DP1 may be inner-folded.

In an embodiment of the inventive concept, the first display panel DP1 may be outer-folded so as to be exposed to the outside. In an embodiment of the inventive concept, the electronic device 1000 may be capable of being inner-folded or outer-folded in an unfolded state, but embodiments of the inventive concept are not limited thereto.

FIG. 1A exemplarily illustrates that one folding region FA is defined in the electronic device 1000, but the embodiment of the inventive concept is not limited thereto. For example, a plurality of folding axes and a plurality of folding regions corresponding thereto may be defined in the electronic device 1000-1, and the electronic device 1000 may be inner-folded or outer-folded in an unfolded state in each of the plurality of folding regions.

According to an embodiment of the inventive concept, at least one of the first display panel DP1 or the second display panel DP2 may sense an input by a pen PN even though a digitizer is not included. Accordingly, since the digitizer for sensing the pen PN is omitted, it is possible to prevent the thickness and weight of the electronic device 1000 from increasing and the flexibility of the electronic device 1000 from being decreased due to the addition of the digitizer. Accordingly, not only the first display panel DP1 but also the second display panel DP2 may be designed to sense the pen PN.

Referring to FIG. 2, in this embodiment, the electronic device 1000-1 may be a mobile phone or a tablet but is not limited thereto. The electronic device 1000-1 may include a display panel DP.

In an embodiment of the inventive concept, the display panel DP may sense an external input. According to an embodiment of the inventive concept, the display panel DP may sense an input by the pen PN even though a digitizer is not included. Accordingly, since the digitizer for sensing the pen PN is omitted, the thickness and weight of the electronic device 1000-1 or 1000-2 may be prevented from increasing due to the addition of the digitizer.

FIGS. 1A and 1B exemplarily illustrate a foldable-type electronic device 1000, and FIG. 2 exemplarily illustrates a flat-type electronic device 1000-1, but the present invention described below is not limited thereto. For example, the descriptions given below may be applied to various electronic devices, such as a rollable-type electronic device, a slidable-type electronic device, and a stretchable-type electronic device.

Figure 3:
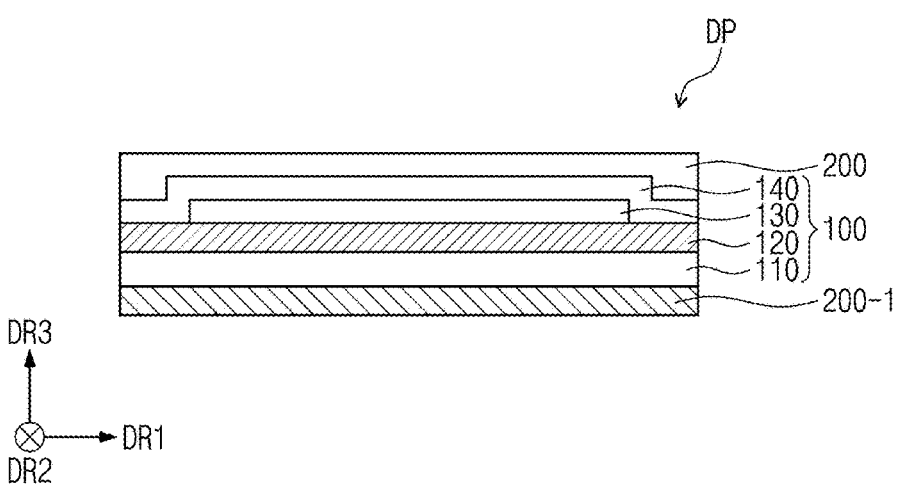
FIG. 3 is a schematic cross-sectional view of a display panel according to an embodiment of the inventive concept.

FIG. 3 is a schematic cross-sectional view of a display panel DP according to an embodiment of the inventive concept. The display panel DP may be the first display panel DP1 or the second display panel DP2 of FIG. 1.

Referring to FIG. 3, in an embodiment, the display panel DP includes a display layer 100, a sensor layer 200 (or input sensor), and a charging electrode layer 200-1. The sensor layer 200 may be disposed on the display layer 100, and the charging electrode layer 200-1 may be disposed below the display layer 100. In an embodiment of the inventive concept, the display layer 100 may be defined as a display panel, and the sensor layer 200 may be defined as an input sensor.

The display layer 100 may be configured to generate an image. The display layer 100 may be a light-emitting display layer. For example, the display layer 100 may include an organic light-emitting display layer, an inorganic light-emitting display layer, an organic-inorganic light-emitting display layer, a quantum dot display layer, a micro LED display layer, or a nano LED display layer. The display layer 100 may include a base layer 110, a driving circuit layer 120, a display element layer 130, and an encapsulation layer 140.

The base layer 110 may be a member that provides a base surface on which the driving circuit layer 120 is disposed. The base layer 110 may have a multi-layered structure or a single-layered structure. The base layer 110 may be a glass substrate, a metal substrate, a silicon substrate, or a polymer substrate, but embodiments of the inventive concept are not limited thereto.

The driving circuit layer 120 may be disposed on the base layer 110. The driving circuit layer 120 may include at least one of an insulating layer, a semiconductor pattern, a conductive pattern and a signal line. An insulating layer, a semiconductor layer, and a conductive layer may be formed on the base layer 110 by coating, deposition, etc., and the insulating layer, the semiconductor layer, and the conductive layer may be selectively patterned through a plurality of photolithography processes. In an embodiment of the inventive concept, the driving circuit layer 120 may be defined as a driving element layer or a driving circuit layer.

The display element layer 130 may be disposed on the driving circuit layer 120. The display element layer 130 may include a light-emitting element. For example, the display element layer 130 may include an organic light-emitting material, an inorganic light-emitting material, an organic-inorganic light-emitting material, quantum dots, quantum rods, micro LEDs, or nano LEDs.

The encapsulation layer 140 may be disposed on the display element layer 130. The encapsulation layer 140 may protect the display element layer 130 from moisture, oxygen, and foreign substances such as dust particles.

The sensor layer 200 may sense an external input. The sensor layer 200 may be an integrated sensor formed continuously during the manufacturing process of the display layer 100, or the sensor layer 200 may be an external sensor attached to the display layer 100. The sensor layer 200 may be referred to as a sensor, an input sensing layer, an input sensing panel or an electronic device for sensing an input coordinate.

In an embodiment of the inventive concept, a portion of the sensor layer 200 may be disposed on the display layer 100, and a portion of the sensor layer 200 may be disposed below the display layer 100. For example, a first conductive layer 202 and a sensing insulating layer 203 illustrated in FIG. 7 may be disposed below the display layer 100, not above the display layer 100. In this case, a second conductive layer 204 and a cover insulating layer 205 may be disposed on a base layer 201. The first conductive layer 202 may be disposed below the base layer 110, and the sensing insulating layer 203 may be disposed below the first conductive layer 202.

According to an embodiment of the inventive concept, the sensor layer 200 may sense not only an input by a body part of a user but also an input by an input means that generates a magnetic field of a predetermined resonance frequency. In an embodiment of the inventive concept, the input means that generates a magnetic field of a predetermined resonance frequency may be a pen, an input pen, a magnetic pen, a stylus pen, or an electromagnetic resonance pen.

According to an embodiment of the inventive concept, the charging electrode layer 200-1 generates an induced magnetic field to charge an input means to generate a magnetic field. The induced magnetic field may be generated when a current flows through the charging electrode layer 200-1.

Figure 4:
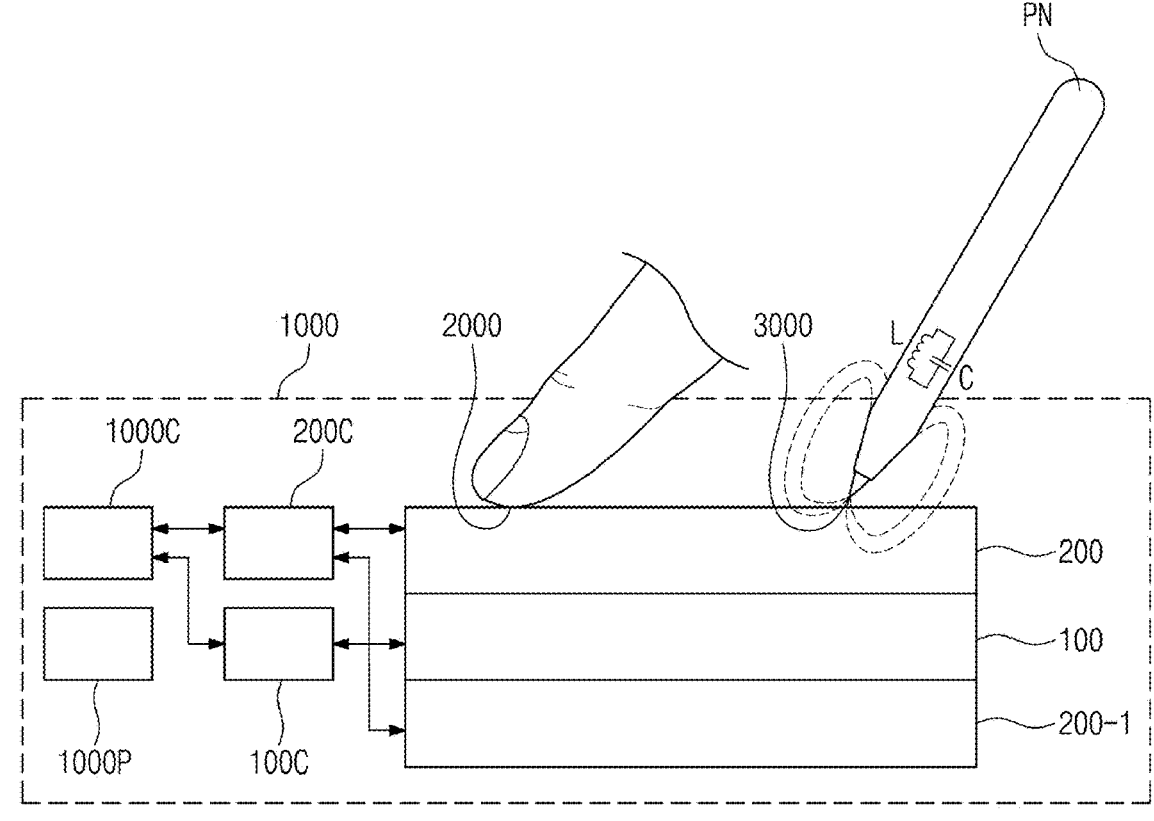
FIG. 4 is a diagram for explaining the operation of an electronic device according to an embodiment of the inventive concept.

FIG. 4 is a diagram for explaining the operation of the electronic device 1000 according to an embodiment of the inventive concept.

Referring to FIG. 4, the electronic device 1000 may include a display layer 100, a sensor layer 200, a charging electrode layer 200-1, a display driver 100C (e.g., a first driver circuit), a sensor driver 200C (e.g., a second driver circuit), a main driver 1000C (e.g., a third driver circuit), and a power circuit 1000P.

The sensor layer 200 may sense a first input 2000 or a second input 3000 applied from the outside. Each of the first input 2000 and the second input 3000 may be an input means capable of providing a change in the capacitance of the sensor layer 200 or an input means capable of causing an induced current in the sensor layer 200. For example, the first input 2000 may be an input means capable of providing electric charge. The second input 3000 may be an input by a pen PN or a radio frequency identification (RFID) tag. For example, the pen PN may be a passive-type pen or an active-type pen.

In an embodiment of the inventive concept, the pen PN may be a device that generates a magnetic field of a predetermined resonance frequency. The pen PN may be configured to transmit an output signal, based on an electromagnetic resonance method. The pen PN may be referred to as an input pen, a magnetic pen, a stylus pen, or an electromagnetic resonance pen.

The pen PN may include an RLC resonance circuit, and the RLC resonance circuit may include an inductor L and a capacitor C. In an embodiment of the inventive concept, the RLC resonance circuit may be a variable resonance circuit that varies a resonance frequency. In this case, the inductor L may be a variable inductor and/or the capacitor C may be a variable capacitor, but embodiments of the inventive concept are not limited thereto.

The inductor L generates a current by a magnetic field formed in the charging electrode layer 200-1. However, embodiments of the inventive concept are not limited thereto. For example, when the pen PN operates as an active type, the pen PN may generate a current even though the pen PN does not receive a magnetic field from the outside. The generated current is transmitted to the capacitor C. The capacitor C is charged with the current input from the inductor L and discharges the charged current to the inductor L. Hereafter, the inductor L may emit a magnetic field of a resonance frequency. An induced current may flow in the sensor layer 200 due to a magnetic field emitted by the pen PN, and the induced current may be transmitted to the sensor driver 200C as a reception signal (or sensing signal). In addition, in an embodiment of the inventive concept, a magnetic field may be generated in the sensor layer 200.

The main driver 1000C may control an overall operation of the electronic device 1000. For example, the main driver 1000C may control the operations of the display driver 100C and the sensor driver 200C. The main driver 1000C may include at least one microprocessor and may further include a graphic controller. The main driver 1000C may be an application processor, a central processing unit, or a main processor.

The display driver 100C may drive the display layer 100. The display driver 100C may receive image data and control signals from the main driver 1000C. The control signals may include various signals. For example, the control signals may include at least one of an input vertical synchronization signal, an input horizontal synchronization signal, a main clock and a data enable signal.

The sensor driver 200C may drive the sensor layer 200 and the charging electrode layer 200-1. The sensor driver 200C may receive a control signal from the main driver 1000C. The control signal may include a clock signal for the sensor driver 200C. In addition, the control signal may further include a mode determination signal that determines the driving mode of the sensor driver 200C and the sensor layer 200.

The sensor driver 200C may be implemented as an integrated circuit IC and electrically connected to the sensor layer 200. For example, the sensor driver 200C may be mounted directly on a predetermined region of the display panel or mounted on a separate printed circuit board by a chip on film (COF) method so as to be electrically connected to the sensor layer 200 and the charging electrode layer 200-1.

The sensor driver 200C may selectively operate the sensor layer 200 in a first mode or in a second mode. For example, the first mode may be a mode for sensing a touch input, for example, the first input 2000. The second mode may be a mode for sensing a pen PN input, for example, the second input 3000. The first mode may be referred to as a touch sensing mode, and the second mode may be referred to as a pen sensing mode. The sensor driver 200C may operate the charging electrode layer 200-1 in the second mode.

Switching between the first mode and the second mode may be carried out in a variety of ways. For example, the sensor driver 200C and the sensor layer 200 may be time-dividedly driven in the first mode and the second mode and may sense the first input 2000 and the second input 3000. The charging electrode layer 200-1 may operate in synchronization with the sensor layer 200. The charging electrode layer 200-1 may stop operating in the first mode and operate for a predetermined period in the second mode.

Alternatively, switching between the first mode and the second mode may occur due to a selection or specific action of a user, or any one of the first mode and the second mode may be activated or deactivated, or switched into the other mode thereof by activation or deactivation of a specific application. Alternatively, while the sensor driver 200C and the sensor layer 200 operate alternately in the first mode and the second mode, the first mode may be maintained when the first input 2000 is sensed, or the second mode may be maintained when the second input 3000 is sensed.

The sensor driver 200C may calculate coordinate information of an input, based on a signal received from the sensor layer 200, and provide the main driver 1000C with a coordinate signal having the coordinate information. The main driver 1000C may execute an operation corresponding to a user input, based on the coordinate signal. For example, the main driver 1000C may operate the display driver 100C so that a new application image is displayed on the display layer 100.

The power circuit 1000P may include a power management integrated circuit (PMIC). The power circuit 1000P may generate a plurality of driving voltages for driving the display layer 100, the sensor layer 200, the charging electrode layer 200-1, the display driver 100C, and the sensor driver 200C. For example, the plurality of driving voltages may include a gate high voltage, a gate low voltage, a first driving voltage (e.g., ELVSS voltage), a second driving voltage (e.g., ELVDD voltage), an initialization voltage, and the like, but embodiments of the inventive concept are not limited to the above examples. The plurality of driving voltages may include a first driving signal SG1 (see FIG. 17B) and a second driving signal SG2 (see FIG. 17B) for driving the charging electrode layer 200-1, and the power circuit 1000P may provide the first driving signal SG1 and the second driving signal SG2 to the sensor driver 200C. In this embodiment, the power circuit 1000P has been described as generating the first driving signal SG1 and the second driving signal SG2, but embodiments of the inventive concept are not limited thereto. The sensor driver 200C may generate the first driving signal SG1 and the second driving signal SG2 by using an alternating current signal received from the power circuit 1000P.

Figure 5:
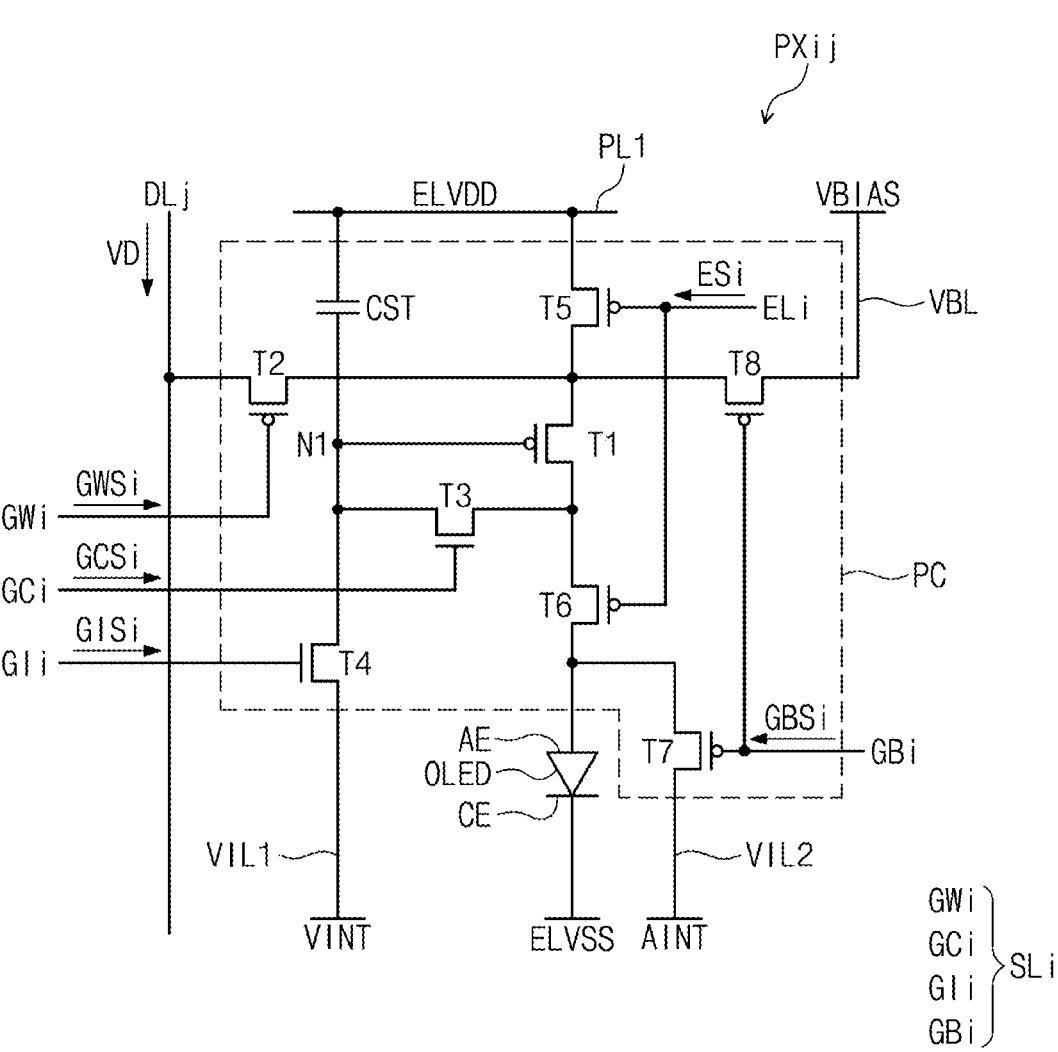
FIG. 5 is an equivalent circuit diagram of a pixel according to an embodiment of the inventive concept.
Figure 6:
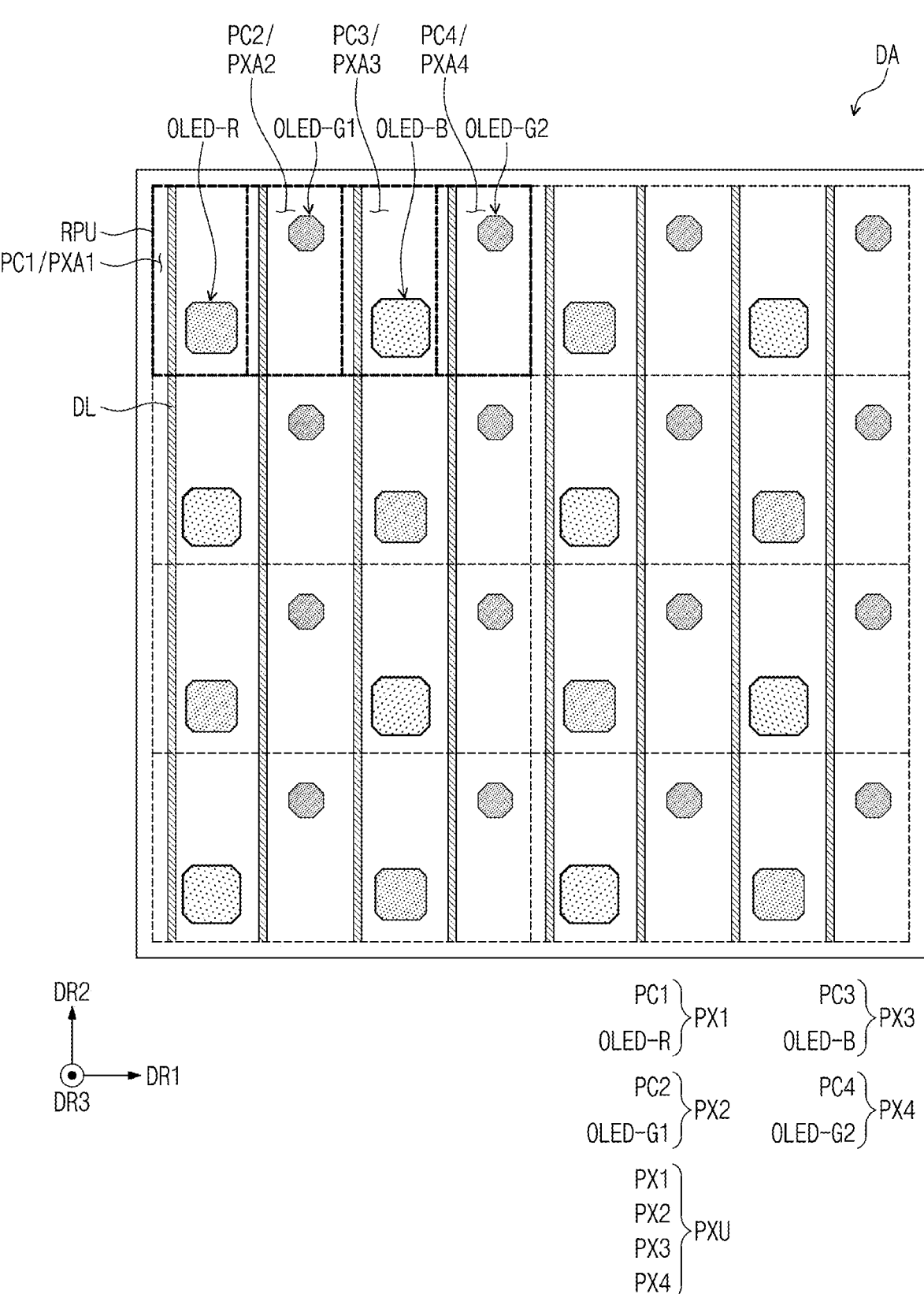
FIG. 6 is a plan view of a display region according to an embodiment of the inventive concept.

FIG. 5 is an equivalent circuit diagram of a pixel PXij according to an embodiment of the inventive concept that may be present in the display panel DP. FIG. 6 is a plan view of a display region DA of the display panel DP that may include the pixel PXij according to an embodiment of the inventive concept.

FIG. 5 exemplarily illustrates the pixel PXij connected to i-th scan lines SLi, an i-th light-emitting line ELi, and an j-th data line DLj, wherein i and j are natural numbers. The i-th scan lines SLi may include an i-th initialization scan line GIi, an i-th compensation scan line GCi, an i-th bias scan line GBi, and an i-th write scan line GWi.

Referring to FIG. 5, the pixel PXij may include a pixel driving circuit PC and a light-emitting element OLED electrically connected to the pixel driving circuit PC. The light-emitting element OLED may be turned on or off by controlling the pixel driving circuit PC.

The pixel driving circuit PC may include a plurality of transistors T1 to T8 and a capacitor CST. The transistors T1 to T8 and the capacitor CST may control the amount of current flowing through the light-emitting element OLED. The light-emitting element OLED may generate light with a predetermined luminance depending on the amount of current provided.

The i-th write scan line GWi may receive an i-th write scan signal GWSi, and the i-th compensation scan line GCi may receive an i-th compensation scan signal GCSi. The i-th initialization scan line GIi may receive an i-th initialization scan signal GISi, and the i-th bias scan line GBi may receive an i-th bias scan signal GBSi. An i-th reset scan line GRi may receive an i-th reset scan signal GRSi. The i-th light-emitting line ELi may receive an i-th light-emitting signal ELSi.

A first initialization line VIL1 may receive a first initialization voltage VINT, and a second initialization line VIL2 may receive a second initialization voltage AINT. A bias line VBL may receive a bias voltage VBIAS. A first power line PL1 may receive a first driving voltage ELVDD, and a second power line PL2 may receive a second driving voltage ELVSS. The light-emitting element OLED may be connected to the second power line PL2. A reset line VRL may receive a reset voltage VRST.

Each of the transistors T1 to T8 may include a source (or source terminal), a drain (or drain terminal), and a gate (or gate terminal). Hereinafter, in FIG. 5, for convenience, any one of the source and the drain is defined as a first electrode, and the other thereof is defined as a second electrode. In addition, the gate is defined as a gate electrode or control electrode.

The transistors T1 to T8 may include first to eighth transistors T1 to T8. The first, second, and fifth to eighth transistors T1, T2, and T5 to T8 may be P-channel metal-oxide semiconductor (PMOS) transistors. The third and fourth transistors T3 and T4 may be N-channel metal-oxide semiconductor (NMOS) transistors.

The first transistor T1 may be referred to as a driving transistor, and the second transistor T2 may be referred to as a switching transistor. The third transistor T3 may be referred to as a compensation transistor. The fourth transistor T4 and the seventh transistor T7 may be referred to as initialization transistors. The fifth transistor T5 and sixth transistor T6 may be referred to as light-emitting control transistors. The eighth transistor T8 may be referred to as a bias transistor.

The light-emitting element OLED may include an organic light-emitting diode. The light-emitting element OLED may include a first electrode, a second electrode, and a light-emitting layer disposed between the first electrode and the second electrode. In this embodiment, for the convenience of explanation, the first electrode is referred to as an anode AE, and the second electrode is referred to as a cathode CE. The anode AE may be electrically connected to the first power line PL1 through the sixth, first, and fifth transistors T6, T1, and T5. The cathode CE may be electrically connected to the second power line PL2.

The first transistor T1 is located in a current path between the first power line PL1 and the light-emitting element OLED. The first transistor T1 may be disposed between and connected to the fifth transistor T5 and the sixth transistor T6. The first transistor T1 may be connected to the first power line PL1 through the fifth transistor T5 and to the anode AE through the sixth transistor T6.

The first transistor T1 may include a first electrode connected to the first power line PL1 through the fifth transistor T5, a second electrode connected to the anode AE through the sixth transistor T6, and a gate electrode connected to a first node N1.

The first electrode of the first transistor T1 may be connected to the fifth transistor T5, and the second electrode of the first transistor T1 may be connected to the sixth transistor T6. The first transistor T1 may control the amount of current flowing through the light-emitting element OLED according to the voltage of the first node N1, which is applied to the gate electrode of the first transistor T1.

The second transistor T2 may be disposed between and connected to the first transistor T1 and the j-th data line DLj. The second transistor T2 may include a first electrode connected to the j-th data line DLj, a second electrode connected to the first electrode of the first transistor T1, and a gate electrode connected to the i-th write scan line GWi.

The second transistor T2 is turned on by the i-th write scan signal GWSi applied through the i-th write scan line GWi so as to be able to electrically connect the j-th data line DLj and the first electrode of the first transistor T1 to each other. The second transistor T2 may perform a switching operation to provide the first electrode of the first transistor T1 with a data voltage VD applied through the j-th data line DLj.

The third transistor T3 may be connected to the second electrode of the first transistor T1 and the first node N1. The third transistor T3 may include a first electrode connected to the second electrode of the first transistor T1, a second electrode connected to the first node N1, and a gate electrode connected to the i-th compensation scan line GCi.

The third transistor T3 is turned on by the i-th compensation scan signal GCSi applied through the i-th compensation scan line GCi so as to be able to electrically connect the second electrode of the first transistor T1 and the gate electrode of the first transistor T1 to each other. When the third transistor T3 is turned on, the first transistor T1 and the third transistor T3 may be connected to each other in the form of a diode.

The fourth transistor T4 may be connected to the first node N1. The fourth transistor T4 may include a first electrode connected to the first node N1, a second electrode connected to the first initialization line VIL1, and a gate electrode connected to the i-th initialization scan line GIi. The fourth transistor T4 is turned on by the i-th initialization scan signal GISi applied through the i-th initialization scan line GIi so as to be able to provide the first node N1 with the first initialization voltage VINT applied through the first initialization line VIL1.

The fifth transistor T5 may include a first electrode connected to the first power line PL1, a second electrode connected to the first electrode of the first transistor T1, and a gate electrode connected to the i-th light-emitting line ELi. The sixth transistor T6 may include a first electrode connected to the second electrode of the first transistor T1, a second electrode connected to the anode AE, and a gate electrode connected to the i-th light-emitting line ELi.

The fifth transistor T5 and the sixth transistor T6 may be turned on by the i-th light-emitting signal ESi applied through the i-th light-emitting line ELi. The first driving voltage ELVDD is provided to the light-emitting element OLED by the turned-on fifth transistor T5 and the turned-on sixth transistor T6, so that a driving current may flow through the light-emitting element OLED. Accordingly, the light-emitting element OLED may emit light.

The seventh transistor T7 may include a first electrode connected to the anode AE, a second electrode connected to the second initialization line VIL2, and a gate electrode connected to the i-th bias scan line GBi. The seventh transistor T7 is turned on by the i-th bias scan signal GBSi applied through the i-th bias scan line GBi so as to be able to provide the anode AE of the light-emitting element OLED with the second initialization voltage AINT received through the second initialization line VIL2.

In an embodiment of the inventive concept, the seventh transistor T7 may be omitted. In an embodiment of the inventive concept, the second initialization voltage AINT may have a level different from that of the first initialization voltage VINT, but the embodiment of the inventive concept is not limited thereto and the second initialization voltage AINT may have the same level as the first initialization voltage VINT.

The seventh transistor T7 may increase the black expression ability of the pixel PXij. When the seventh transistor T7 is turned on, the parasitic capacitor of the light-emitting element OLED may be discharged. Accordingly, when black luminance is implemented, the light-emitting element OLED may not emit light due to leakage current from the first transistor T1, and thus the black expression ability may be increased.

The capacitor CST may include a first electrode connected to the first power line PL1 and a second electrode connected to the first node N1. When the fifth transistor T5 and the sixth transistor T6 are turned on, the amount of current flowing in the first transistor T1 may be determined according to a voltage stored in the capacitor CST.

The eighth transistor T8 may include a first electrode connected to the bias line VBL, a second electrode connected to the first electrode of the first transistor T1, and a gate electrode connected to the i-th bias scan line GBi. In another embodiment of the inventive concept, the eighth transistor T8 may be omitted.

The eighth transistor T8 is turned on by the i-th bias scan signal GBSi so as to be able to provide the first electrode of the first transistor T1 with the bias voltage VBIAS. As the bias voltage VBIAS is applied to the first transistor T1, the movement of the hysteresis curve of the first transistor T1 may be suppressed.

The display region DA of FIG. 6 may be a region in which the first image IM1a of the first display panel DP1 of FIG. 1A is displayed. The first display panel DP1 of FIG. 1A may further include a non-display region in which the first image IM1a is not displayed on a plane. The non-display region may be disposed outside and surround the display region DA.

FIG. 6 illustrates unit regions RPU repeatedly arranged in the display region DA. At least one pixel PX1, PX2, PX3, or PX4 is disposed to correspond to each of the unit regions RPU. In this embodiment, the unit regions RPU including first to fourth pixels PX1, PX2, PX3, and PX4 are illustrated as an example. The unit regions RPU may be disposed throughout the display region DA, but embodiments of the inventive concept are not limited thereto. In some regions of the display region DA, other types of the unit regions different from the unit regions RPU described above may be disposed.

The first pixel PX1 may include a first light-emitting element OLED-R and a first driving circuit PC1 electrically connected thereto, the second pixel PX2 may include a (2-1)-th light-emitting element OLED-G1 and a second driving circuit PC2 electrically connected thereto, the third pixel PX3 may include a third light-emitting element OLED-B and a third driving circuit PC3 electrically connected thereto, and the fourth pixel PX4 may include a (2-2)-th light-emitting element OLED-G2 and a fourth driving circuit PC4 electrically connected thereto.

In an embodiment of the inventive concept, the unit regions RPU may be divided based on the arrangement of the first to fourth driving circuits PC1, PC2, PC3, and PC4. Within a unit region RPU, the first to fourth driving circuits PC1, PC2, PC3, and PC4 may occupy a same area. The unit region RPU may include first to fourth pixel regions PXA1, PXA2, PXA3, and PXA4 corresponding to the first to fourth driving circuits PC1, PC2, PC3, and PC4. The first, (2-1)-th, third, and (2-2)-th light-emitting elements OLED-R, OLED-G1, OLED-B, and OLED-G2 may be disposed to overlap the first to fourth pixel regions PXA1, PXA2, PXA3, and PXA4, respectively. However, as long as each of the first, (2-1)-th, third, and (2-2)-th light-emitting elements OLED-R, OLED-G1, OLED-B, and OLED-G2 is connected to a corresponding driving circuit among the first to fourth driving circuits PC1, PC2, PC3, and PC4, embodiments of the inventive concept are not limited to being disposed in a corresponding pixel region among the first to fourth pixel regions PXA1, PXA2, PXA3, and PXA4.

The pixel regions PXA1, PXA2, PXA3, and PXA4 in the display region DA may be regularly arranged and define an n×m matrix (wherein n and m are natural numbers greater than or equal to 2). For example, the pixel regions may be arranged in n rows and m columns. FIG. 6 exemplarily illustrates the pixel regions PXA1, PXA2, PXA3, and PXA4 defining four pixel rows and eight pixel columns arranged in a portion of the display region DA.

Data lines DL may be arranged in each pixel column. In this embodiment, the data lines DL extending in the second direction DR2 are illustrated as an example. One data line DL corresponding to one pixel column may be connected to the driving circuits PC1, PC2, PC3, and PC4 arranged in a corresponding pixel column.

The first light-emitting element OLED-R generates a first color light such as red light, the (2-1)-th light-emitting element OLED-G1 and the (2-2)-th light-emitting element OLED-G2 generate a second color light such as green light, and the third light-emitting element OLED-B generates a third color light such as blue light. The light-emitting area of the third light-emitting element OLED-B may be the largest, and the light-emitting areas of the (2-1)-th light-emitting element OLED-G1 and the (2-2)-th light-emitting element OLED-G2 may be the smallest.

In this embodiment, the first light-emitting element OLED-R and the third light-emitting element OLED-B may be disposed on a same line or in a same row, and the first light-emitting element OLED-R and the third light-emitting element OLED-B may be spaced apart from each other in the first direction DR1. The (2-1)-th light-emitting element OLED-G1 and the (2-2)-th light-emitting element OLED-G2 may be arranged on a same line or in a same row, but they may be arranged on a line different from that of the first light-emitting element OLED-R and the third light-emitting element OLED-B.

Figure 7:
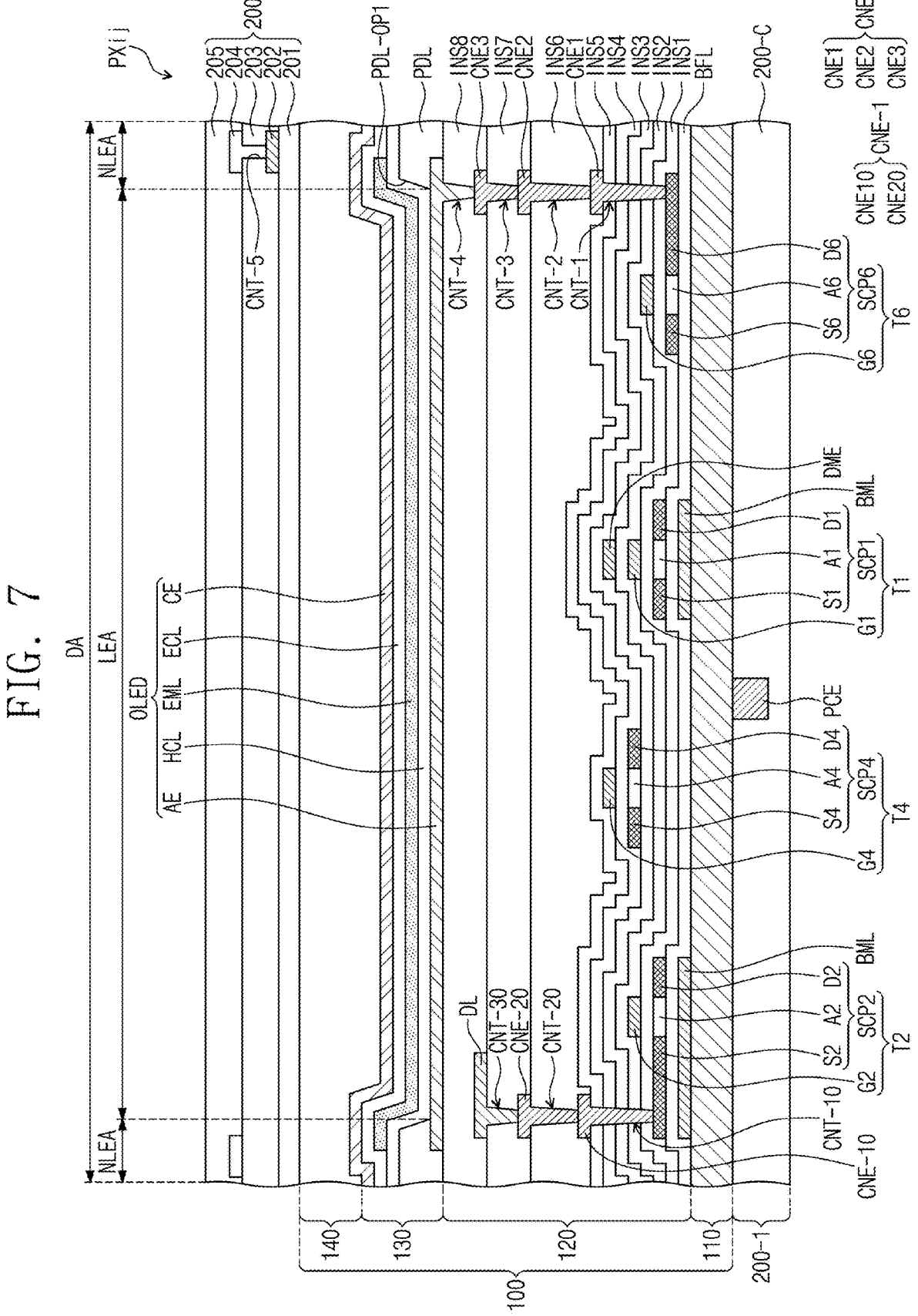
FIG. 7 is a cross-sectional view of the display panel according to an embodiment of the inventive concept.

FIG. 7 is a cross-sectional view of the display panel DP according to an embodiment of the inventive concept.

Figure 1B:
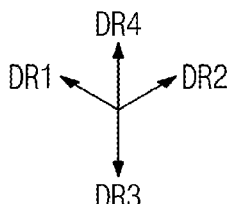

The display panel DP may be the first display panel DP1 or the second display panel DP2 of FIG. 1. FIG. 7 exemplarily illustrates a cross section of the light-emitting element OLED, the first transistor T1, the second transistor T2, the fourth transistor T4, and the sixth transistor T6 of the pixel PXij illustrated in FIG. 5.

Referring to FIG. 7, a shielding electrode BML may be disposed on a base layer 110. The shielding electrode BML may overlap the first transistor T1. The shielding electrode BML may include a metal and receive a constant voltage. When the constant voltage is applied to the shielding electrode BML, a threshold voltage Vth value of the first transistor T1 disposed on the shielding electrode BML may be maintained without changing. The shielding electrode BML may receive a ground voltage, or the shielding electrode BML may be a floating electrode that does not receive a predetermined voltage.

A buffer layer BFL may be disposed on the base layer 110, and the buffer layer BFL may include an inorganic layer. The buffer layer BFL may cover the shielding electrode BML. A metal layer formed on the base layer 110, such as the shielding electrode BML, may be defined as a shielding layer.

A first semiconductor layer is disposed on the buffer layer BFL. The first semiconductor layer may include a semiconductor layer SCP1 (hereinafter described as a first semiconductor pattern region) of the first transistor T1, a semiconductor layer SCP2 (hereinafter described as a second semiconductor pattern region) of the second transistor T2, and a semiconductor layer SCP6 (hereinafter described as a sixth semiconductor pattern region) of the sixth transistor T6. Hereinafter, the first, second, and sixth semiconductor pattern regions SCP1, SCP2, and SCP6 may include polysilicon, but are not limited thereto. For example, the first, second, and sixth semiconductor pattern regions SCP1, SCP2, and SCP6 may include amorphous silicon.

The first, second, and sixth semiconductor pattern regions SCP1, SCP2, and SCP6 may be formed through a same process, and a partial region of each of the first, second, and sixth semiconductor pattern regions SCP1, SCP2, and SCP6 may be doped with an N-type dopant or a P-type dopant. The first, second, and sixth semiconductor pattern regions SCP1, SCP2, and SCP6 may include a heavily doped region and a lightly doped region. The conductivity of the heavily doped region is greater than that of the lightly doped region. The heavily doped regions may substantially correspond to the sources and drains of the first, second, and sixth transistors T1, T2, and T6. The lightly doped region may substantially correspond to the actives (or channels) of the first, second, and sixth transistors T1, T2, and T6.

The heavily doped region of the first semiconductor pattern region SCP1 may include a first source region S1 and a first drain region D1. The lightly doped region of the first semiconductor pattern region SCP1 is defined as a first channel region A1 and disposed between the first source region S1 and the first drain region D1. Like the first semiconductor pattern region SCP1, the second semiconductor pattern region SCP2 may include a second source region S2, a second channel region A2, and a second drain region D2. Like the first semiconductor pattern region SCP1, the sixth semiconductor pattern region SCP6 may include a sixth source region S6, a sixth channel region A6, and a sixth drain region D6.

On the cross section of FIG. 7, the first semiconductor pattern region SCP1, the second semiconductor pattern region SCP2, and the sixth semiconductor pattern region SCP6 are spaced apart from each other, but on a plane, the first semiconductor pattern region SCP1, the second semiconductor pattern region SCP2, and the sixth semiconductor pattern region SCP6 may have an integral shape. In other words, the first semiconductor pattern region SCP1, the second semiconductor pattern region SCP2, and the sixth semiconductor pattern region SCP6 may be different portions or regions of a single semiconductor pattern.

A first insulating layer INS1 covering the first, second, and sixth semiconductor pattern regions SCP1, SCP2, and SCP6 may be disposed on the buffer layer BFL. The gate electrodes of the first, second, and sixth transistors T1, T2, and T6 are disposed on the first insulating layer INS1. The gate electrodes of the first, second, and sixth transistors T1, T2, and T6 may be formed through a same process. Hereinafter, the gate electrode of the first transistor T1 is defined as a first gate electrode G1, the gate electrode of the second transistor T2 is defined as a second gate electrode G2, and the gate electrode of the sixth transistor T6 is defined as a sixth gate electrode G6. A metal layer formed on the first insulating layer INS1, such as the first gate electrode G1, may be defined as a first gate layer. The first gate layer may further include a plurality of patterns in addition to the first gate electrode G1, the second gate electrode G2, and the sixth gate electrode G6.

A second insulating layer INS2 may be disposed on the first insulating layer INS1 so as to cover the first, second, and sixth gate electrodes G1, G2, and G6. A dummy electrode DME may be disposed on the second insulating layer INS2. The dummy electrode DME may be disposed on the first gate electrode G1 and overlap the first gate electrode G1 when viewed on a plane. Together with the first gate electrode G1, the dummy electrode DME may form the capacitor CST of FIG. 5. In other words, the first gate electrode G1 corresponds to one electrode of the capacitor CST, and the dummy electrode DME corresponds to the other electrode of the capacitor CST. A metal layer formed on the second insulating layer INS2, such as the dummy electrode DME, may be defined as a second gate layer. The second gate layer may further include a plurality of patterns in addition to the dummy electrode DME.

A third insulating layer INS3 may be disposed on the second insulating layer INS2 so as to cover the dummy electrode DME. A second semiconductor layer is disposed on the third insulating layer INS3. A semiconductor layer SCP4 (hereinafter described as a fourth semiconductor pattern region) of the fourth transistor T4 may be disposed in the second semiconductor layer. The fourth semiconductor pattern region SCP4 may include an oxide semiconductor including a metal oxide. The oxide semiconductor may include a crystalline or amorphous oxide semiconductor.

The fourth semiconductor pattern region SCP4 may include a plurality of regions divided depending on whether the metal oxide has been reduced. A region (hereinafter referred to as a reduced region) in which the metal oxide is reduced has higher conductivity than a region (hereinafter referred to as a non-reduced region) in which the metal oxide is not reduced. The reduced regions may substantially correspond to the source and drain of the fourth transistor T4. The non-reduced region may substantially correspond to the active (or channel) of the fourth transistor T4.

The reduced regions of the fourth semiconductor pattern region SCP4 may include a fourth source region S4 and a fourth drain region D4. A fourth channel region A4 may be disposed between the fourth source region S4 and the fourth drain region D4.

A fourth insulating layer INS4 may be disposed on the third insulating layer INS3 so as to cover the fourth semiconductor pattern region SCP4. A gate electrode G4 (hereinafter referred to as a fourth gate electrode) of the fourth transistor T4 may be disposed on the fourth insulating layer INS4. A metal layer formed on the fourth insulating layer INS4, such as the fourth gate electrode G4, may be defined as a third gate layer. The third gate layer may further include a plurality of patterns in addition to the fourth gate electrode G4.

A fifth insulating layer INS5 may be disposed on the fourth insulating layer INS4 so as to cover the fourth gate electrode G4. The buffer layer BFL and the first to fifth insulating layers INS1 to INS5 may include inorganic layers.

A first connection electrode CNE may be disposed between the sixth transistor T6 and the light-emitting element OLED. The first connection electrode CNE may electrically connect the sixth transistor T6 and the light-emitting element OLED to each other. The first connection electrode CNE may include a (1-1)-th connection electrode CNE1, a (1-2)-th connection electrode CNE2 disposed on the (1-1)-th connection electrode CNE1, and a (1-3)-th connection electrode CNE3 disposed on the (1-2)-th connection electrode CNE2.

The (1-1)-th connection electrode CNE1 may be disposed on the fifth insulating layer INS5 and connected to the drain region D6 through a first contact hole CNT-1 defined in the first to fifth insulating layers INS1 to INS5. A metal layer formed on the fifth insulating layer INS5, such as the (1-1)-th connection electrode CNE1, may be defined as a first source/drain layer. The first source/drain layer may further include a plurality of patterns in addition to the (1-1)-th connection electrode CNE1.

A sixth insulating layer INS6 may be disposed on the fifth insulating layer INS5 so as to cover the (1-1)-th connection electrode CNE1. The (1-2)-th connection electrode CNE2 may be disposed on the sixth insulating layer INS6. The (1-2)-th connection electrode CNE2 may be connected to the (1-1)-th connection electrode CNE1 through a second contact hole CNT-2 defined in the sixth insulating layer INS6. A metal layer formed on the sixth insulating layer INS6, such as the (1-2)-th connection electrode CNE2, may be referred to as a second source/drain layer. The second source/drain layer may further include a plurality of patterns in addition to the (1-2)-th connection electrode CNE2.

A seventh insulating layer INS7 may be disposed on the sixth insulating layer INS6 so as to cover the (1-2)-th connection electrode CNE2. The (1-3)-th connection electrode CNE3 may be disposed on the seventh insulating layer INS7. The (1-3)-th connection electrode CNE3 may be connected to the (1-2)-th connection electrode CNE2 through a third contact hole CNT-3 defined in the seventh insulating layer INS7. A metal layer formed on the seventh insulating layer INS7, such as the (1-3)-th connection electrode CNE3, may be referred to as a third source/drain layer. The third source/drain layer may further include a plurality of patterns in addition to the (1-3)-th connection electrode CNE3.

A second connection electrode CNE-1 may be disposed between the second transistor T2 and the data line DL so as to electrically connect them to each other. The second connection electrode CNE-1 may include a (2-1)-th connection electrode CNE10 and a (2-2)-th connection electrode CNE20 disposed on the (2-1)-th connection electrode CNE10.

The (2-1)-th connection electrode CNE10 may be connected to the second source region S2 through a first contact hole CNT-10 defined in the first to fifth insulating layers INS1 to INS5. The (2-2)-th connection electrode CNE20 may be connected to the (2-1)-th connection electrode CNE10 through a second contact hole CNT-20 defined in the sixth insulating layer INS6. The data line DL may be connected to the (2-2)-th connection electrode CNE20 through a third contact hole CNT-30 defined in the seventh insulating layer INS7.

An eighth insulating layer INS8 may be disposed on the seventh insulating layer INS7 so as to cover the (1-3)-th connection electrode CNE3 and the data line DL. The light-emitting element OLED is disposed on the eighth insulating layer INS8. The sixth to eighth insulating layers INS6 to INS8 may include an inorganic layer or an organic layer. In this embodiment, each of the sixth to eighth insulating layers INS6 to INS8 includes an organic layer.

The light-emitting element OLED may include a first electrode AE, a second electrode CE, a hole control layer HCL, an electron control layer ECL, and a light-emitting layer EML. The first electrode AE may be the anode AE illustrated in FIG. 5, and the second electrode CE may be the cathode CE illustrated in FIG. 5.

The second electrode CE may be disposed on the first electrode AE, the hole control layer HCL and the electron control layer ECL may be disposed between the first electrode AE and the second electrode CE, and the light-emitting layer EML may be disposed between the hole control layer HCL and the electron control layer ECL. The first electrode AE may be disposed on the eighth insulating layer INS8. The first electrode AE may be electrically connected to the (1-3)-th connection electrode CNE3 through a fourth contact hole CNT-4 defined in the eighth insulating layer INS8.

A pixel defining film PDL exposing a predetermined portion of the first electrode AE may be disposed on the first electrode AE and the eighth insulating layer INS8. An opening PDL-OP1 may be defined in the pixel defining film PDL to expose a predetermined portion of the first electrode AE. The opening PDL-OP1 corresponds to a light-emitting region LEA. The display region DA may include a light-emitting region LEA corresponding to the opening PDL-OP1 and a non-light-emitting region NLEA adjacent to the light-emitting region LEA.

The hole control layer HCL may be disposed on the first electrode AE and the pixel defining film PDL. The hole control layer HCL may be commonly disposed in the light-emitting region LEA and the non-light-emitting region NLEA. The hole control layer HCL may include a hole transport layer and a hole injection layer.

The light-emitting layer EML may be disposed on the hole control layer HCL. The light-emitting layer EML may be disposed in a region corresponding to the opening PDL-OP1. The light-emitting layer EML may include an organic material and/or an inorganic material. The light-emitting layer EML may generate any one of red, green, and blue light.

The electron control layer ECL may be disposed on the light-emitting layer EML and the hole control layer HCL. The electron control layer ECL may be commonly disposed in the light-emitting region LEA and the non-light-emitting region NLEA. The electron control layer ECL may include an electron transport layer and an electron injection layer.

The second electrode CE may be disposed on the electron control layer ECL. The second electrode CE may be commonly disposed in the unit pixel PXU illustrated in FIG. 6. That is, the second electrode CE may be commonly disposed on the light-emitting layers EML of the unit pixel PXU. The second electrodes CE of the first, (2-1)-th, third, and (2-2)-th light-emitting elements OLED-R, OLED-G1, OLED-B, OLED-G2 may have an integral shape.

The layers from the buffer layer BFL to the eighth insulating layer INS8 may be defined as a circuit driving circuit layer 120. The layer in which the light-emitting element OLED is disposed may be referred to as a display element layer 130.

The thin film encapsulation layer 140 may be disposed on the light-emitting element OLED. The thin film encapsulation layer 140 may include an inorganic layer, an organic layer, and an inorganic layer which are sequentially stacked. The inorganic layers may contain an inorganic material to protect the pixels from moisture/oxygen. The organic layer may contain an organic material to protect the light-emitting element OLED from foreign substances such as dust particles.

The sensor layer 200 is disposed on the display layer 100. The sensor layer 200 may include a base layer 201, a first conductive layer 202, a sensing insulating layer 203, a second conductive layer 204, and a cover insulating layer 205. The base layer 201 may be referred to as a first insulating layer of the sensor layer 200, the sensing insulating layer 203 may be referred to as a second insulating layer of the sensor layer 200, and the cover insulating layer 205 may be referred to as a third insulating layer of the sensor layer 200.

The base layer 201 may be an inorganic layer containing at least any one of silicon nitride, silicon oxynitride, or silicon oxide. Alternatively, the base layer 201 may be an organic layer containing an epoxy resin, an acrylic resin, or an imide-based resin. The base layer 201 may have a single-layered structure or a multi-layered structure stacked along the third direction DR3.

Each of the first conductive layer 202 and the second conductive layer 204 may have a single-layered structure or a multi-layered structure stacked along the third direction DR3. The second conductive layer 204 may be connected to the first conductive layer 202 through a fifth contact hole CNT-5 passing through the sensing insulating layer 203.

Each of the first conductive layer 202 and the second conductive layer 204 which have a single-layered structure may include a metal layer or a transparent conductive layer. The metal layer may include molybdenum, silver, titanium, copper, aluminum, or an alloy thereof. The transparent conductive layer may include a transparent conductive oxide such as indium tin oxide (ITO), indium zinc oxide (IZO), zinc oxide (ZnO), or indium zinc tin oxide (IZTO). In addition, the transparent conductive layer may include a conductive polymer such as poly(3,4-ethylenedioxythiophene) (PEDOT), metal nanowire, and graphene.

Each of the first conductive layer 202 and the second conductive layer 204 which have a multi-layered structure may include metal layers. The metal layers may have, for example, a three-layer structure of titanium/aluminum/titanium. The multi-layered conductive layer may include at least one metal layer and at least one transparent conductive layer.

At least any one of the sensing insulating layer 203 and the cover insulating layer 205 may include an inorganic film. The inorganic film may include at least one of aluminum oxide, titanium oxide, silicon oxide, silicon nitride, silicon oxynitride, zirconium oxide, or hafnium oxide.

At least any one of the sensing insulating layer 203 and the cover insulating layer 205 may include an organic film. The organic film may include at least any one of an acrylic-based resin, a methacrylic-based resin, polyisoprene, a vinyl-based resin, an epoxy-based resin, a urethane-based resin, a cellulose-based resin, a siloxane-based resin, a polyimide-based resin, a polyamide-based resin, and a perylene-based resin.

In this embodiment, the sensor layer 200 including three insulating layers 201, 203, and 205 and two conductive layers 202 and 204 is described as an example, but embodiments of the inventive concept are not limited thereto. The sensor layer 200 may include four insulating layers and three conductive layers, or five insulating layers and four conductive layers.

A charging electrode layer 200-1 is disposed below the driving circuit layer 120. In this embodiment, the charging electrode layer 200-1 may be disposed on the lower surface of the base layer 110. The charging electrode layer 200-1 may include a charging electrode PCE disposed on the lower surface of the base layer 110 and a protective layer 200-C covering the charging electrode PCE.

The charging electrode PCE may have a multi-layered structure or a single-layered structure including a metal having low resistance. The metal may include molybdenum, silver, titanium, copper, aluminum, or an alloy thereof. The protective layer 200-C may include an inorganic layer or an organic layer and have a single-layered or multi-layered structure.

Figure 8:
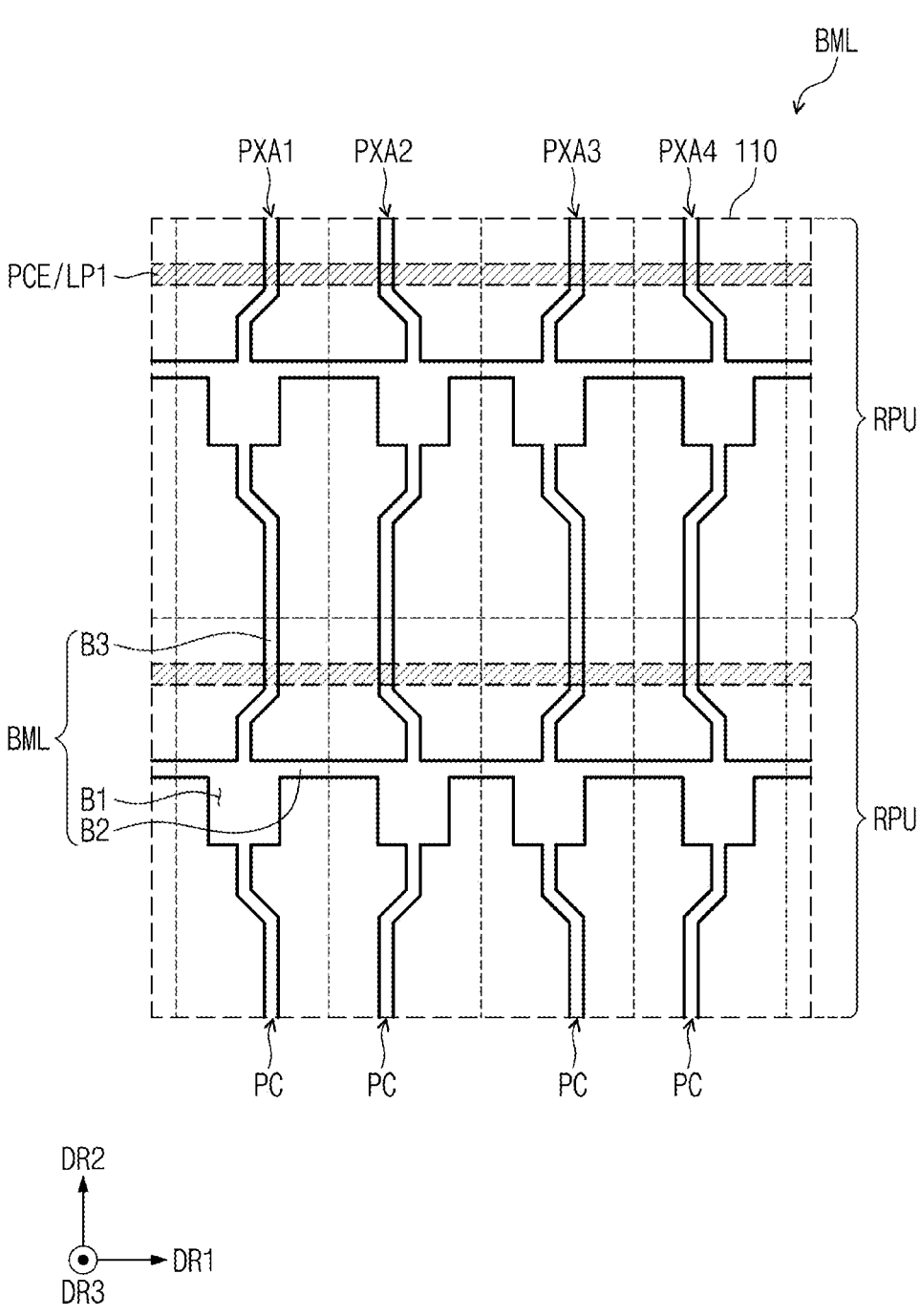
FIG. 8 is a plan view of a shielding layer according to an embodiment of the inventive concept.
Figure 9:
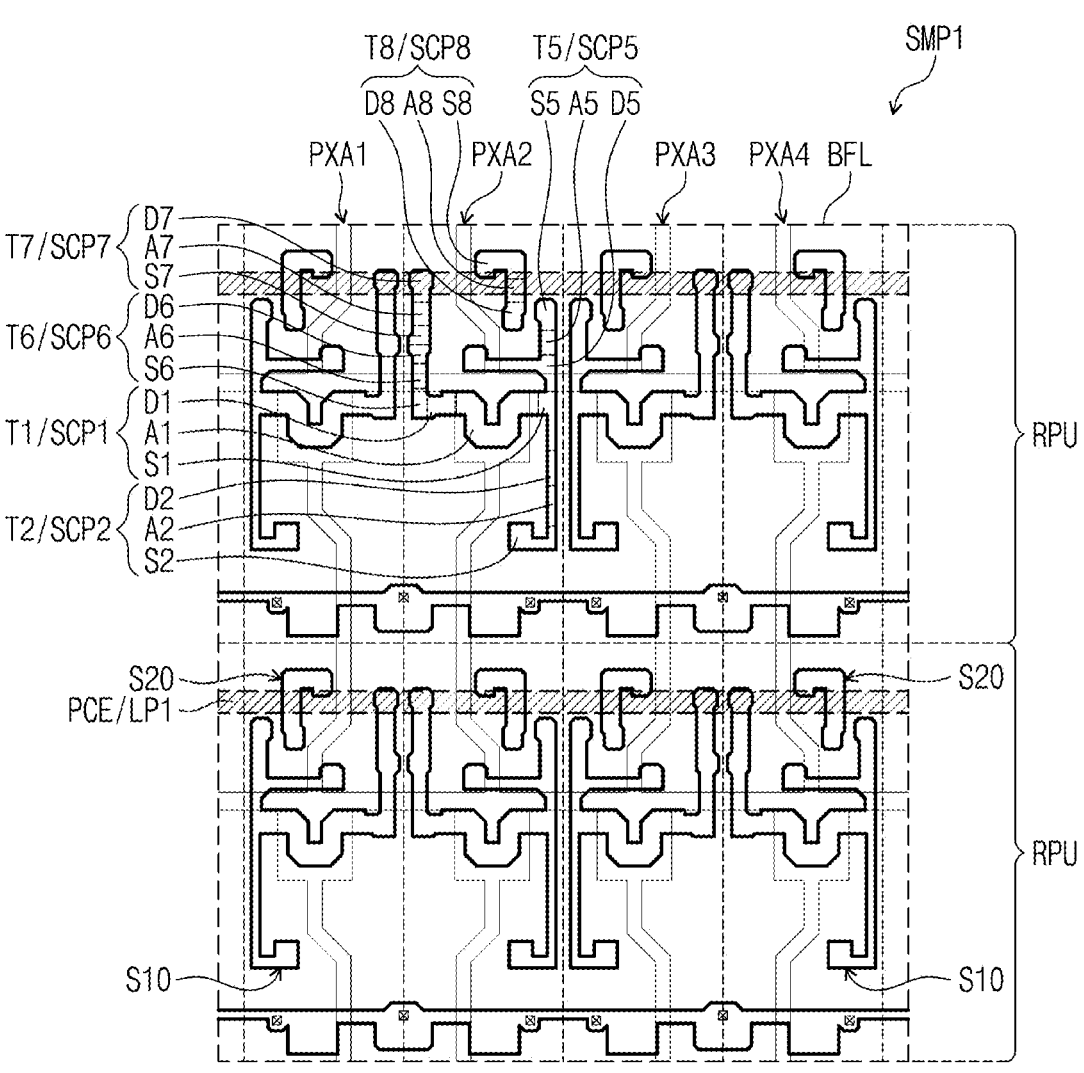
FIG. 9 is a plan view of a first semiconductor layer according to an embodiment of the inventive concept.
Figure 9:
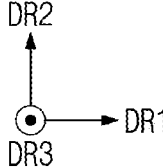
Figure 10:
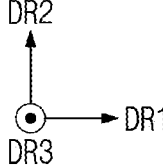
FIG. 10 is a plan view of a third source/drain layer according to an embodiment of the inventive concept.

FIG. 8 is a plan view of a shielding layer BML of FIG. 7 according to an embodiment of the inventive concept. FIG. 9 is a plan view of a first semiconductor layer SMP1 according to an embodiment of the inventive concept. FIG. 10 is a plan view of a third source/drain layer CNP3 according to an embodiment of the inventive concept.

FIGS. 8 to 10 exemplarily illustrate the two unit regions RPU described with reference to FIG. 6. The shielding layer BML may include a first region B1 disposed in each of the first to fourth pixel regions PXA1, PXA2, PXA3, and PXA4, a second region B2 connecting the first regions B1 of the first to fourth pixel regions PXA1, PXA2, PXA3, and PXA4 to each other in the first direction DR1, and a third region B3 connecting the first regions B1 of the first to fourth pixel regions PXA1, PXA2, PXA3, and PXA4 to each other in the second direction DR2.

FIGS. 8 to 10 illustrate a charging electrode PCE disposed below the base layer 110 of FIG. 7. In an embodiment, the charging electrode PCE includes a plurality of first line portions LP1 extending in the first direction DR1. The first line portions LP1 may be disposed to be spaced apart from each other in the second direction DR2. The first line portions LP1 are arranged in each pixel row, and FIG. 8 illustrates one first line portion LP1 disposed in each unit region RPU. In an embodiment, the first line portions LP1 do not overlap the first region B1 on a plane, and the location of the first line portions LP1 disposed in the second direction DR2 may be changed.

Referring to FIG. 9, the first semiconductor layer SMP1 corresponding to the first to fourth pixel regions PXA1, PXA2, PXA3, and PXA4 may be disposed on the buffer layer BFL. The first semiconductor layer SMP1 includes a first pattern S10 disposed in each of the first to fourth pixel regions PXA1, PXA2, PXA3, and PXA4 and a second pattern S20 spaced apart from the first pattern S10. The first patterns S10 arranged in two adjacent pixel regions among the first to fourth pixel regions PXA1, PXA2, PXA3, and PXA4 may be symmetrical to each other with respect to the left and light sides thereof, and the second patterns S20 may be symmetrical to each other with respect to the left and light sides thereof. For example, the first pattern S10 in the first pixel region PXA1 may have the same shape as the first pattern S10 in the second pixel region PXA2, but these shapes may appear inverted with respect to one another. For example, the second pattern S20 in the first pixel region PXA1 may have the same shape as the second pattern S20 in the second pixel region PXA2, but these shapes may appear inverted with respect to one another.

Portions of the first pattern S10 and the second pattern S20 may form the first, second, fifth, sixth, seventh, and eighth source regions S1, S2, S5, S6, S7, and S8, the first, second, fifth, sixth, seventh, and eighth drain regions D1, D2, D5, D6, D7, and D8, and the first, second, fifth, sixth, seventh, and eighth channel regions A1, A2, A5, A6, A7, and A8 of the first, second, fifth, sixth, seventh, and eighth transistors T1, T2, T5, T6, T7, and T8 which have been described with reference to FIG. 5. Since the state illustrated in FIG. 9 is a state before doping, the channel regions A1, A2, A5, A6, A7, and A8 are not substantially distinguished from the source regions S1, S2, S5, S6, S7, and S8 and the drain regions D1, D2, D5, D6, D7, and D8.

The first pattern S10 includes the semiconductor pattern regions SCP1, SCP2, SCP5, SCP6, and SCP7 of the first, second, fifth, sixth, and seventh transistors T1, T2, T5, T6, and T7. The second pattern S20 includes the semiconductor pattern regions SCP8 of the eighth transistor T8. Each of the channel regions A1, A2, A5, A6, A7, and A8 is disposed between a corresponding source region among the source regions S1, S2, S5, S6, S7 and S8 and a corresponding drain region among the drain regions D1, D2, D5, D6, D7, and D8.

Referring to FIG. 10, a data line DL is disposed in each of the first to fourth pixel regions PXA1, PXA2, PXA3, and PXA4. The data line DL may be electrically connected to the second source region S2 through the second connection electrode CNE-1 illustrated in FIG. 7. The data lines DL may be spaced apart from one another in the first direction DR1 and extend in the second direction DR2.

Figure 11:
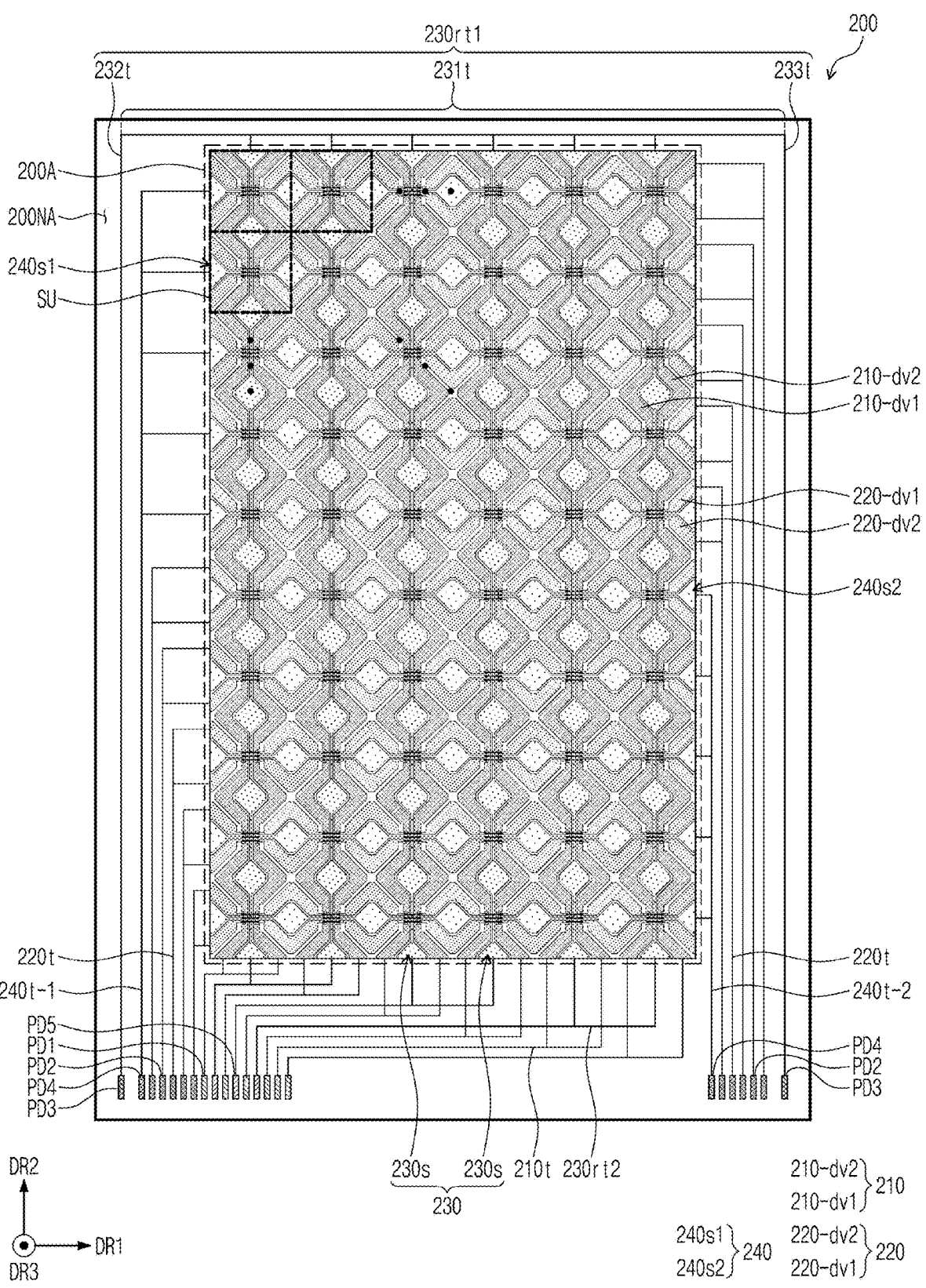
FIG. 11 is a plan view of a sensor layer according to an embodiment of the inventive concept.
Figure 12:
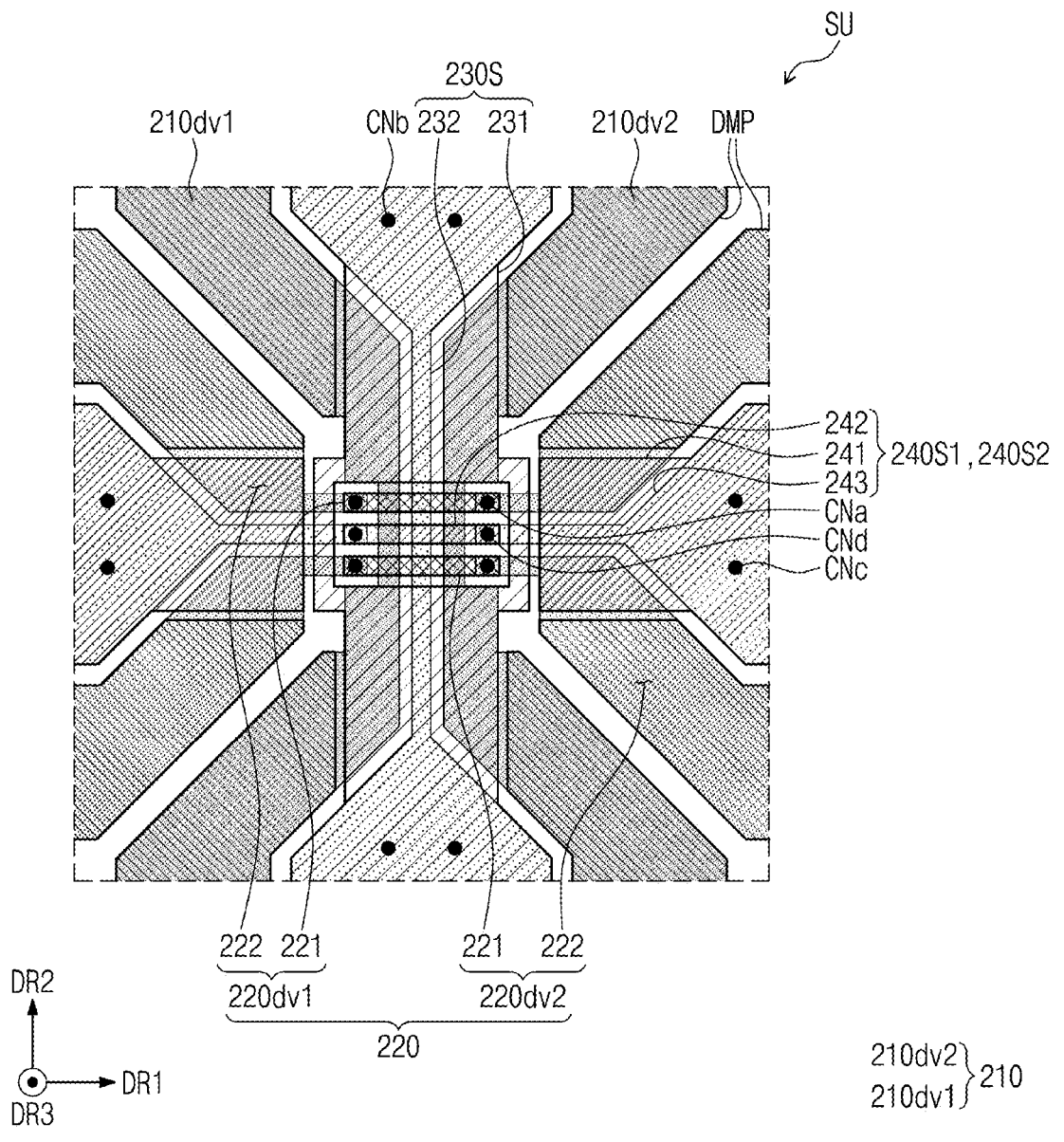
FIG. 12 is an enlarged plan view of one sensing unit according to an embodiment of the inventive concept.
Figure 13A:
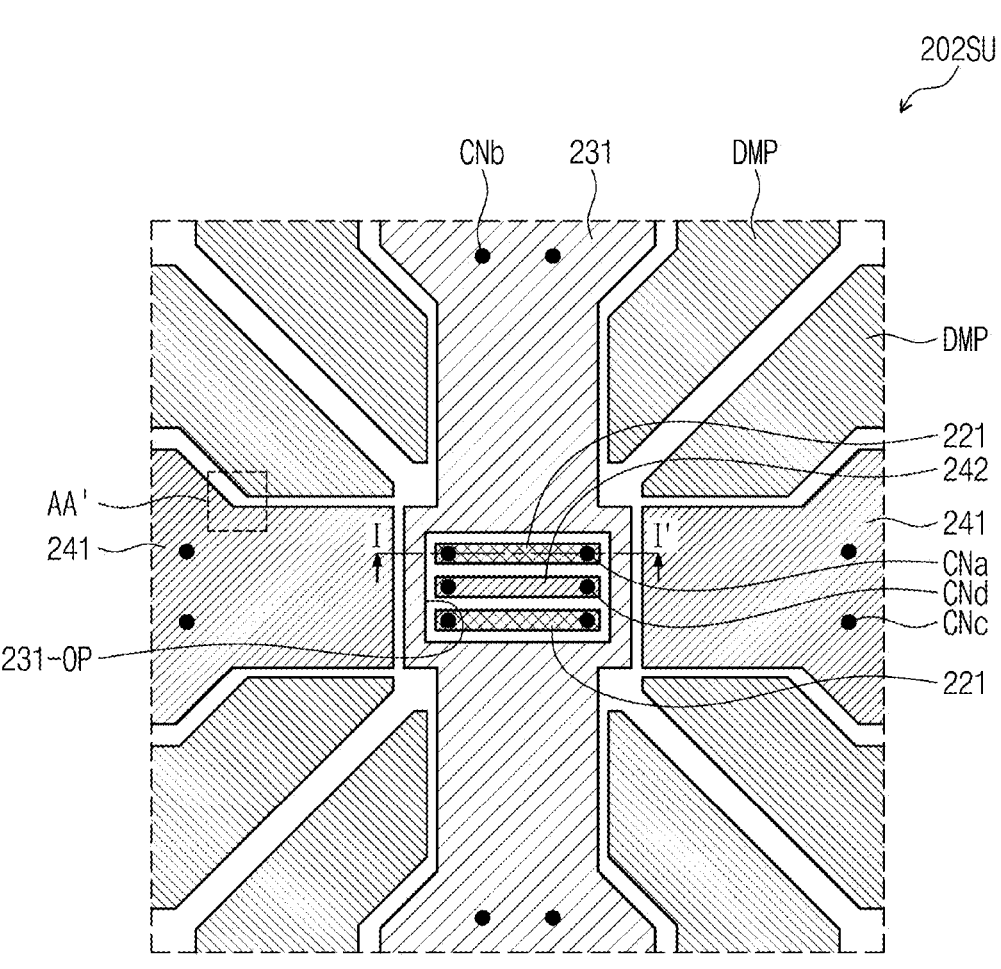
FIG. 13A is a plan view illustrating a first conductive layer of the sensing unit according to an embodiment of the inventive concept.
Figure 13A:
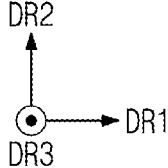
Figure 13B:
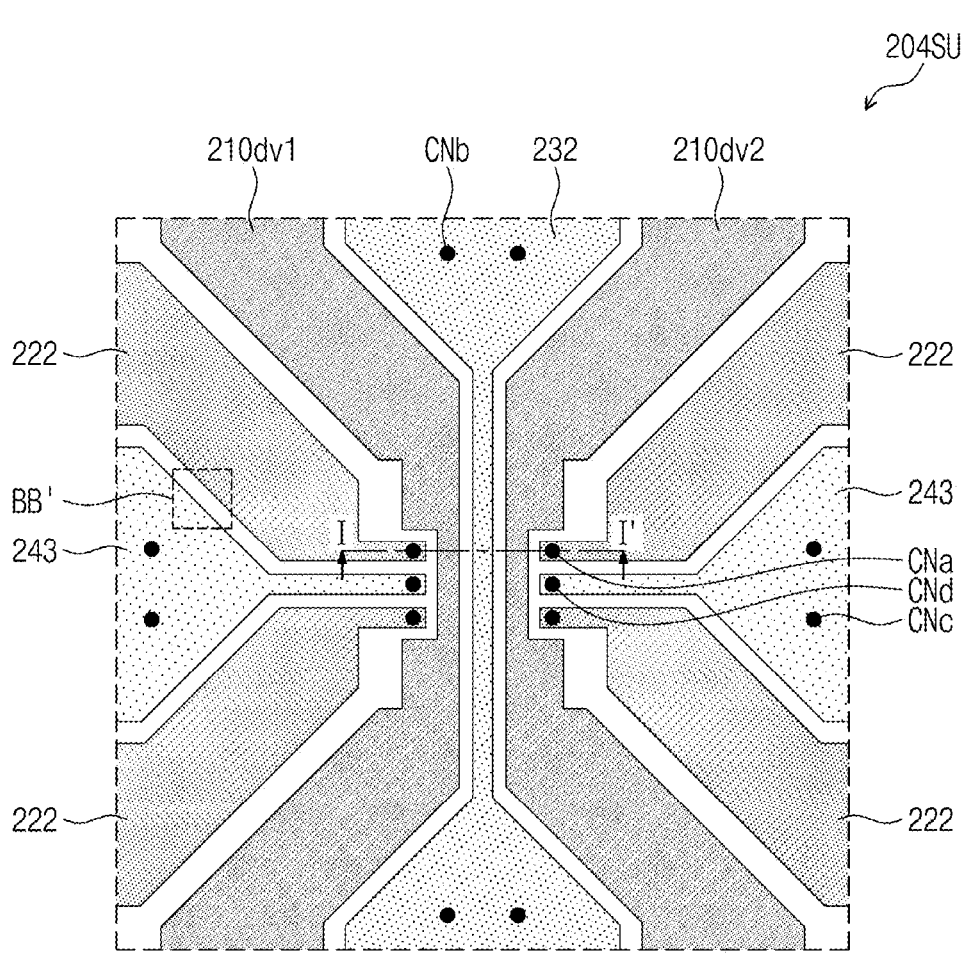
FIG. 13B is a plan view illustrating a second conductive layer of the sensing unit according to an embodiment of the inventive concept.
Figure 13B:
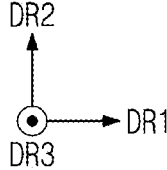
Figure 14:
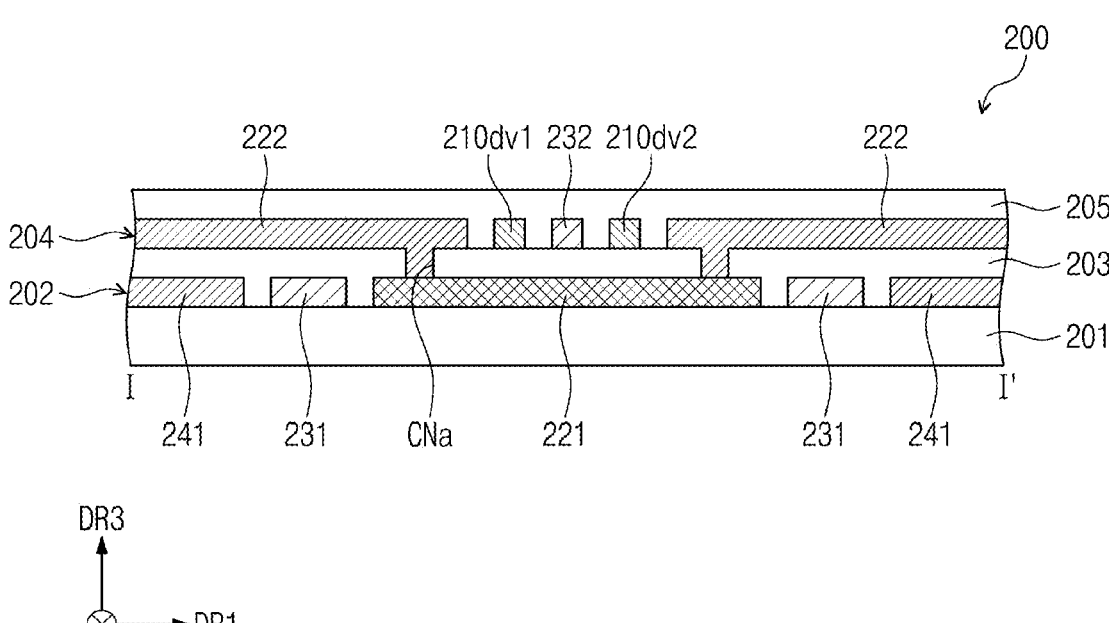
FIG. 14 is a cross-sectional view of the sensor layer according to an embodiment of the inventive concept, which is taken along line I-I' illustrated in each of FIGS. 13A and 13B.

FIG. 11 is a plan view of a sensor layer 200 according to an embodiment of the inventive concept. FIG. 12 is an enlarged plan view of one sensing unit SU of the sensor layer 200 according to an embodiment of the inventive concept. FIG. 13A is a plan view illustrating a first conductive layer 202SU of the sensing unit SU according to an embodiment of the inventive concept. FIG. 13B is a plan view illustrating a second conductive layer 204SU of the sensing unit SU according to an embodiment of the inventive concept. FIG. 14 is a cross-sectional view of the sensor layer 200 according to an embodiment of the inventive concept, which is taken along line I-I' illustrated in each of FIGS. 13A and 13B.

Referring to FIG. 11, a sensing region 200A and a peripheral region 200NA adjacent to the sensing region 200A may be defined in the sensor layer 200. A display region corresponding to the sensing region 200A and a non-display region corresponding to the peripheral region 200NA may be defined in the display layer 100 of FIG. 3 and FIG. 7.

The sensor layer 200 may include a plurality of first electrodes 210, a plurality of second electrodes 220, a plurality of third electrodes 230, and a plurality of fourth electrodes 240 which are disposed in the sensing region 200A. Each of the first electrodes 210 may cross the second electrodes 220. Each of the third electrodes 230 may cross the fourth electrodes 240.

Each of the first electrodes 210 may extend along the second direction DR2, and the first electrodes 210 may be arranged to be spaced apart from each other in the first direction DR1. Each of the second electrodes 220 may extend along the first direction DR1, and the second electrodes 220 may be arranged to be spaced apart from each other in the second direction DR2. The sensing unit SU of the sensor layer 200 may be a region in which one first electrode 210 and one second electrode 220 cross each other.

FIG. 11 exemplarily illustrates 6 first electrodes 210 and 10 second electrodes 220, and therefore 60 sensing units SU may be defined therein, but the number of the first electrodes 210 and the number of the second electrodes 220 are not limited thereto.

Referring to FIGS. 11 and 12, each of the first electrodes 210 may include first split electrodes 210$dv$1 and 210$dv$2. The first split electrodes 210$dv$1 and 210$dv$2 may extend along the second direction DR2 and be spaced apart from each other in the first direction DR1. The first split electrodes 210$dv$1 and 210$dv$2 may have a shape symmetrical to a line extending in the second direction DR2. For example, a shape of split electrode 210$dv$1 may be the same as a shape of split electrode 210$dv$2, but inverted.

Each of the second electrodes 220 may include second split electrodes 220$dv$1 and 220$dv$2. The second electrodes 220 may extend along the first direction DR1 and be spaced apart from each other in the second direction DR2. The second split electrodes 220$dv$1 and 220$dv$2 may have a shape symmetrical to a line extending in the first direction DR1. For example, a shape of split electrode 220$dv$1 may be the same as a shape of split electrode 220$dv$2, but inverted.

Referring to FIGS. 12, 13A, 13B, and 14, each of the second split electrodes 220$dv$1 and 220$dv$2 may include a bridge pattern 221 and two sensing patterns 222 disposed in the sensing unit SU. In an embodiment, the bridge pattern 221 is disposed on a layer different from that of the sensing patterns 222, and the bridge pattern 221 and the sensing patterns 222 may be electrically connected to each other through a first contact hole CNa. Contact holes described below, including the first contact hole CNa, may pass through the sensing insulating layer 203 like the fifth contact hole CNT-5 in FIG. 7. For example, the bridge pattern 221 may be included in the first conductive layer 202SU, and the sensing pattern 222 and the first split electrodes 210$dv$1 and 210$dv$2 may be included in the second conductive layer 204SU. The first conductive layer 202SU may be included in the first conductive layer 202 of FIG. 7, and the second conductive layer 204SU may be included in the second conductive layer 204 of FIG. 7. Conductive patterns and/or electrodes may be formed from the conductive layers through a photolithography process.

Referring to FIG. 11, each of the third electrodes 230 may extend along the second direction DR2, and the third electrodes 230 may be arranged to be spaced apart from each other in the first direction DR1. In an embodiment of the inventive concept, each of the third electrodes 230 include a plurality of first auxiliary electrodes 230$s$ connected in parallel with each other. The number of the first auxiliary electrodes 230$s$ included in each of the third electrodes 230 may be variously changed. For example, as the number of the first auxiliary electrodes 230$s$ included in each of the third electrodes 230 increases, the resistance of each of the third electrodes 230 decreases, and therefore, power efficiency and sensing sensitivity may be increased. Conversely, as the number of the first auxiliary electrodes 230$s$ included in each of the third electrodes 230 decreases, a loop coil pattern which is formed by using the third electrodes 230 may be implemented in more diverse forms.

Although FIG. 11 exemplarily illustrates that one third electrode 230 includes two first auxiliary electrodes 230$s$, embodiments of the inventive concept are not limited thereto. In an embodiment of the inventive concept, each of the third electrodes 230 include one first auxiliary electrode 230$s$. Referring to FIG. 11, the first auxiliary electrodes 230$s$ may be disposed in a one-to-one correspondence with the first electrodes 210. Accordingly, a portion of one first auxiliary electrode 230*s* may be disposed in one sensing unit SU illustrated in FIGS. 11 and 12. In an embodiment of the inventive concept, one third electrode 230 includes three first auxiliary electrodes 230*s*.

Referring to FIGS. 11 to 14, a coupling capacitor may be defined between one first electrode 210 and one first auxiliary electrode 230*s*. In this case, an induced current generated during pen sensing may be transmitted from the first auxiliary electrode 230*s* to the first electrode 210 through the coupling capacitor. That is, the first auxiliary electrode 230*s* may serve to supplement a signal transmitted from the first electrode 210 to the sensor driver 200C. Therefore, the greatest effect may be obtained when the phase of a signal induced in the first auxiliary electrode 230*s* matches the phase of a signal induced in the first electrode 210. Accordingly, the center of each of the first electrodes 210 in the first direction DR1 and the center of each of the first auxiliary electrodes 230*s* in the first direction DR1 may overlap each other.

In an embodiment of the inventive concept, since one third electrode 230 includes two first auxiliary electrodes 230*s*, one third electrode 230 may correspond to (or overlap) two first electrodes 210. Accordingly, the number of the third electrodes 230 included in the sensor layer 200 may be less than the number of the first electrodes 210. For example, the number of the first electrodes 210 may be equal to a value obtained by multiplying the number of the third electrodes 230 included in the sensor layer 200 by the number of the first auxiliary electrodes 230*s* included in each of the third electrodes 230. In FIG. 11, the number of the first electrodes 210 may be 6, the number of the third electrodes 230 may be 3, and the number of the first auxiliary electrodes 230*s* included in each of the third electrodes 230 may be 2.

The fourth electrodes 240 may be arranged along the second direction DR2, and the fourth electrodes 240 may extend along the first direction DR1. In an embodiment of the inventive concept, the fourth electrodes 240 are divided into two groups. The fourth electrodes 240 belonging to a same group are connected to a same trace line. The fourth electrodes 240 divided into two groups may be referred to as second auxiliary electrodes 240*s*1 or 240*s*2. In this embodiment, the second auxiliary electrodes 240*s*1 and 240*s*2 may be referred to as (2-1)-th auxiliary electrodes 240*s*1 and (2-2)-th auxiliary electrodes 240*s*2. In this embodiment, the (2-1)-th auxiliary electrodes 240*s*1 and the (2-2)-th auxiliary electrodes 240*s*2 are connected to different trace lines 240*t*-1 and 240*t*-2. The (2-1)-th auxiliary electrodes 240*s*1 are connected to the same trace line 240*t*-1, and the (2-2)-th auxiliary electrodes 240*s*2 are connected to the same trace line 240*t*-2.

In an embodiment of the inventive concept, the fourth electrodes 240 are divided into two or more groups. When the fourth electrodes 240 are connected to different trace lines, the fourth electrodes 240 may be divided into different groups. The fourth electrodes 240 divided into different groups may receive a synchronized signal or a same signal through different fourth trace lines. In an embodiment of the inventive concept, the fourth electrodes 240 may be one group. The fourth electrodes 240 may be connected to one fourth trace line. In an embodiment of the inventive concept, the fourth electrodes 240 may be divided into three groups. Two of the three groups may be disposed on the left side of the sensing region 200A, and one group thereof may be disposed on the right side of the sensing region 200A. In an embodiment of the inventive concept, the fourth electrodes 240 include four groups. Two of the four groups may be disposed on the left side of the sensing region 200A, and the other two of the four groups may be disposed on the right side of the sensing region 200A. In the second direction DR2, the two groups disposed on the left side may be disposed further away from or closer to second pads PD2 or third pads PD3 than the two groups disposed on the right side. In the second direction DR2, the two groups disposed on the left side and the two groups disposed on the right side may be disposed in a zigzag shape from the second pads PD2 or the third pads PD3.

In an embodiment, the routing directions of the (2-1)-th auxiliary electrodes 240*s*1 and the (2-2)-th auxiliary electrodes 240*s*2 is different from each other. For example, when the routing directions are different from each, connection positions between electrodes and trace lines may be different from each other. For example, a first connection position of the fourth trace line 240*t*-1 electrically connected to the (2-1)-th auxiliary electrodes 240*s*1 and a second connection position of the fourth trace line 240*t*-2 electrically connected to the (2-2)-th auxiliary electrodes 240*s*2 may be different from each other. The first connection position may be at the left end of the (2-1)-th auxiliary electrodes 240*s*1, and the second connection position may be at the right end of the (2-2)-th auxiliary electrodes 240*s*2.

FIG. 11 exemplarily illustrates that five (2-1)-th auxiliary electrodes 240*s*1 are electrically connected to each other and that five (2-2)-th auxiliary electrodes 240*s*2 are electrically connected to each other. In an embodiment of the inventive concept, the number of the (2-1)-th auxiliary electrodes 240*s*1 and the number of the (2-2)-th auxiliary electrodes 240*s*2 may be different from each other.

In an embodiment of the inventive concept, as the number of the (2-1)-th auxiliary electrodes 240*s*1 increases and the number of the (2-2)-th auxiliary electrodes 240*s*2 increases, an effect may occur in which the area of an electrode electrically defined as one increases. In addition, the resistance of an electrode electrically defined as one may be lowered, thereby increasing the sensing sensitivity to the second input 3000 (see FIG. 4).

Referring to FIGS. 11 to 14, a coupling capacitor may be defined between one second electrode 220 and one second auxiliary electrode 240*s*1 or 240*s*2. In this case, an induced current generated during pen sensing may be transmitted from the second auxiliary electrode 240*s*1 or 240*s*2 to the second electrode 220 through the coupling capacitor. That is, the second auxiliary electrode 240*s*1 or 240*s*2 may serve to supplement a signal transmitted from the second electrode 220 to the sensor driver 200C. Therefore, the greatest effect may be obtained when the phase of a signal induced in the second auxiliary electrode 240*s*1 or 240*s*2 matches the phase of a signal induced in the second electrode 220. Accordingly, the center of each of the second electrodes 220 in the second direction DR2 and the center of each of the second auxiliary electrodes 240*s*1 or 240*s*2 in the second direction DR2 may overlap each other.

Referring to FIGS. 12, 13A, and 13B, each of the first auxiliary electrodes 230*s* may include a (3-1)-th pattern 231 and a (3-2)-th pattern 232. The terms '(3-1)-th pattern 231' and '(3-2)-th pattern 232' are used for the purpose of distinguishing them from other patterns. When the (3-1)-th pattern 231 is defined as a first pattern, the (3-2)-th pattern 232 may be defined as a second pattern.

In an embodiment, the (3-1)-th pattern 231 and the (3-2)-th pattern 232 are disposed on different layers and electrically connected to each other through a second contact hole CNb. The (3-1)-th pattern 231 may be included in the first conductive layer 202SU, and the (3-2)-th pattern 232 may be included in the second conductive layer 204SU.

In an embodiment of the inventive concept, any one of the (3-1)-th pattern 231 and the (3-2)-th pattern 232 may be omitted. In an embodiment of the inventive concept, although the (3-1)-th pattern 231 and the (3-2)-th pattern 232 are disposed, they may not be electrically connected to each other. In this case, one of the (3-1)-th pattern 231 and the (3-2)-th pattern 232 may correspond to the first auxiliary electrodes 230s, and the other thereof may correspond to a dummy electrode (or floating electrode).

In an embodiment of the inventive concept, a portion of the (3-1)-th pattern 231 overlaps a portion of each of the first split electrodes 210dv1 and 210dv2. Accordingly, a coupling capacitance may be provided (or formed) between the first electrode 210 and the third electrode 230. As shown in FIG. 13A, an opening 231-OP may be defined in the (3-1)-th pattern 231. The bridge pattern 221 described above and a (4-2)-th pattern 242 which will be described later may be disposed in the opening 231-OP.

Referring to FIGS. 12, 13A, and 13B, each of the second auxiliary electrodes 240s1 and 240s2 may include two (4-1)-th patterns 241, a (4-2)-th pattern 242, and two (4-3)-th patterns 243, which are disposed in the sensing unit SU. The terms '(4-1)-th pattern 241, (4-2)-th pattern 242, and (4-3)-th pattern 243' are used for the purpose of distinguishing them from other patterns. When the (4-1)-th pattern 241 is defined as a first pattern, the (4-2)-th pattern 242 may be defined as a second pattern, and the (4-3)-th pattern 243 may be defined as a third pattern.

In an embodiment, the (4-1)-th pattern 241 and the (4-2)-th pattern 242 are disposed on a same layer, and the (4-3)-th pattern 243 is disposed on a layer different from those of the (4-1)-th pattern 241 and the (4-2)-th pattern 242. The (4-1)-th pattern 241 and the (4-3)-th pattern 243 may be electrically connected to each other through a third contact hole CNc, and the (4-2)-th pattern 242 and the (4-3)-th pattern 243 may be electrically connected to each other through a fourth contact hole CNd. The (4-1)-th pattern 241 and the (4-2)-th pattern 242 may be included in the first conductive layer 202SU, and the (4-3)-th pattern 243 may be included in the second conductive layer 204SU.

Referring to FIGS. 12, 13A, and 13B, a portion of the (4-1)-th pattern 241 may overlap the sensing pattern 222 of each of the second split electrodes 220dv1 and 220dv2. Accordingly, a coupling capacitor may be defined (or provided, formed) between the second electrode 220 and the fourth electrode 240.

In an embodiment of the inventive concept, the first conductive layer 202SU further includes dummy patterns DMP. Each of the dummy patterns DMP may be electrically floated or electrically grounded. Some of the dummy patterns DMP may overlap the first split electrodes 210dv1 and 210dv2, and others thereof may overlap the sensing patterns 222. In an embodiment of the inventive concept, the dummy patterns DMP may be omitted. In an embodiment of the inventive concept, the dummy patterns DMP may be electrically connected to overlapping electrodes among the first split electrodes 210dv1 and 210dv2, thus further increasing sensing sensitivity.

Referring to FIG. 11, the sensor layer 200 may further include a plurality of first trace lines 210t disposed in the peripheral region 200NA, a plurality of first pads PD1 connected to the first trace lines 210t in a one-to-one correspondence, a plurality of second trace lines 220t, and a plurality of second pads PD2 connected to the second trace lines 220t in a one-to-one correspondence.

The first trace lines 210t may be electrically connected to the first electrodes 210 in a one-to-one correspondence. Two first split electrodes 210dv1 and 210dv2 included in one first electrode 210 may be connected to one of the first trace lines 210t. Each of the first trace lines 210t may include a plurality of branches for being connected to the two first split electrodes 210dv1 and 210dv2. In an embodiment of the inventive concept, the two first split electrodes 210dv1 and 210dv2 are connected to each other in the sensing region 200A.

The second trace lines 220t may be electrically connected to the second electrodes 220 in a one-to-one correspondence. Two second split electrodes 220dv1 and 220dv2 included in one second electrode 220 may be connected to one of the second trace lines 220t. Each of the second trace lines 220t may include a plurality of branches for being connected to the two second split electrodes 220dv1 and 220dv2. In an embodiment of the inventive concept, the two second split electrodes 220dv1 and 220dv2 are connected to each other in the sensing region 200A.

Referring to FIG. 11, the sensor layer 200 may further include a third trace line 230rt1, two third pads PD3 connected to one end and the other end of the third trace line 230rt1, two fourth trace lines 240t-1 and 240t-2, two fourth pads PD4 respectively connected to the fourth trace lines 240t-1 and 240t-2, fifth trace lines 230rt2, and a fifth pad PD5 connected to the fifth trace lines 230rt2 in a one-to-one correspondence, which are disposed in the peripheral region 200NA.

The third trace line 230rt1 may be electrically connected to all of the third electrodes 230. The third trace line 230rt1 may include a first line portion 231t extending along the first direction DR1 and electrically connected to one ends of the third electrodes 230, a second line portion 232t extending along the second direction DR2 from a first end of the first line portion 231t, and a third line portion 233t extending along the second direction DR2 from a second end of the first line portion 231t. One end of the second line portion 232t is connected to one third pad PD3, and one end of the third line portion 233t is connected to one third pad PD3. In an embodiment of the inventive concept, one or more of the second line portion 232t and the third line portion 233t may be omitted. In accordance therewith, one or more of the second pad PD2 and the third pad PD3 may be omitted.

The fifth trace lines 230rt2 may be connected to the third electrodes 230 in a one-to-one correspondence. That is, the number of the fifth trace lines 230rt2 may correspond to the number of the third electrodes 230. FIG. 11 illustrates three fifth trace lines 230rt2 as an example.

The fourth trace lines 240t-1 and 240t-2 may be spaced apart from each other with the sensing region 200A interposed therebetween. One end of each of the (2-1)-th auxiliary electrodes 240s1 may be connected to one fourth trace line 240t-1. One end of each of the (2-2)-th auxiliary electrodes 240s2 may be connected to the other fourth trace line 240t-2.

The sensor layer 200 formed from the first conductive layer 202 and the second conductive layer 204 of FIG. 5 is described in detail with reference to FIGS. 11 to 14, but embodiments of the inventive concept are not limited thereto.

Figure 15A:
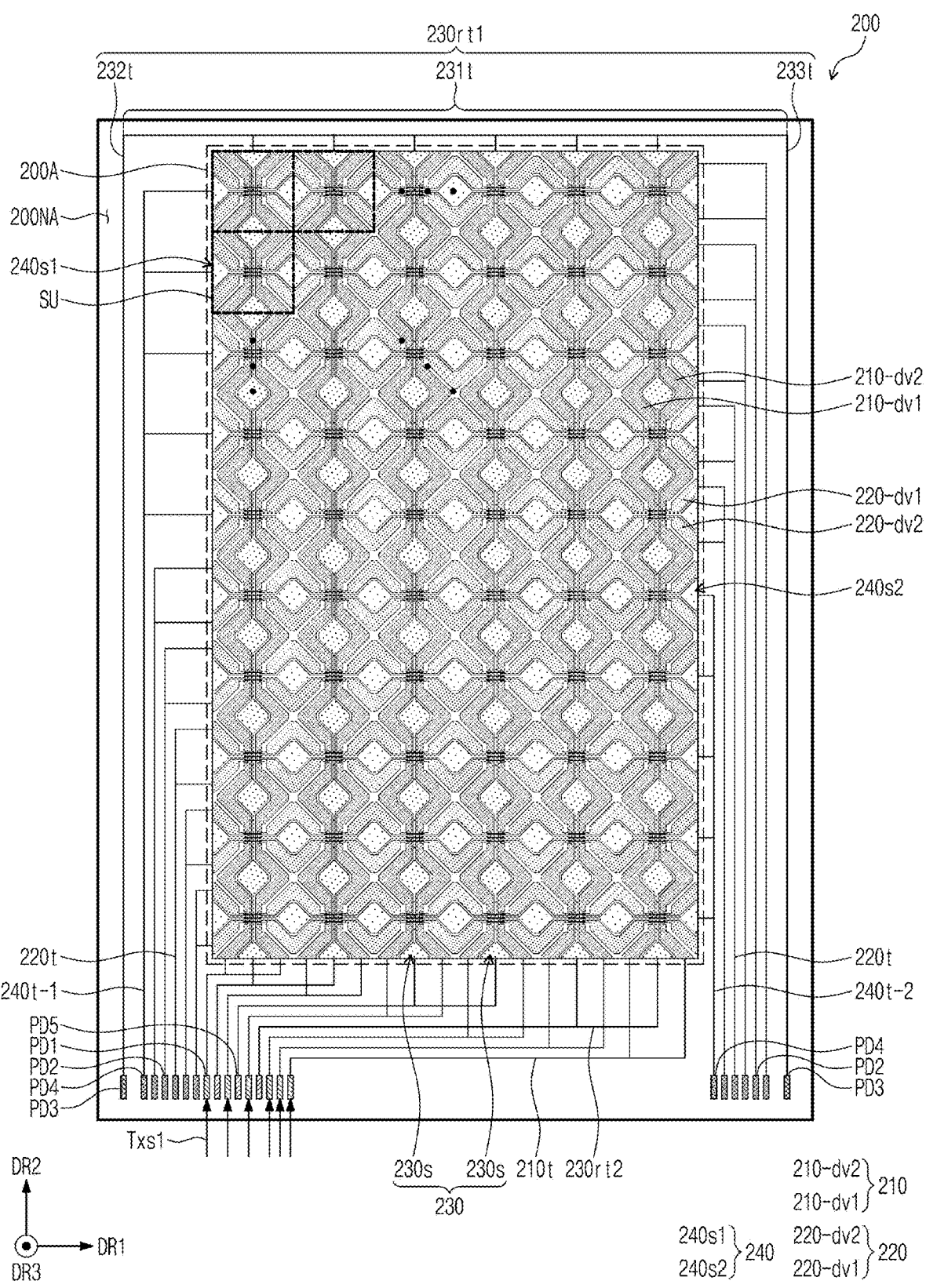
FIGS. 15A and 15B explain a first mode according to an embodiment of the inventive concept.
Figure 15B:
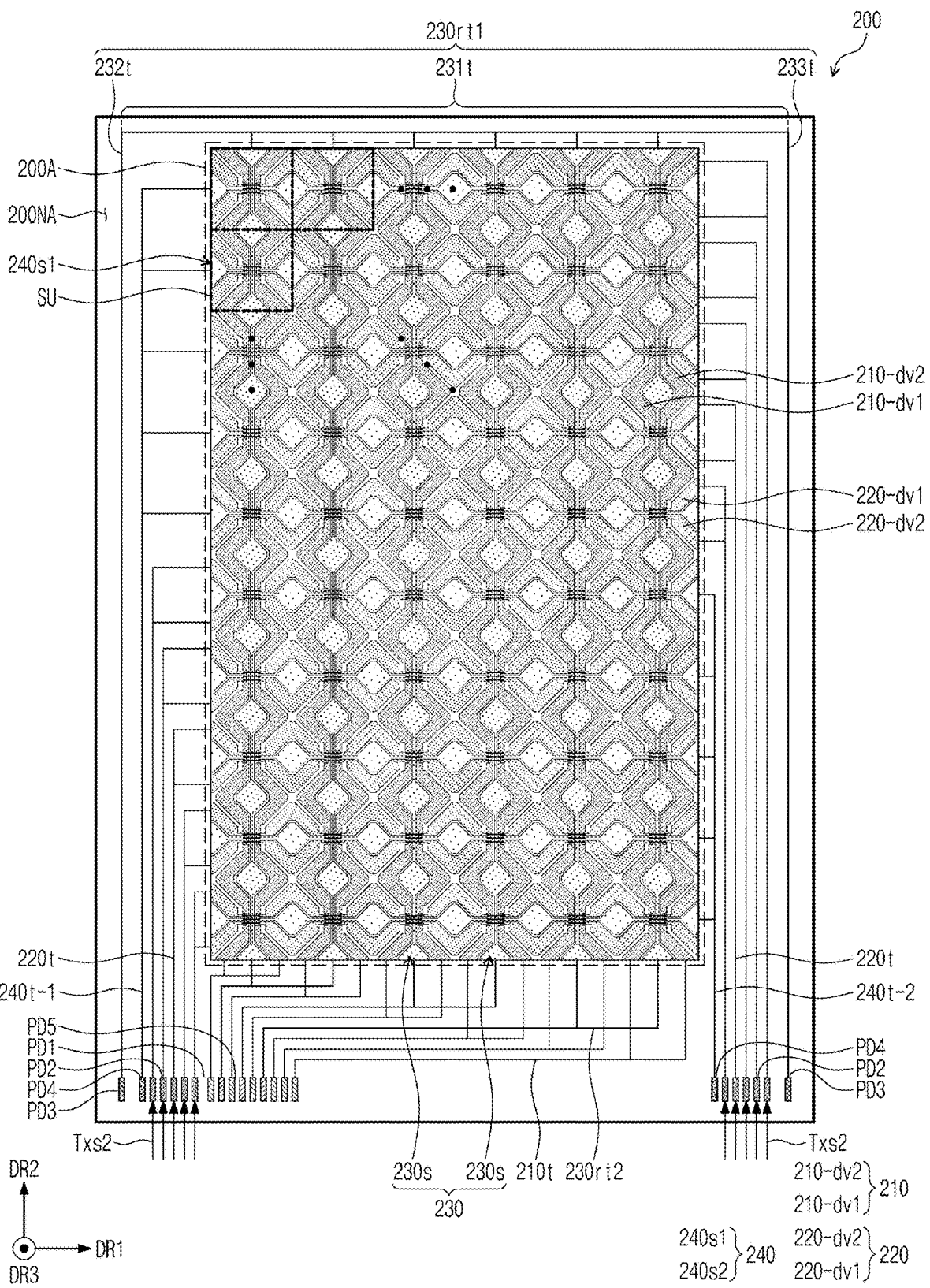

FIGS. 15A and 15B are used to explain a first mode according to an embodiment of the inventive concept.

Referring to FIGS. 15A, and 15B, in an embodiment of the inventive concept, the first mode is a self-capacitance detection mode. The self-capacitance detection mode may include a first sub-section (e.g., a first time period) and a second sub-section (e.g., a second time period). FIG. 15A is used to describe an operation in the first sub-section, and FIG. 15B is used to describe an operation in the second sub-section.

The sensor driver 200C (see FIG. 4) outputs driving signals Txs1 and Txs2 to the first electrodes 210 and the second electrodes 220 in the self-capacitance detection mode and reads a signal changed after a predetermined time. The sensor driver 200C may calculate an input coordinate by sensing a change in capacitance of each of the first electrodes 210 and the second electrodes 220. Referring to FIG. 15A, in the first sub-section, the sensor driver 200C may output a driving signal Txs1 to the first trace lines 210t. Referring to FIG. 15B, in the second sub-section, the sensor driver 200C may output a driving signal Txs2 to the second trace lines 220t. Within the first sub-section, the sensor driver 200C may sense a signal changed from the driving signal Txs1 through the first trace lines 210t. Within the second sub-section, the sensor driver 200C may sense a signal changed from the driving signal Txs2 through the second trace lines 220t.

The third electrodes 230 are electrically connected to the third trace line 230rt1 and the fifth trace lines 230rt2, and the fourth electrodes 240 are electrically connected to the fourth trace lines 240t-1 and 240t-2. In the self-capacitance detection mode, both the third electrodes 230 and the fourth electrodes 240 may be grounded. Accordingly, noise should not enter through the third electrodes 230 and the fourth electrodes 240.

In another embodiment of the inventive concept, a reference potential is applied to the third electrodes 230 and the fourth electrodes 240. In another embodiment of the inventive concept, a transmission signal and an in-phase signal may be applied to the third electrodes 230 and the fourth electrodes 240. In this case, noise should not enter through the third electrodes 230 and fourth electrodes 240. For example, the transmission signal may be applied to the third electrodes 230 and the in-phase signal may be applied to the fourth electrodes 240, or vice versa. The in-phase signal may be synchronized in phase with a reference signal.

Figure 16:
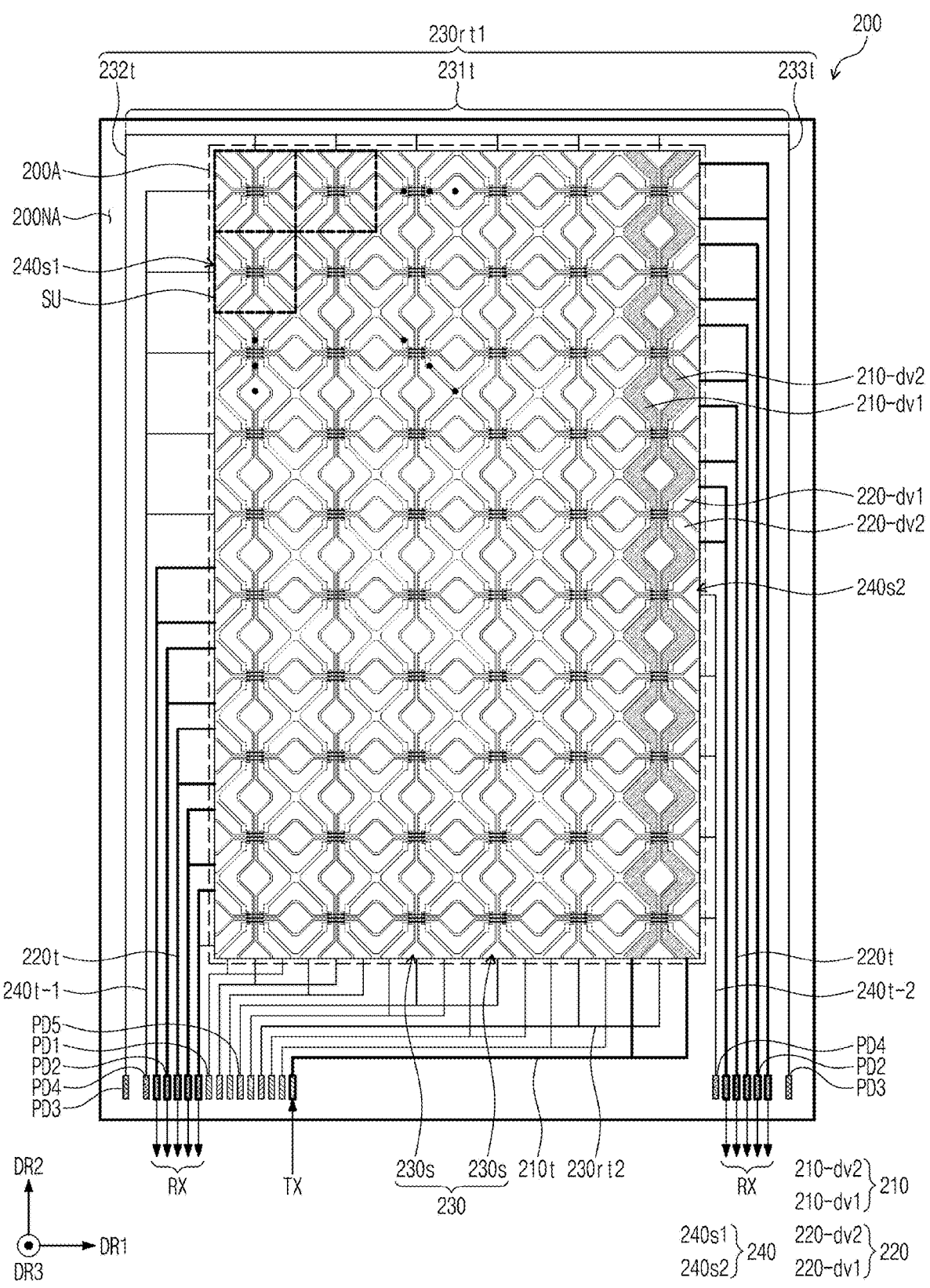
FIG. 16 explains the first mode according to an embodiment of the inventive concept.

FIG. 16 is used to explain the first mode according to an embodiment of the inventive concept.

Referring to FIG. 16, in an embodiment of the inventive concept, the first mode is a mutual capacitance detection mode. In the mutual capacitance detection mode, the sensor driver 200C (see FIG. 4) may sequentially provide a transmission signal TX (or driving signal) to the first electrodes 210 and detect the coordinate of the first input 2000 (see FIG. 4) by using a reception signal RX (or sensing signal) detected through the second electrodes 220. For example, the sensor driver 200C may be configured to calculate an input coordinate by sensing a change in mutual capacitance between the first electrodes 210 and the second electrodes 220. In an embodiment of the inventive concept, the transmission signal TX may be sequentially provided to the second electrodes 220, and the coordinate of the first input 2000 (see FIG. 4) may be detected by using the reception signal RX detected through the first electrodes 210. The above-described conflicting driving methods may be alternately executed.

FIG. 16 exemplarily illustrates that the transmission signal TX is provided to a single first electrode 210 and that the reception signal RX is output from the second electrodes 220. To express signals clearly, a single first electrode 210, to which the transmission signal TX is provided, is indicated by hatching in FIG. 16. The sensor driver 200C may detect the input coordinate of the first input 2000 by sensing a change in capacitance between the first electrode 210 and each of the second electrodes 220.

In the mutual capacitance detection mode, both the third electrodes 230 and the fourth electrodes 240 may be grounded. Accordingly, noise should not enter through the third electrodes 230 and the fourth electrodes 240. In another embodiment of the inventive concept, a reference potential may be applied to the third electrodes 230 and the fourth electrodes 240. In another embodiment of the inventive concept, a transmission signal and an in-phase signal may be applied to the third electrodes 230 and the fourth electrodes 240. In this case, noise should not enter through the third electrodes 230 and the fourth electrodes 240.

In the first mode, the sensor driver 200C (see FIG. 4) may drive the first electrodes 210 and the second electrodes 220 in a self-capacitance detection mode or a mutual capacitance detection mode, and the self-capacitance detection mode and the mutual capacitance detection mode may be alternately repeated.

Figure 17A:
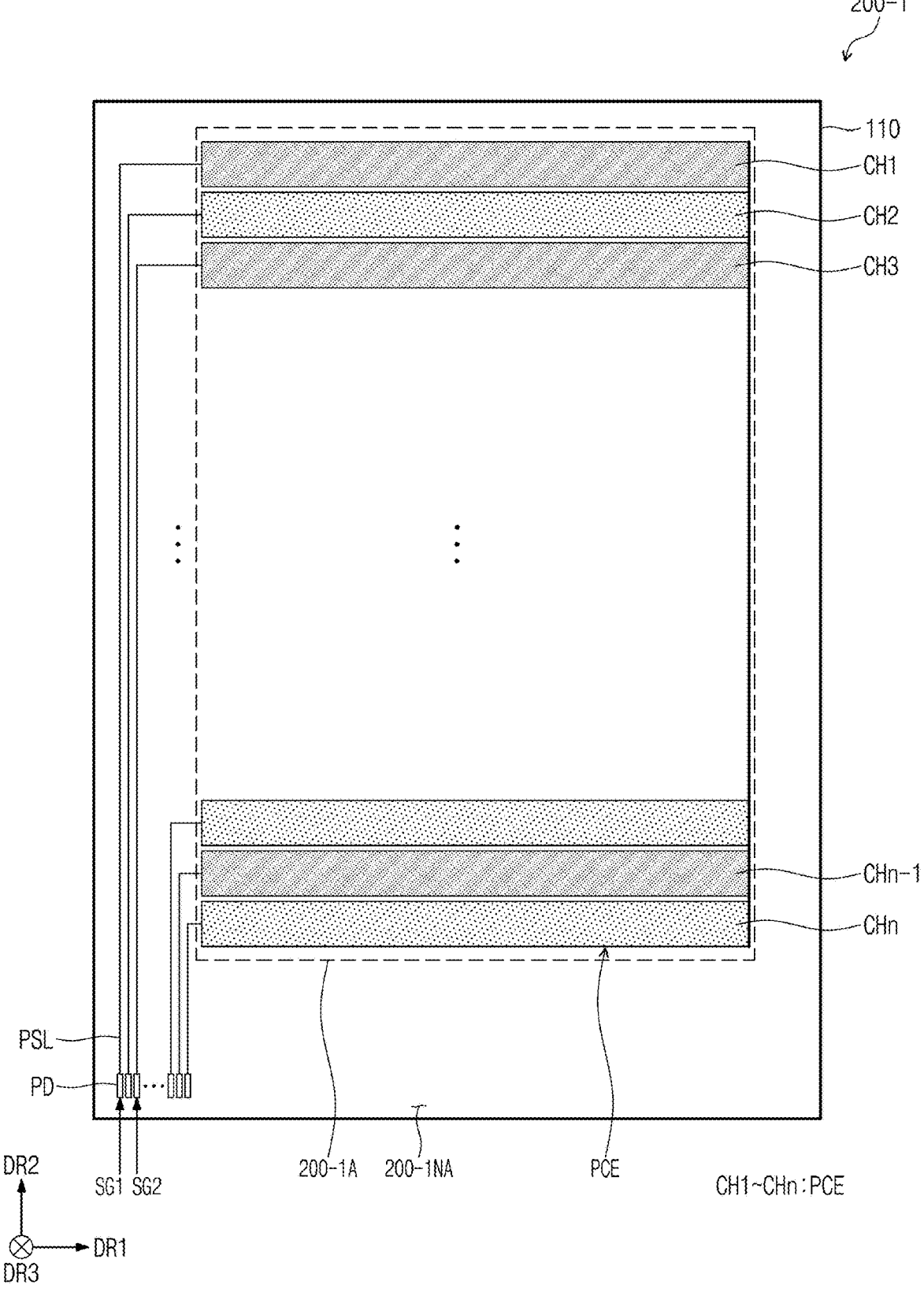
FIG. 17A is a plan view of a charging electrode layer according to an embodiment of the inventive concept.
Figure 17B:
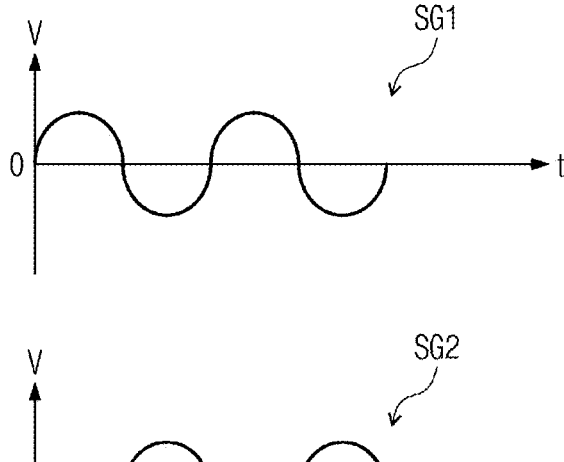
FIG. 17B shows graphs illustrating the waveforms of a first driving signal and a second driving signal of a second mode according to an embodiment of the inventive concept.

FIG. 17A is a plan view of the charging electrode layer 200-1 according to an embodiment of the inventive concept. FIG. 17B shows graphs illustrating the waveforms of the first driving signal SG1 and the second driving signal SG2 in the second mode according to an embodiment of the inventive concept. FIG. 17C is a table showing signals provided to the charging electrode layer 200-1 according to an embodiment of the inventive concept.

Referring to FIG. 17A, the charging electrode layer 200-1 includes a charging electrode PCE and signal lines PSL. The charging electrode PCE and the signal lines PSL are disposed on the rear surface of the base layer 110. The rear surface of the base layer 110 may include an electrode region 200-1A in which the charging electrode PCE is disposed and a line region 200-1NA in which the signal lines PSL are disposed.

The charging electrode PCE may include a plurality of channels CH1 to CHn electrically connected to each other. Here, n channels CH1 to CHn are illustrated as an example, wherein n is a natural number greater than or equal to 2. The plurality of channels CH1 to CHn may define charging channels and non-charging channels. In an embodiment of the inventive concept, the odd-numbered channels among the channels CH1 to CHn are the charging channels, and the even-numbered channels among the channels CH1 to CHn are the non-charging channels. Without being limited thereto, however, a specific channel may be selected arbitrarily without being determined as a charging channel or a non-charging channel. In addition, a plurality of non-charging channels may be disposed between adjacent charging channels.

The signal lines PSL may be respectively connected to one ends of the plurality of channels CH1 to CHn. FIG. 17A exemplarily illustrates n signal lines PSL. The signal lines PSL are respectively connected to the pads PD.

The charging electrode layer 200-1 may operate during a pen charging driving mode of the second mode. Referring to FIG. 17A, in the pen charging driving mode, the sensor driver 200C (see FIG. 4) may apply the first driving signal SG1 to one of the pads PD and the second driving signal SG2 to another pad thereof. In this case, one channel receiving the first driving signal SG1 and one channel receiving the second driving signal SG2 may generate an induced magnetic field.

The second driving signal SG2 may be an offset signal of the first driving signal SG1. For example, the second driving signal SG2 may be offset from the first driving signal SG1. In an embodiment, the amplitude of the composite waveform of the waveform of the first driving signal SG1 and the waveform of the second driving signal SG2 is reduced more than the amplitude of the first driving signal SG1.

In an embodiment, the second driving signal SG2 has the same frequency as the first driving signal SG1, but it has a different phase and is therefore offset from the first driving signal SG1. The phase difference between the first driving signal SG1 and the second driving signal SG2 may be about 90 degrees to about 270 degrees, or about 170 degrees to about 200 degrees. The amplitude of the second driving signal SG2 may be the same as or different from that of the first driving signal SG1.

Referring to FIG. 17B, the second driving signal SG2 may be a reverse phase signal of the first driving signal SG1. For example, each of the first driving signal SG1 and the second driving signal SG2 may be a sinusoidal wave signal. Each of the first driving signal SG1 and the second driving signal SG2 may be a square wave signal. Since the first driving signal SG1 and the second driving signal SG2 have a reverse phase relationship with each other, the direction of an induced magnetic field formed through two charging channels may change periodically.

Referring again to FIG. 17A, it is illustrated that the first driving signal SG1 is provided to the first channel CH1 and the second driving signal SG2 is provided to the third channel CH3. The first channel CH1 and the third channel CH3 correspond to charging channels, and the second channel CH2 corresponds to a non-charging channel. A current path formed in the first channel CH1 and the third channel CH3 may have a coil shape. Accordingly, in the pen charging driving mode, the RLC resonance circuit of the pen PN (see FIG. 4) may be charged by a magnetic field induced by the current pass.

The table in FIG. 17C shows driving signals applied in the pen charging driving mode, based on the charging electrode layer 200-1 including first to tenth channels CH1 to CH10. The table of FIG. 17C shows signals provided to the first to tenth channels CH1 to CH10 in each of first to eighth time periods t10 to t80. According to an embodiment of the inventive concept, the charging channel may be variable, and the entire region of the charging electrode layer 200-1 may be scanned.

During the first time period t10, the second driving signal SG2 is provided to the first channel CH1 and the first driving signal SG1 is provided to the third channel CH3. The second driving signal SG2 and the first driving signal SG1 may be interchanged with each other.

In the table of FIG. 17C, "FL" means that the first driving signal SG1 or the second driving signal SG2 is not provided to corresponding channels or the corresponding channels is in a floating state. During the second time period t20, the second driving signal SG2 is provided to the second channel CH2 and the first driving signal SG1 is provided to the fourth channel CH4. Hereafter, during the third to eighth time periods t30 to t80, the second driving signal SG2 and the first driving signal SG1 may be provided while being shifted by one channel. During the eighth time period t80, the second driving signal SG2 is provided to the eighth channel CH8 and the first driving signal SG2 is provided to the tenth channel CH10.

Although it has been described that one non-charging channel is disposed between charging channels to which the second driving signal SG2 and the first driving signal SG1 are provided, embodiments of the inventive concept are not limited thereto. According to an embodiment of the inventive concept, two or more non-charging channels may be disposed between two adjacent charging channels.

Although it has been described that each of the second driving signal SG2 and the first driving signal SG1 is provided to one charging channel, embodiments of the inventive concept are not limited thereto. According to an embodiment of the inventive concept, the second driving signal SG2 is provided to two or more adjacent charging channels, and the first driving signal SG1 is provided to two or more adjacent charging channels. In this case, at least one non-charging channel may be disposed between them. As time periods pass, the second driving signal SG2 and the first driving signal SG1 may be provided to corresponding channels while being shifted by more than two channels.

Figure 18A:
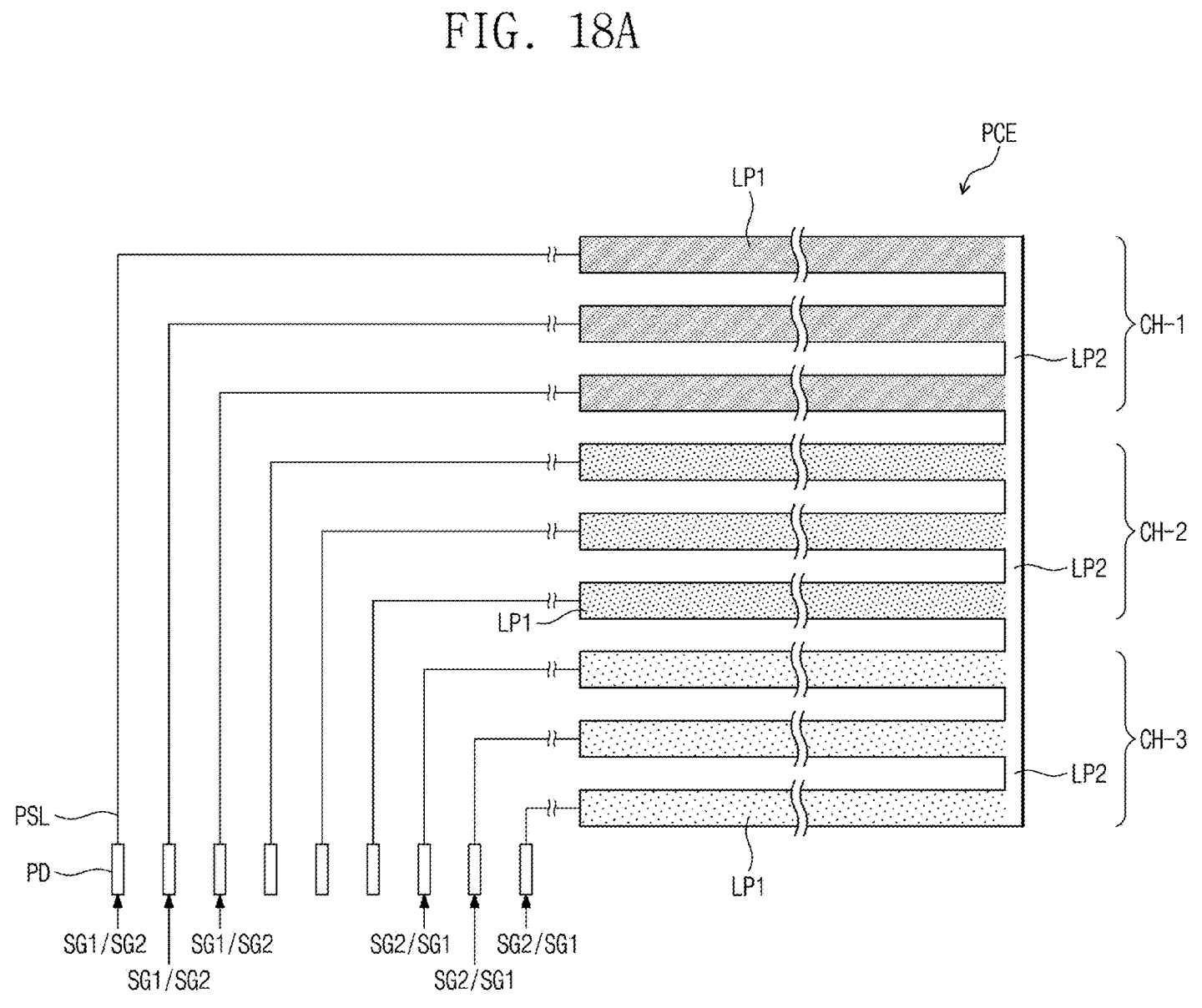
Figure 18B:
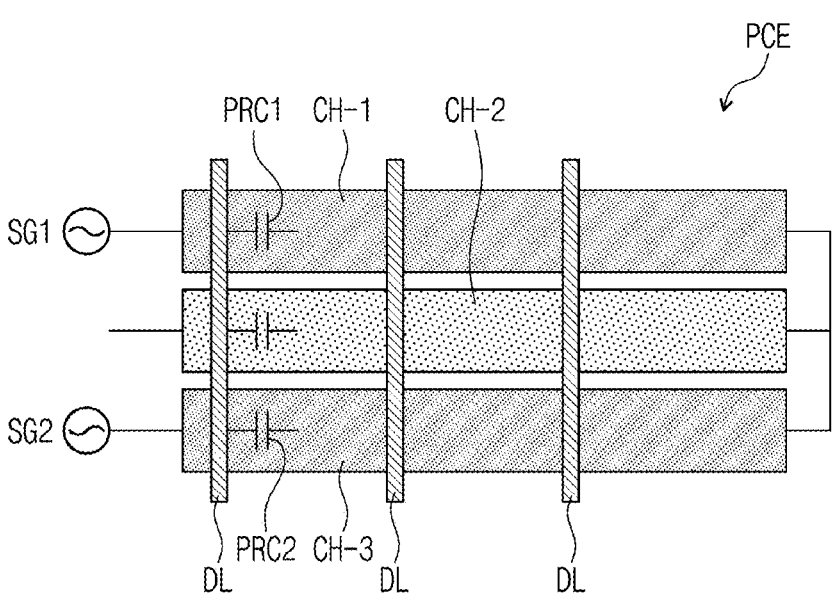
FIG. 18B is a plan view illustrating two charging channels, a non-charging channel disposed between them, and data lines according to an embodiment of the inventive concept.
Figure 18C:
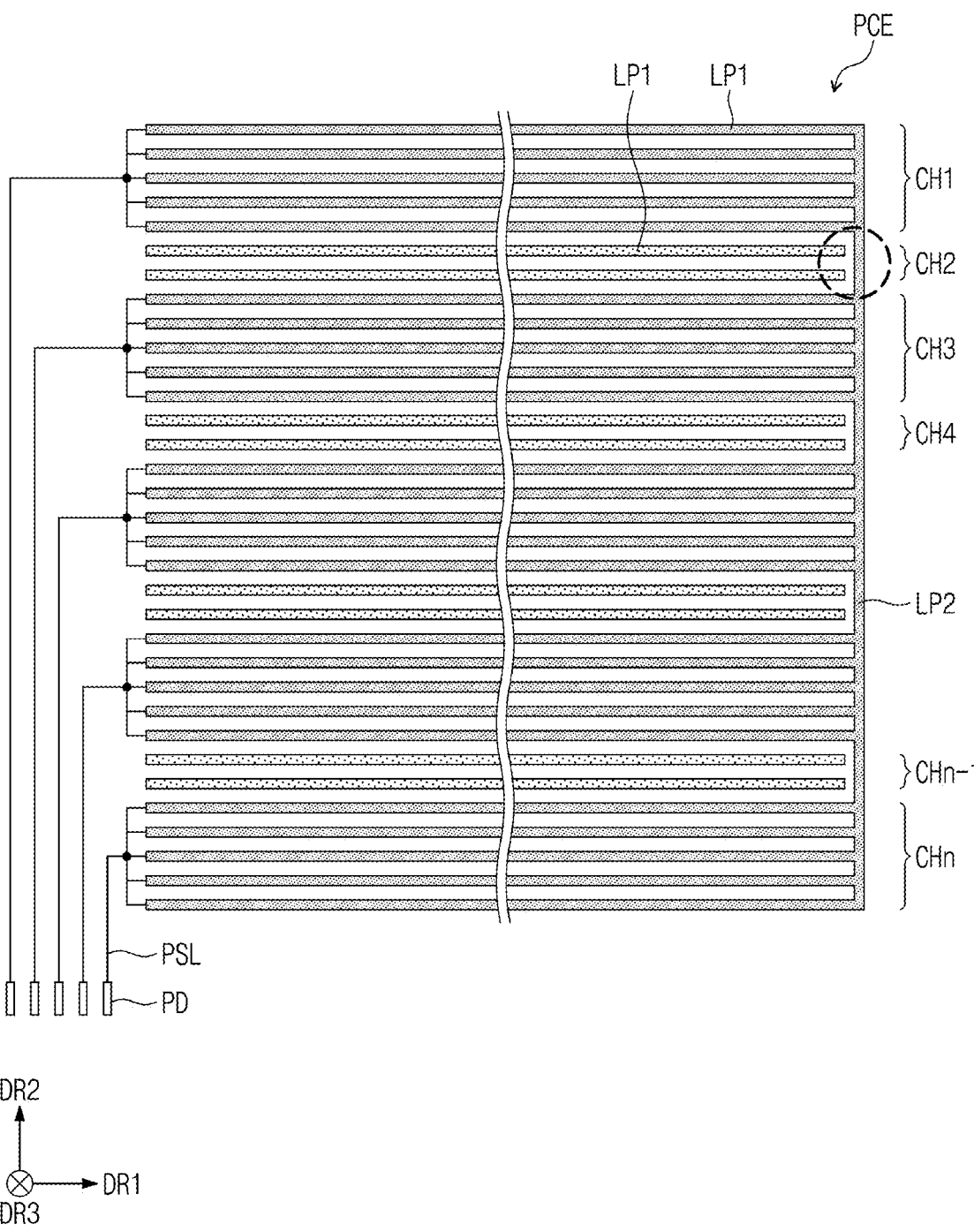
FIG. 18C is a plan view of a charging electrode according to an embodiment of the inventive concept.

FIG. 18A is a plan view illustrating three adjacent channels according to an embodiment of the inventive concept. FIG. 18B is a plan view illustrating two charging channels, a non-charging channel disposed between the two charging channels, and data lines according to an embodiment of the inventive concept. FIG. 18C is a plan view of the charging electrode PCE according to an embodiment of the inventive concept.

For the convenience of explanation, the three channels CH-1, CH-2, and CH-3 illustrated in FIGS. 18A and 18B are described as a first channel CH-1, a second channel CH-2, and a third channel CH-3. Each of the first channel CH-1, the second channel CH-2, and the third channel CH-3 may include a plurality of first line portions LP1. Although it is illustrated that each of the first channel CH-1, the second channel CH-2, and the third channel CH-3 includes three first line portions LP1 which are identical to each other, embodiments of the inventive concept are not limited thereto. While three first line portions LP1 are arranged in different pixel rows as described with reference to FIG. 8, the first channel CH-1, the second channel CH-2, and the third channel CH-3 may include different numbers of the first line portions LP1.

Referring to FIG. 18A, one ends of the first line portions LP1 of each of the first channel CH-1, the second channel CH-2, and the third channel CH-3 are connected to corresponding pads PD through corresponding signal lines PSL. Pads PD arranged in one-to-one correspondence with the first line portions LP1 are illustrated as an example. Without being limited thereto, however, the first line portions LP1 forming one channel may be connected to a same pad PD.

The other ends of the first line portions LP1 may be connected to each other through the second line portion LP2. The first line portions LP1 of the first channel CH-1, the second channel CH-2, and the third channel CH-3 may be connected through the second line portion LP2. In an embodiment, the second line portion LP2 extends in a direction crossing the first line portions LP1.

During the pen charging driving mode, the first line portions LP1 of the first channel CH-1 may receive a same signal. The first line portions LP1 of the first channel CH-1 may receive the first driving signal SG1 or the second driving signal SG2. Further, during the pend charging driving mode, the first line portions LP1 of the second channel CH-2 do not receive the first driving signal SG1 and the second driving signal SG2. The first line portions LP1 of the third channel CH-3 may receive a same driving signal although the driving signal is different from the driving signal received by the first line portions LP1 of the first channel CH-1. For example, the first line portions LP1 of the third channel CH-3 may receive the second driving signal SG2 or the first driving signal SG1.

During the pen charging driving mode, line portions, such as the first line portions LP1 of the first channel CH-1 and the first line portions LP1 of the third channel CH-3, which receive the first driving signal SG1 or the second driving signal SG2, may be referred to as a (1-1)-th line portion, and line portions, such as the first line portions LP1 of the second channel CH-2, which do not receive the first driving signal SG1 and the second driving signal SG2, may be referred to as a (1-2)-th line portion. That is, the first line portions LP1 which constitute the charging channel may be referred to as a (1-1)-th line portion, and the first line portions LP1 which constitute the non-charging channel may be referred to as a (1-2)-th line portion.

As described above, among the first line portions LP1, line portions to which the first driving signal SG1 or the second driving signal SG2 is applied define the first channel CH-1 or the third channel CH-3, and the first line portions LP1 to which the first driving signal SG1 and the second driving signal SG2 are not applied define the second channel CH-2, and therefore, the widths of the channels may be controlled.

Referring to FIG. 18B, since the first channel CH-1 and the third channel CH-3 cross each of the data lines DL, noise (or interference) to each of the data lines DL may be reduced. In a region in which one data line DL and the first channel CH-1 and the third channel CH-3 overlap each other, parasitic capacitors having a relatively small capacity are formed. In addition, interference caused by a first parasitic capacitor PRC1 formed between one data line DL and the first channel CH-1 and interference caused by a second parasitic capacitor PRC2 formed between one data line DL and the third channel CH-3 may offset each other. Since the first driving signal SG1 and the second driving signal SG2, which have or substantially have a reverse phase signal relationship with each other, are respectively applied to the first channel CH-1 and the third channel CH-3, the interference caused by the first parasitic capacitor PRC1 and the interference caused by the second parasitic capacitor PRC2 offsets each other. Noise generated in one data line DL by the first driving signal SG1 provided to the charging electrode PCE may be reduced by a phase difference between the second driving signal SG2 and the first driving signal SG1.

Referring to FIG. 18C, some of the first line portions LP1 may be connected to the signal line PSL to define a charging channel, and other portions thereof may be spaced apart from the second line portion LP2 as illustrated in dotted lines in FIG. 18C to define a non-charging channel.

Among the plurality of channels CH1 to CHn, odd-numbered channels define charging channels, and even-numbered channels define non-charging channels. The charging channels and the non-charging channels with different numbers of first line portions LP1 are exemplarily illustrated, but embodiments of the inventive concept are not limited thereto. In an embodiment, two of the first line portions LP1 are not connected to any of the signal lines PSL to form a non-charging channel CH2, and this non-charging channel is located between a first set of four line portions LP1 connected to a first one of the signal lines PSL to form a first changing channel CH1 and a second set of four line portions LP1 connected to a second one of the signal lines PSL to form a third charging channel CH3.

Unlike what is illustrated in dotted lines in FIG. 18C, although some of the first line portions LP1 are connected to the second line portions LP2, the even-numbered channels may define the non-charging channels. This is because the signal line PSL is not connected to the even-numbered channels.

FIGS. 19A to 19D are plan views of the charging electrode layer 200-1 according to an embodiment of the inventive concept. The charging electrode layer 200-1 may include a plurality of charging electrodes PCE1 and PCE2. The charging electrode layer 200-1 including first and second charging electrodes PCE1 and PCE2 is illustrated as an example. The first and second charging electrodes PCE1 and PCE2 may be disposed to be spaced apart from each other in the second direction DR2. The first and second charging electrodes PCE1 and PCE2 may be electrically separated from each other. The expression that the first and second charging electrodes PCE1 and PCE2 are electrically separated from each other means that they are not connected to each other by signal lines and the like excluding unintended electrical connections such as a parasitic capacitor and a leakage current formed between them.

First signal lines PSL1 connect the channels CH1 to CHn of the first charging electrodes PCE1 and the first pads PD1 to each other. Second signal lines PSL2 connect the channels CH1 to CHm of the second charging electrodes PCE2 and the second pads PD2 to each other. The number of the channels CH1 to CHn of the first charging electrodes PCE1 and the number of the channels CH1 to CHm of the second charging electrodes PCE2 may be the same as or different from each other. In the first direction DR1, an electrode region 200-1A may be disposed between the first signal lines PSL1 and the second signal lines PSL2.

Figure 19A:
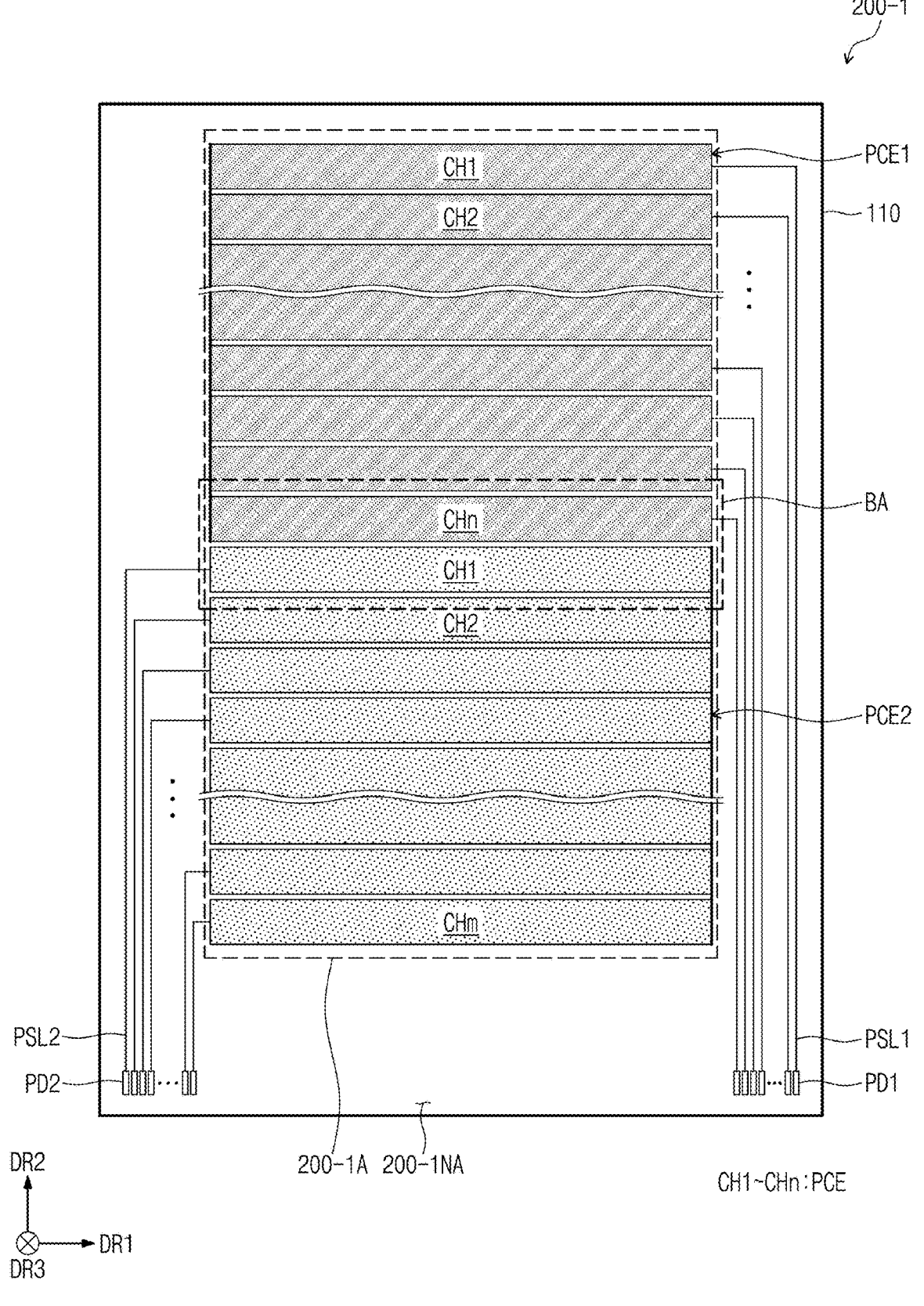
FIGS. 19A to 19D are plan views of the charging electrode layer according to an embodiment of the inventive concept.
Figure 19B:
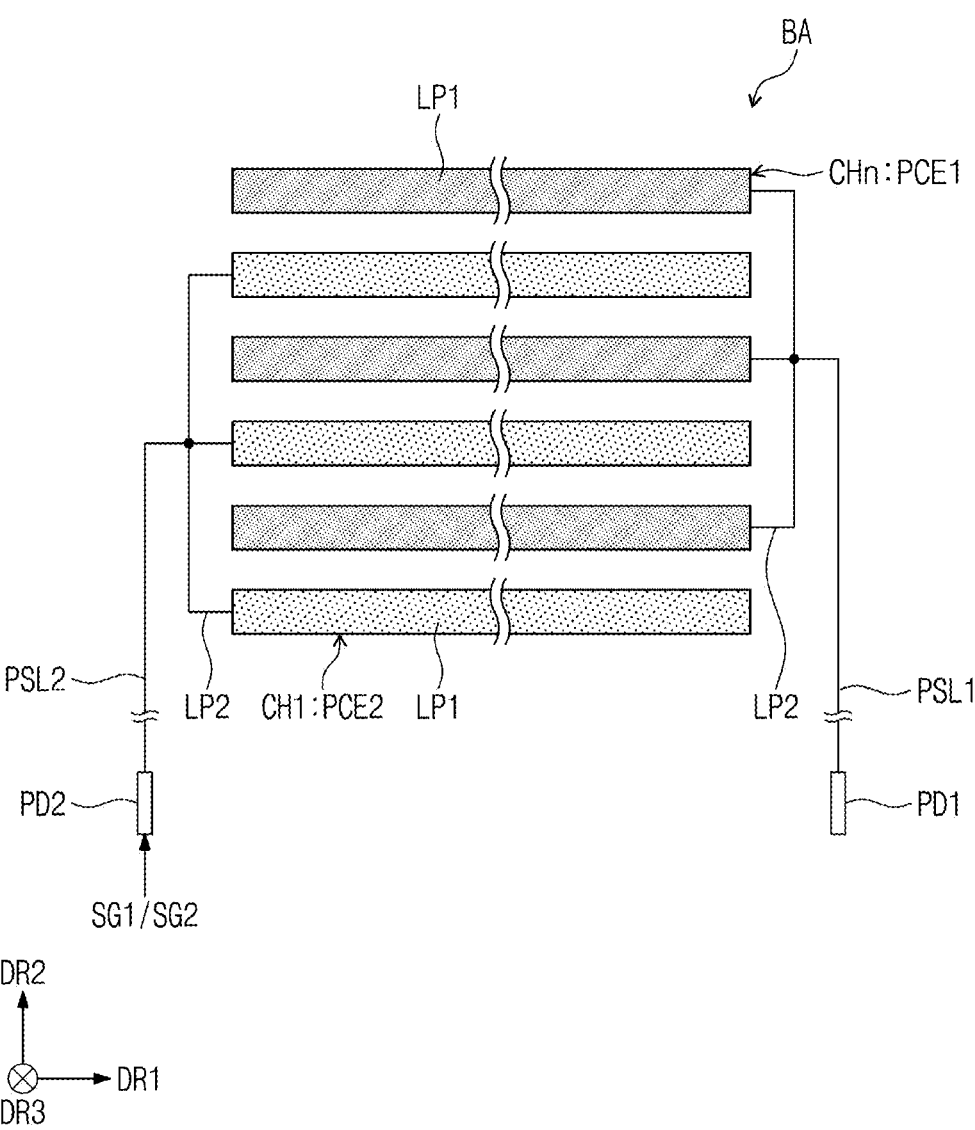

Unlike FIG. 19A in which the last channel CHn of the first charging electrode PCE1 and the first channel CH1 of the second charging electrode PCE2 are spaced apart from each other, the last channel CHn of the first charging electrode PCE1 and the first channel CH1 of the second charging electrode PCE2 may form a boundary channel in a boundary region BA. The boundary region BA in FIG. 19A is illustrated in FIG. 19B. According to FIG. 19B, the first line portions LP1 of the last channel CHn of the first charging electrode PCE1 and the first line portions LP1 of the first channel CH1 of the second charging electrode PCE2 may be disposed alternately along the second direction DR2. For example, the last channel CHn may include a first plurality of first line portions LP1 that are connected to a first signal line PSL1 and the first channel CH1 may include a second plurality of first line portions LP1 that are connected to a second signal line PSL2, where the first plurality of first line portions LP1 alternate with the second plurality of first line portions LP1.

Figure 19C:
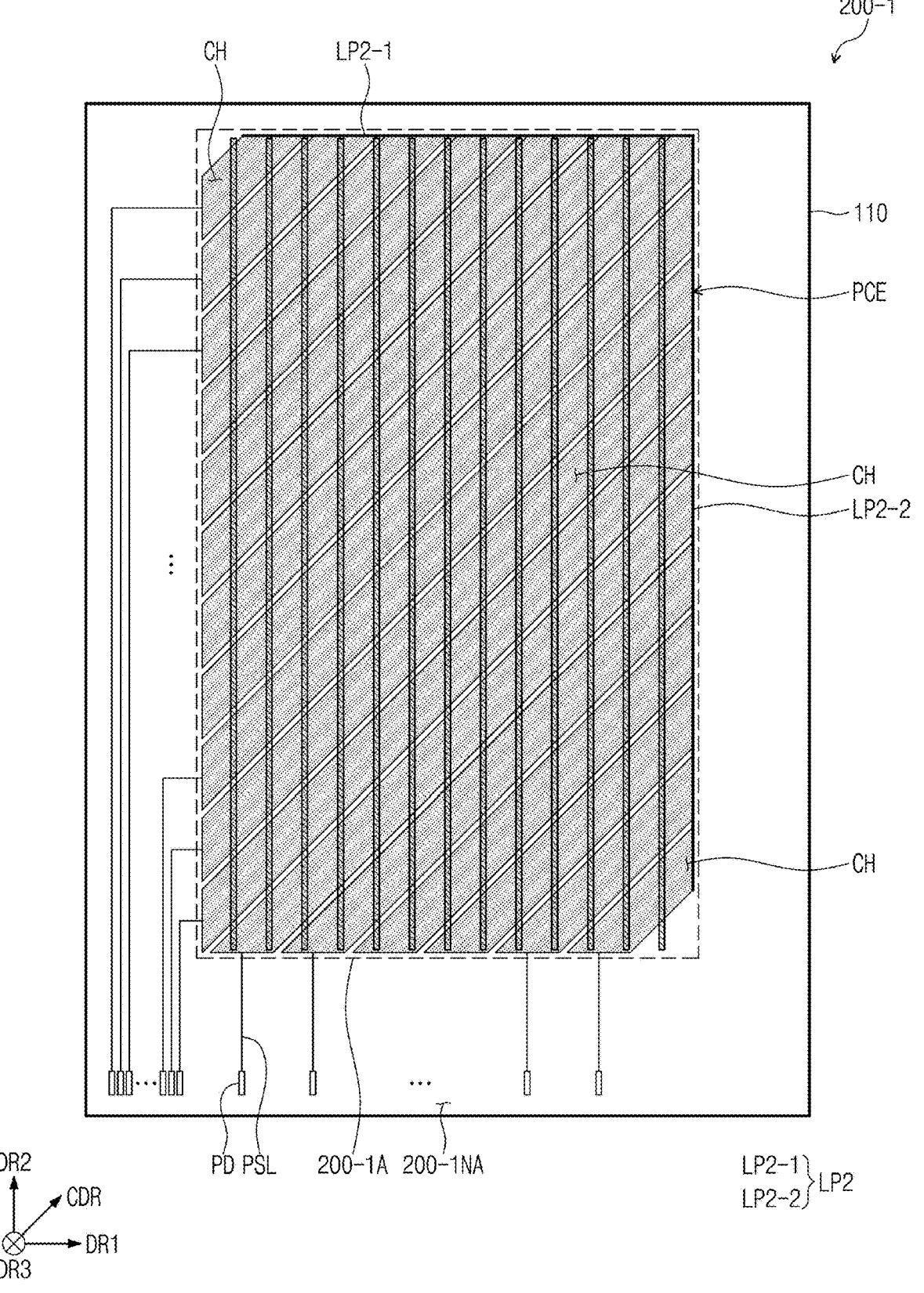
Figure 19D:
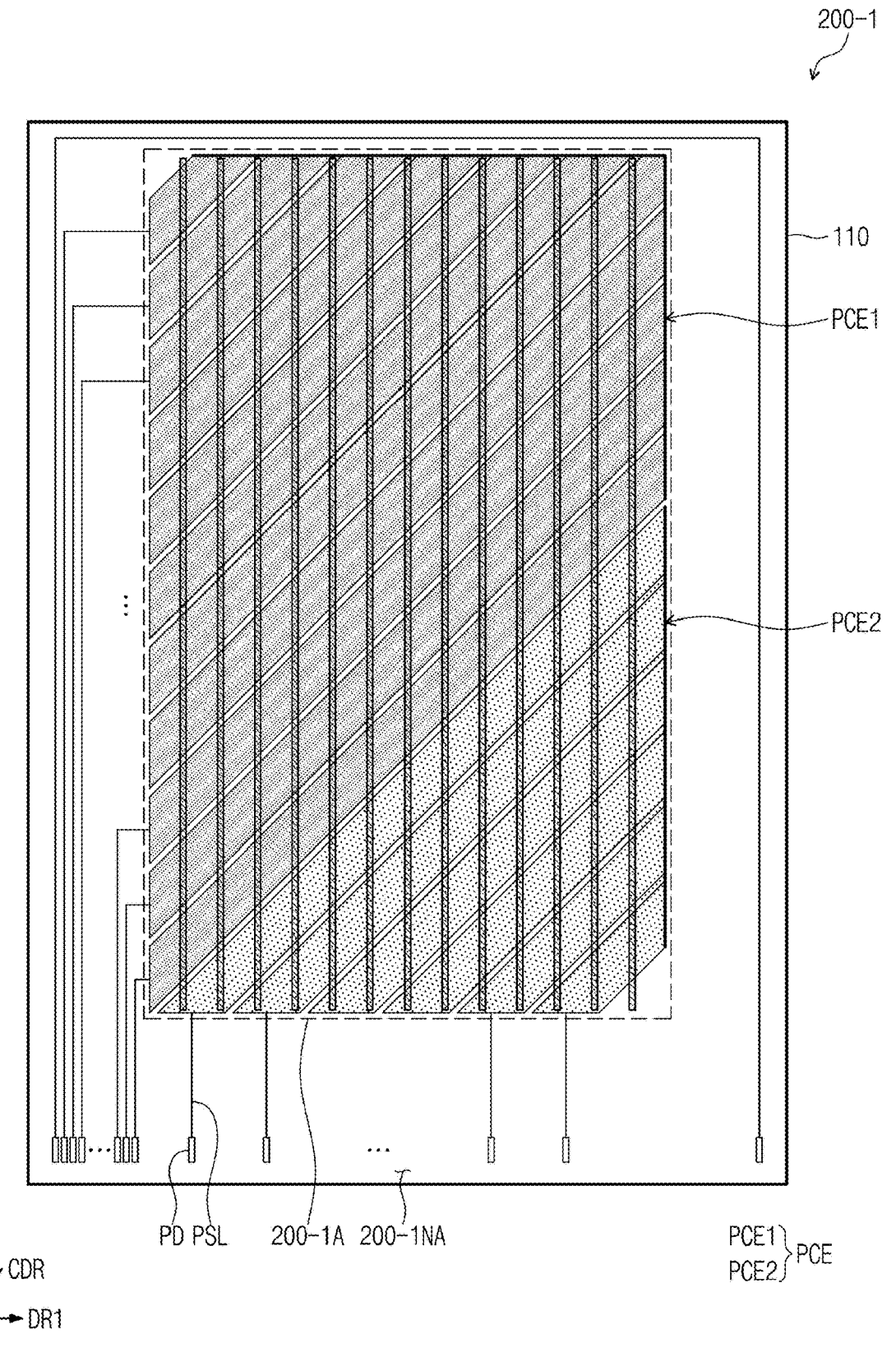

FIGS. 19C and 19D exemplarily illustrate the charging electrode PCE including channels CH extending in a direction CDR (hereinafter referred to as a crossing direction) crossing the first direction DR1 and the second direction DR2. A first portion LP2-1 of the second line portion LP2 extends in the first direction DR1 to electrically connect some channels CH to each other, and the second portion LP2-2 of the second line portion LP2 extends in the second direction DR2 to electrically connect some other channels CH to each other.

As illustrated in FIG. 19D, the first charging electrode PCE1 and the second charging electrode PCE2 having different areas and shapes may be disposed in the electrode region 200-1A.

Figure 20A:
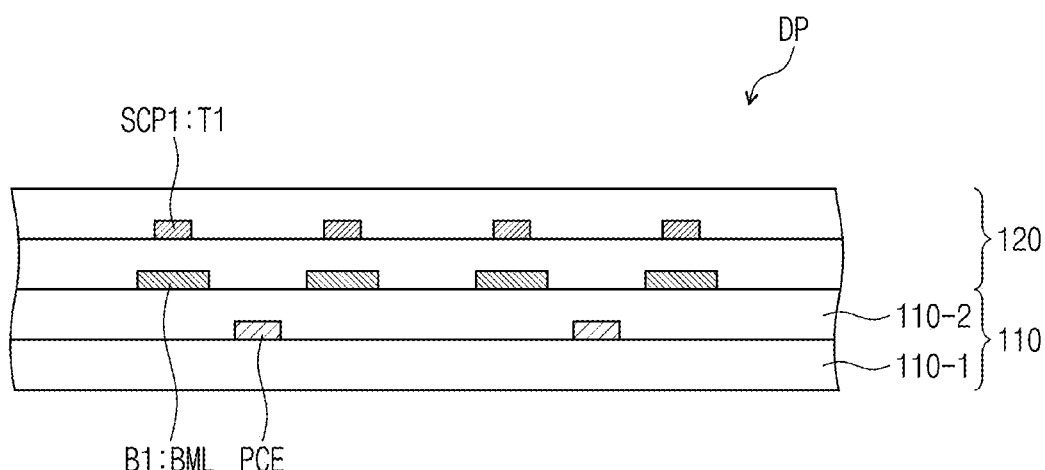
FIGS. 20A to 20C are cross-sectional views of the display panel according to an embodiment of the inventive concept.
Figure 20B:
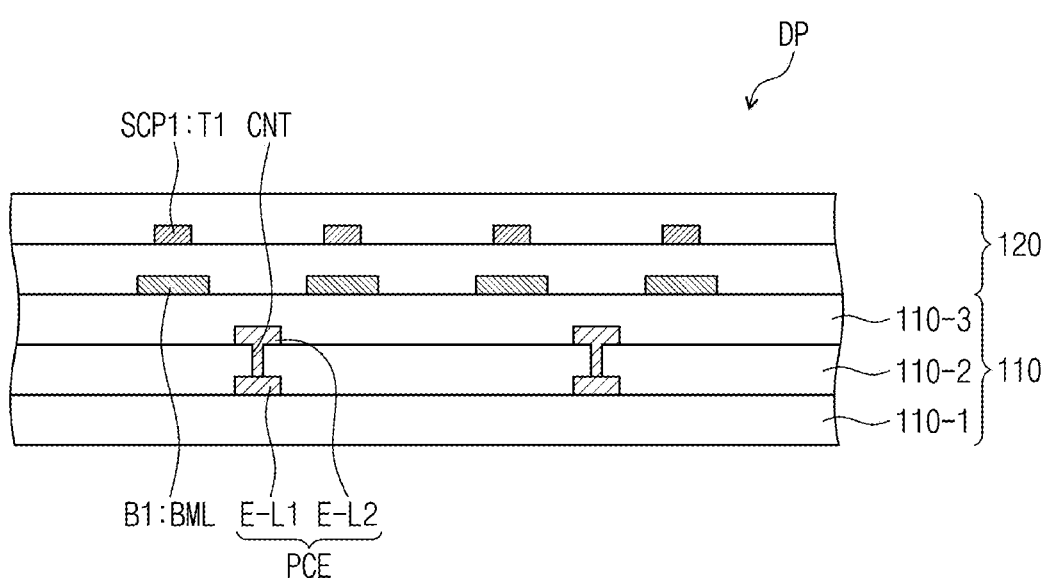
Figure 20C:
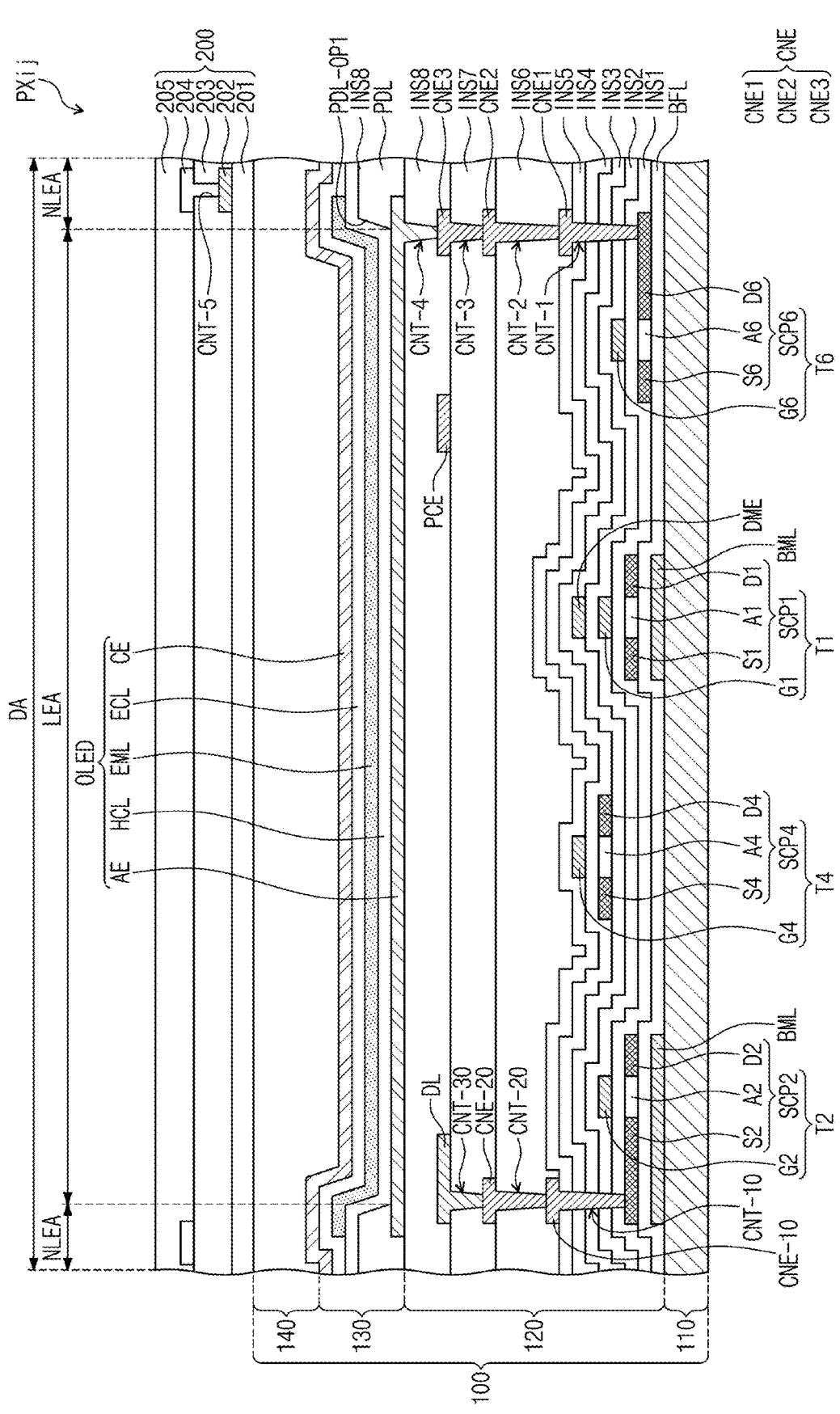

FIGS. 20A to 20C are cross-sectional views of the display panel DP according to an embodiment of the inventive concept.

FIGS. 20A and 20B illustrate the base layer 110 and the driving circuit layer 120 of the display panel DP, and the driving circuit layer 120 is illustrated more simply than in FIG. 7. As illustrated in FIGS. 20A and 20B, the charging electrode PCE may be disposed in the base layer 110. The base layer 110 may include a plurality of resin layers. The plurality of resin layers may contain a polymer such as polyimide.

As illustrated in FIG. 20A, the base layer 110 may include a first resin layer 110-1 and a second resin layer 110-2. The charging electrode PCE may be disposed between the first resin layer 110-1 and the second resin layer 110-2. An inorganic layer may be further disposed between the first resin layer 110-1 and the second resin layer 110-2, and the inorganic layer may cover the charging electrode PCE.

As illustrated in FIG. 20B, the base layer 110 may include a first resin layer 110-1, a second resin layer 110-2, and a third resin layer 110-3. The charging electrode PCE may have a multi-layered structure. A first layer E-L1 of the charging electrode PCE is disposed between the first resin layer 110-1 and the second resin layer 110-2, and a second layer E-L2 of the charging electrode PCE is disposed between the second resin layer 110-2 and the third resin layer 110-3. The first layer E-L1 and the second layer E-L2 are connected to each other through a contact hole CNT passing through the second resin layer 110-2. The charging electrode PCE having a multi-layered structure has low resistance, thus allowing a large current to flow and being able to induce a large magnetic field.

As illustrated in FIG. 20C, the charging electrode PCE may be disposed in the driving circuit layer 120. As in FIG. 20C, the charging electrode PCE may be disposed on the same layer as the data line DL. A bridge may be disposed in a region in which the charging electrode PCE and the data line DL cross each other. The bridge may be disposed on a layer different from that of the data line DL and connect the disconnected regions of the charging electrode PCE.

Figure 21A:
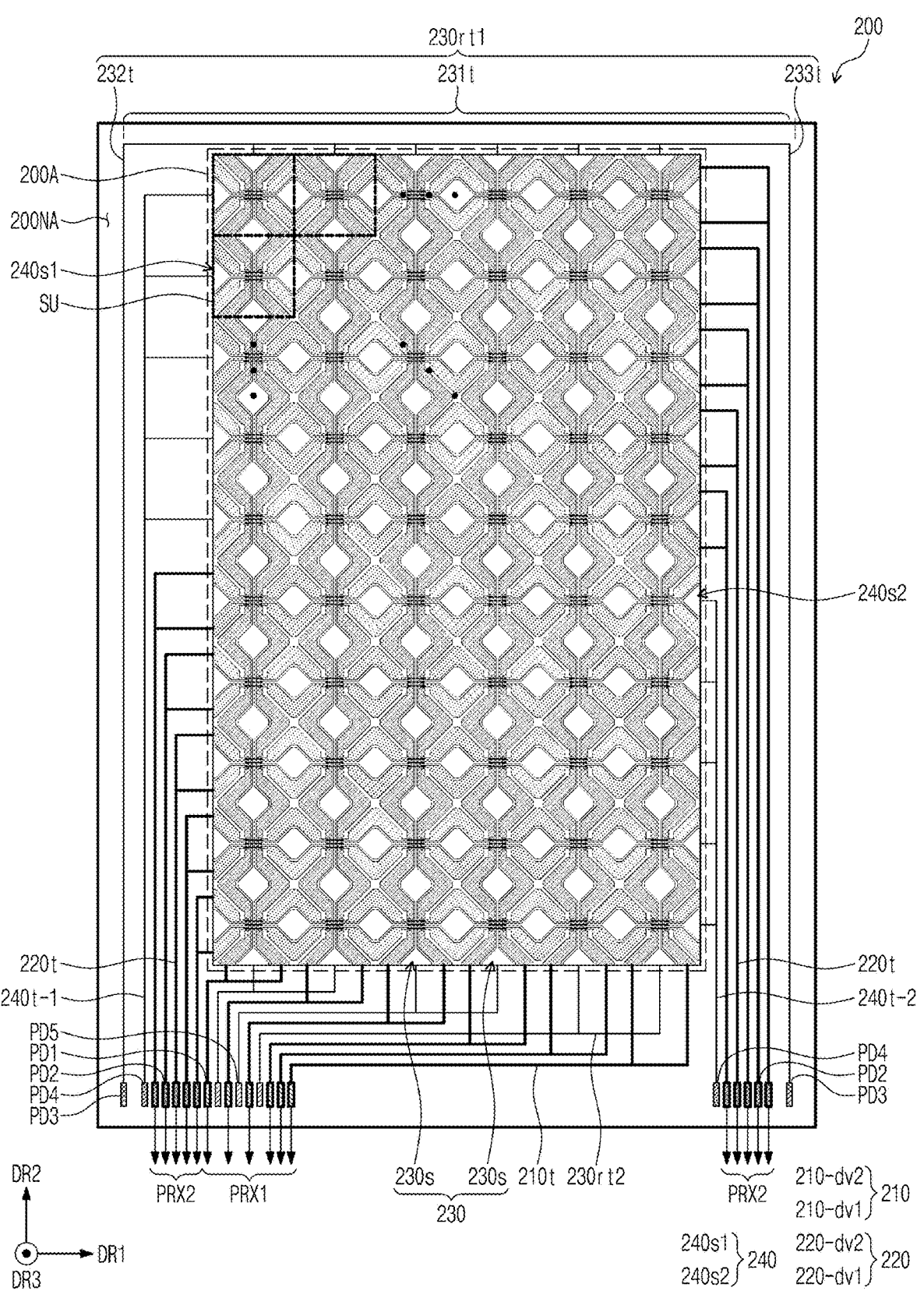
FIG. 21A explains a second mode according to an embodiment of the inventive concept.
Figure 21B:
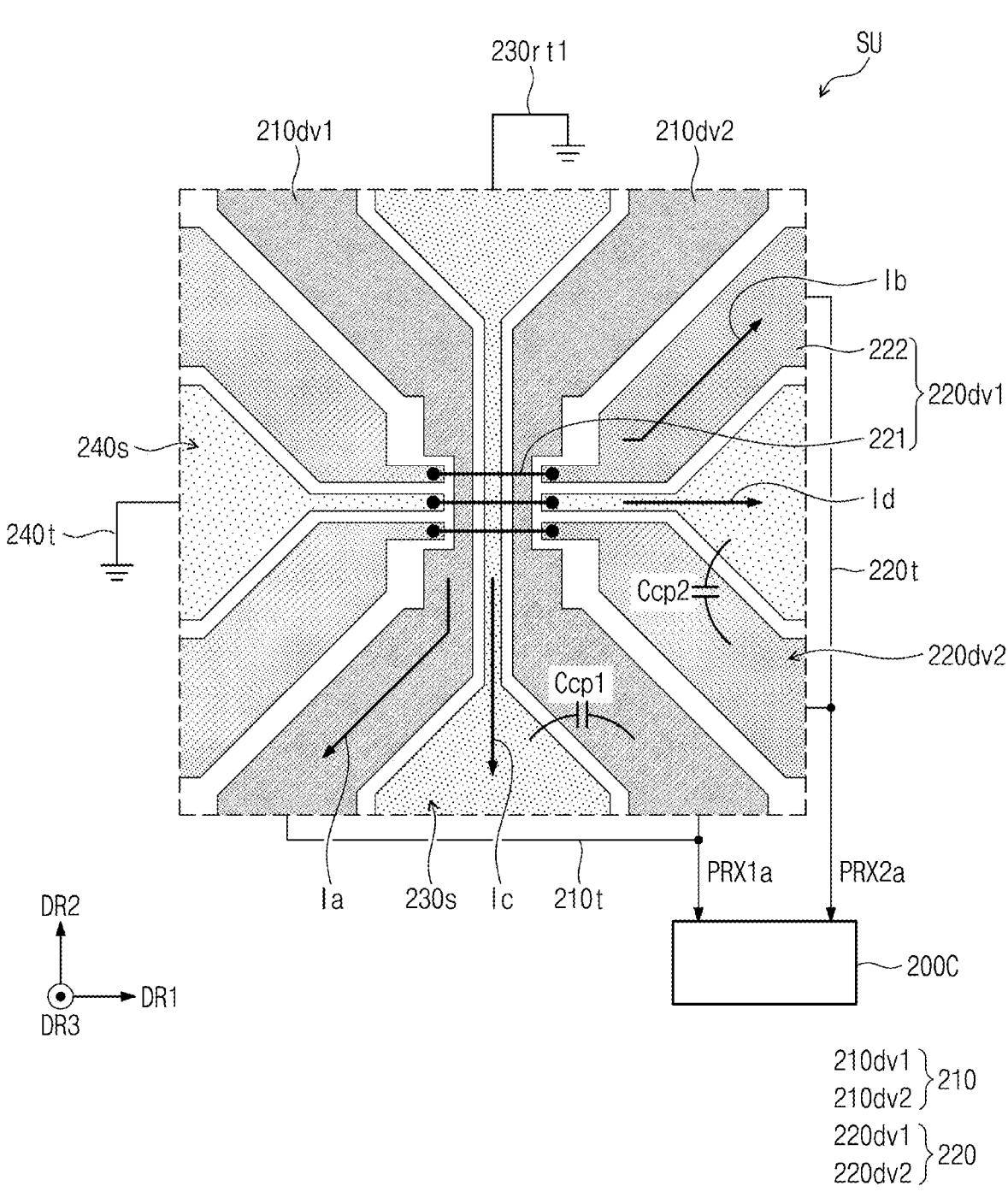
FIG. 21B explains the second mode, based on the sensing unit according to an embodiment of the inventive concept.

FIG. 21A is used to explain a second mode according to an embodiment of the inventive concept. FIG. 21B is used to explain the second mode, based on the sensing unit SU according to an embodiment of the inventive concept.

FIGS. 21A and 21B are used to explain a pen sensing driving mode. FIG. 21B illustrates one sensing unit SU through which first to fourth induced currents Ia, Ib, Ic, and Id generated by the pen PN flow.

The RLC resonance circuit of the PN may emit a magnetic field of a resonance frequency while discharging a charged charge. A first induced current Ia may be generated in the first electrode 210 and a second induced current Ib may be generated in the second electrode 220 by the magnetic field provided by the pen PN. In addition, a third induced current Ic may be generated in the first auxiliary electrode 230s of the third electrode 230, and a fourth induced current Id may be generated in the second auxiliary electrode 240s of the fourth electrode 240.

A first coupling capacitor Ccp1 may be formed between the first auxiliary electrode 230s and the first electrode 210, and a second coupling capacitor Ccp2 may be formed between the second auxiliary electrode 240s and the second electrode 220. The third induced current Ic may be transmitted to the first electrode 210 through the first coupling capacitor Ccp1, and the fourth induced current Id may be transmitted to the second electrode 220 through the second coupling capacitor Ccp2.

The sensor driver 200C may receive a first reception signal PRX1a based on the first induced current Ia and the third induced current Ic from the first electrode 210 and receive a second reception signal PRX2a based on the second induced current Ib and the fourth induced current Id from the second electrode 220. The sensor driver 200C may detect the input coordinate of the pen PN based on the first reception signal PRX1a and the second reception signal PRX2a.

During the pen sensing driving mode, both one ends of the third electrodes 230 and the fourth electrodes 240 may be floated. Therefore, compensation of a sensing signal may be maximized by coupling the first electrodes 210 and the third electrodes 230 and coupling the second electrodes 220 and the fourth electrodes 240. The other ends of the third electrodes 230 and the fourth electrodes 240 may be grounded or floated. Therefore, by coupling the first electrodes 210 and the third electrodes 230 and coupling the second electrodes 220 and the fourth electrodes 240, the third induced current Ic and the fourth induced current Id may be sufficiently transmitted to the first electrodes 210 and the second electrodes 220.

In this embodiment, it is described that the first reception signal PRX1a is transmitted to the sensor driver 200C through the first trace line 210t, and the second reception signal PRX2a is transmitted to the sensor driver 200C through the second trace line 220t, but embodiments of the inventive concept are not limited thereto. In an embodiment of the inventive concept, the first reception signal PRX1a is transmitted to the sensor driver 200C through the fifth trace line 230rt2, and the second reception signal PRX2a is transmitted to the sensor driver 200C through the fourth trace line 240t-1. However, the fifth trace line 230rt2 is separately connected to each first auxiliary electrode 230s, and the fourth trace line 240t-1 is separately connected to each second auxiliary electrode 240s.

Figure 22:
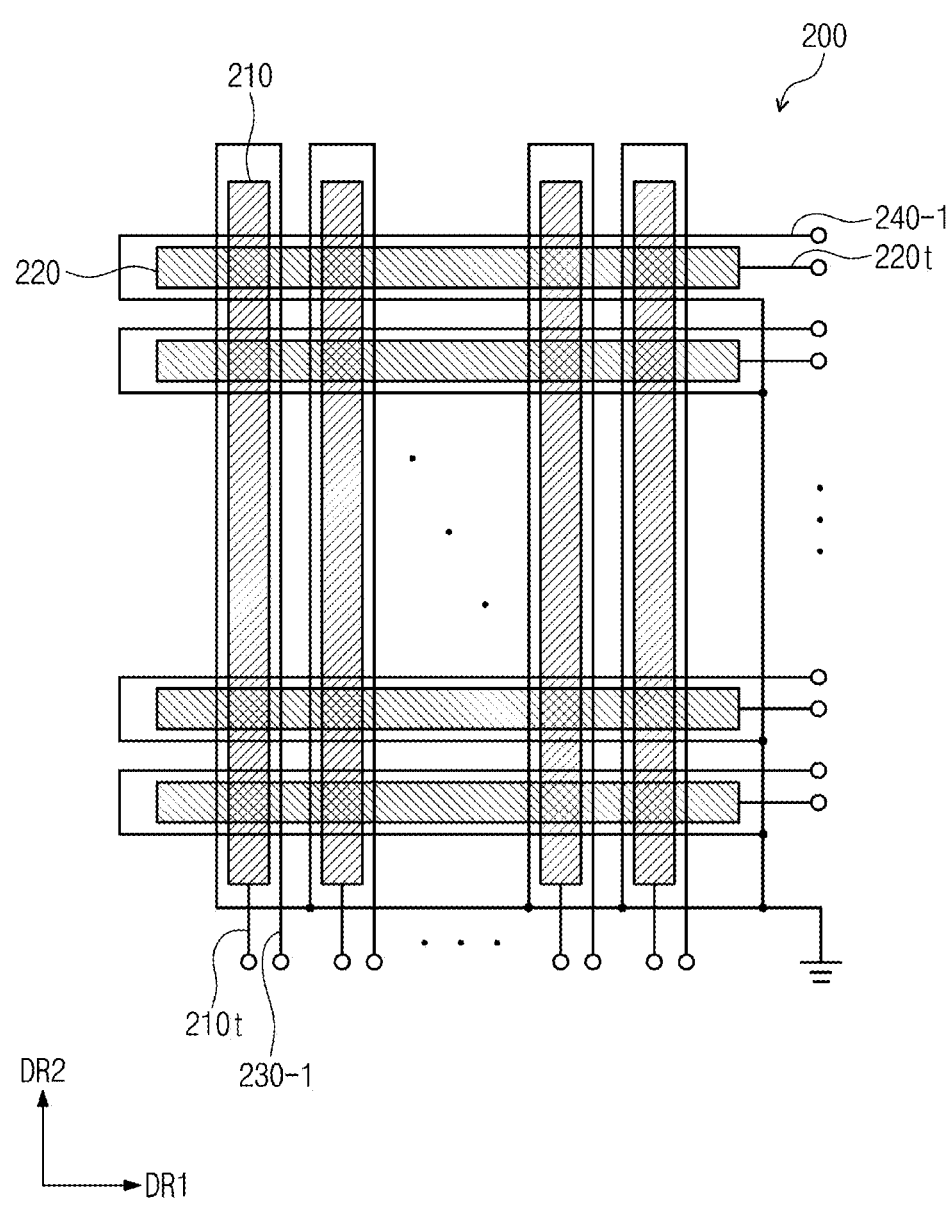
FIG. 22 is a plan view of the sensor layer according to an embodiment of the inventive concept.

FIG. 22 is a plan view of the sensor layer 200 according to an embodiment of the inventive concept.

The sensor layer 200 may include first electrodes 210 and second electrodes 220, which cross each other. The first trace lines 210t may be respectively connected to the first electrodes 210, and the second trace lines 220t may be respectively connected to the second electrodes 220.

The sensor layer 200 may include first coil electrodes 230-1 and second coil electrodes 240-1, which cross each other. Each of the first coil electrodes 230-1 and the second coil electrodes 240-1 may have a loop shape. It is illustrated that the first coil electrodes 230-1 and the second coil electrodes 240-1 and the signal lines connected to each of them are not separated from each other and have an integral shape. The first coil electrodes 230-1 may be disposed to correspond to each of the first electrodes 210, and the second coil electrodes 240-1 may be disposed to correspond to each of the second electrodes 220.

Figure 23:
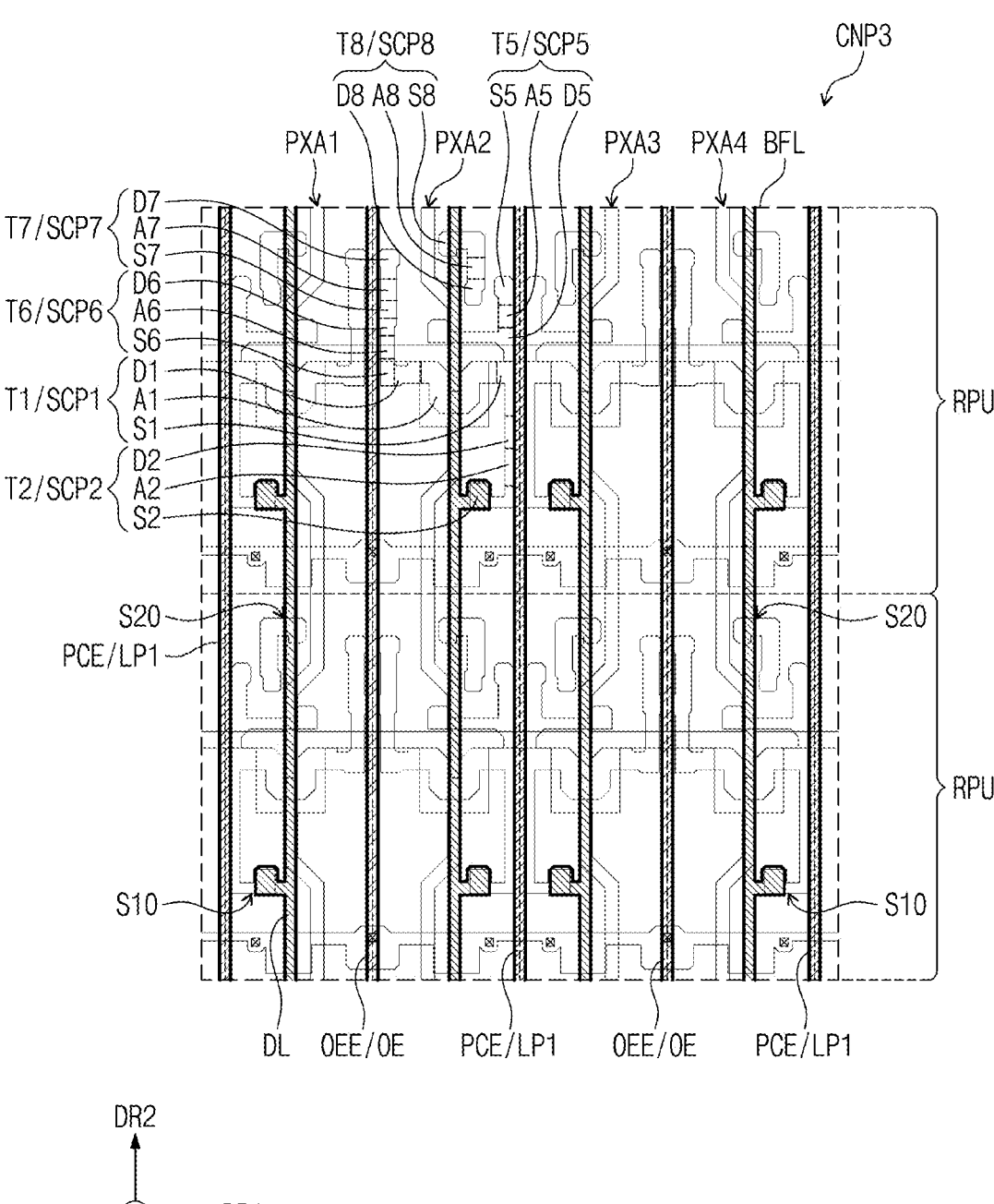
FIG. 23 is a plan view of the third source/drain layer according to an embodiment of the inventive concept.

FIG. 23 is a plan view of the third source/drain layer CNP3 according to an embodiment of the inventive concept.

In FIG. 23, like FIG. 10, the data line DL is disposed in each of the first to fourth pixel regions PXA1, PXA2, PXA3, and PXA4. According to this embodiment, the third source/drain layer CNP3 may include a plurality of first line portions LP1 and a plurality of offset lines OE extending in the same direction as the data line DL. The offset lines OE may constitute an offset electrode OEE, and the offset electrode may be disposed on the lower surface of the base layer 110 like the charge electrode PCE illustrated in FIG. 7.

Among the plurality of data lines DL, the first line portion LP1 is disposed between an i-th (here, i is a natural number greater than 1) data line and an (i+1)-th data line, and the offset line OE is disposed between the (i+1)-th data line and an (i+2)-th data line. Two data lines DL, one first line portion LP1, and one offset line OE arranged in succession form a group and are repeatedly disposed along the first direction DR1. Among two data lines DL in the group, one first line portion LP1 is disposed on the left side of a left data line DL, and one offset line OE is disposed on the left side of a right data line DL. As a result, one first line portion LP1 and one offset line OE are disposed on both sides of each of the plurality of data lines DL.

In this embodiment, the data line DL, the plurality of first line portions LP1, and the plurality of offset lines OE, which are formed through a same process, include a same material, and are disposed on a same layer, are exemplarily illustrated, but embodiments of the inventive concept are not limited thereto. The plurality of first line portions LP1 and the plurality of offset lines OE may be disposed on the lower surface of the base layer 110 as illustrated in FIG. 7, disposed inside the base layer 110 as illustrated in FIG. 20A, or disposed on a different layer of the driving circuit layer 120. However, the plurality of first line portions LP1 and the plurality of offset lines OE are disposed to be lower than the light-emitting element OLED of FIG. 7. The plurality of first line portions LP1 and the plurality of offset lines OE may be disposed on the same layer as each other or on different layers, but embodiments of the inventive concept are not limited thereto.

Figure 24A:
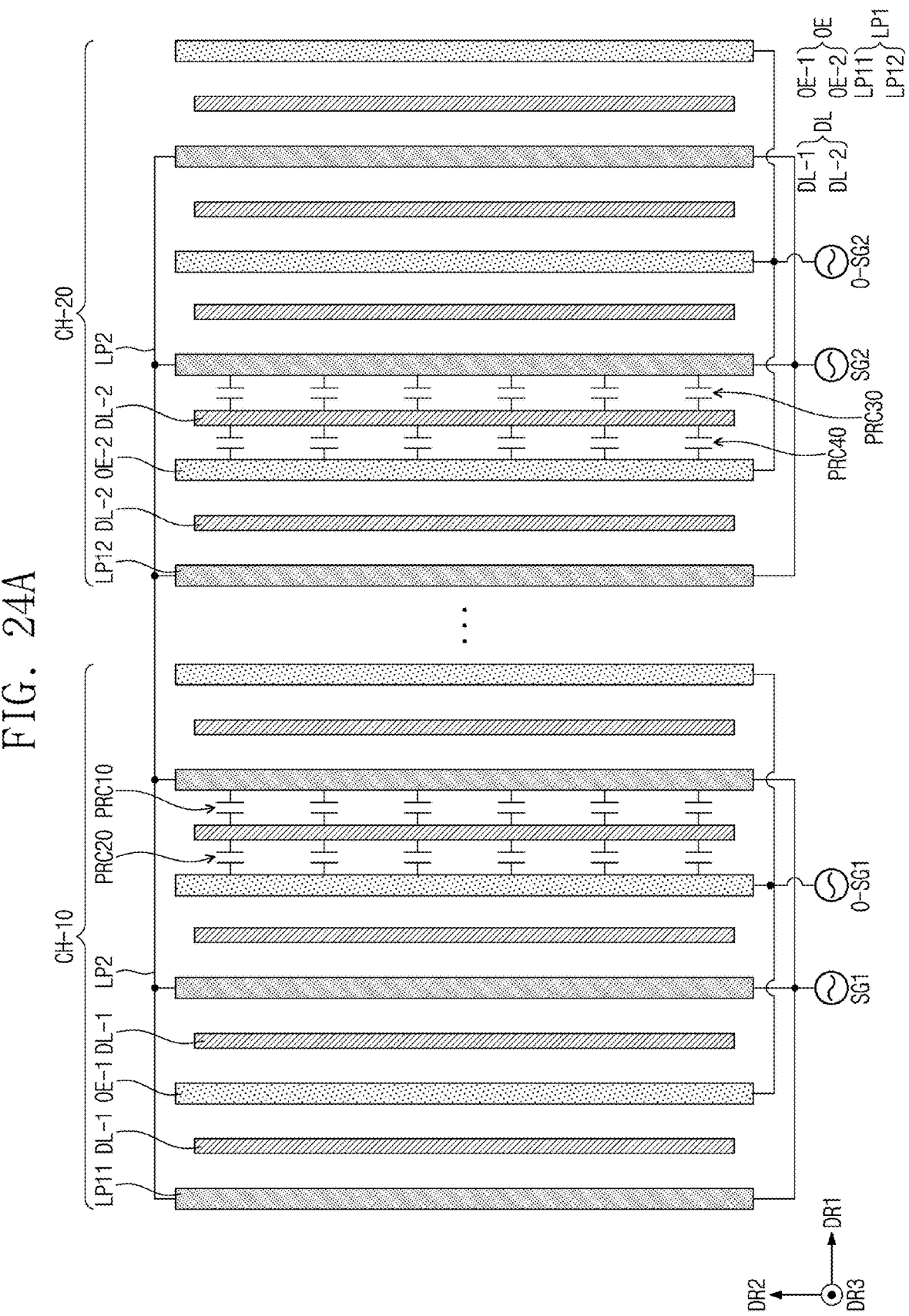
FIG. 24A is a plan view illustrating two adjacent charging channels according to an embodiment of the inventive concept.
Figure 24B:
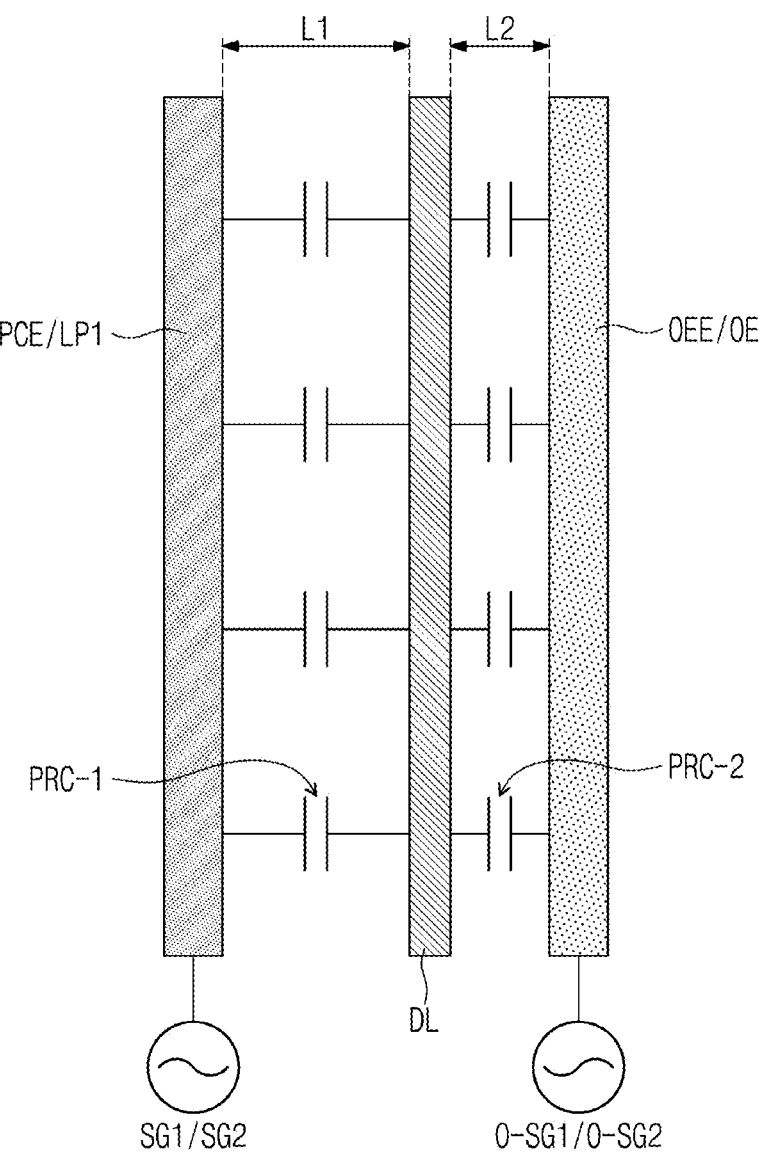
FIG. 24B is a plan view illustrating an interference phenomenon between a charging electrode and an offset electrode with respect to the data line.

FIG. 24A is a plan view illustrating two adjacent charging channels CH-10 and CH-20 according to an embodiment of the inventive concept. FIG. 24B is a plan view illustrating an interference phenomenon between the charging electrode PCE and the offset electrode OEE with respect to the data line DL.

For the convenience of explanation, the two charging channels CH-10 and CH-20 are described as a first channel CH-10 and a second channel CH-20. A non-charging channel may be disposed between the first channel CH-10 and the second channel CH-20. That is, between the first channel CH-10 and the second channel CH-20, pixel regions (not illustrated) are further disposed, and line portions (not illustrated) are disposed.

Each of the first channel CH-10 and the second channel CH-20 may include a plurality of first line portions LP1 and a plurality of offset lines OE. Each of the first line portions LP1 of the first channel CH-10 may be defined as a (1-1)-th line portion LP11, each of the first line portions LP1 of the second channel CH-20 may be defined as a (1-2)-th line portion LP12, each of the plurality of offset lines OE of the first channel CH-10 may be defined as a first offset line OE-1, and each of the plurality of offset lines OE of the second channel CH-20 may be defined as a second offset line OE-2. In addition, the data lines DL disposed to correspond to the first channel CH-10 may be defined as a first data line DL-1, and the data lines DL disposed to correspond to the second channel CH-20 may be defined as a second data line DL-2.

The arrangement relationship of the first data line DL-1, the (1-1)-th line portion LP11, and the first offset line OE-1 and the arrangement relationship of the second data line DL-2, the (1-2)-th line portion LP12, and the second offset line OE-2 may be substantially the same as the arrangement relationship of one data line DL and the first line portion LP1 and the offset line OE disposed on both sides of the data line DL which are described in FIG. 23.

In the first direction DR1, the (1-1)-th line portion LP11 is disposed on one side of the first data line DL-1, and the first offset line OE-1 is disposed on the other side thereof. For example, the first data line DL-1 may be disposed between the (1-1)-th line portion LP11 and the first offset line OE-1. The (1-1)-th line portion LP11 is disposed on the left side of any one of the first data lines DL-1, and the first offset line OE-1 is disposed on the right side thereof. In addition, the (1-1)-th line portion LP11 is disposed on the right side of another first data line DL-1 closest to any one of the first data lines DL-1, and the first offset line OE-1 is disposed on the left side thereof. When the first data line DL-1 or the first offset line OE-1 is disposed between two adjacent first data lines DL-1 among three consecutive first data lines DL-1, the first offset line OE-1 or the first data line DL-1 may be disposed between two differently selected adjacent first data lines DL-1. The arrangement relationship of the second data line DL-2, the (1-2)-th line portion LP12, and the second offset line OE-2 may be substantially the same as the arrangement relationship of the first data line DL-1, the (1-1)-th line portion LP11, and the first offset line OE-1 which are described above.

Hereinafter, a description will be given, focusing on one first data line DL-1 corresponding to the first channel CH-10 and one second data line DL-2 corresponding to the second channel CH-20.

In the pen charging driving mode, the first driving signal SG1 may be applied to the (1-1)-th line portion LP11 and the second driving signal SG2 may be applied to the (1-2)-th line portion LP12. The first channel CH-10 and the second channel CH-20 may generate an induced magnetic field. In this case, the first driving signal SG1 may cause interference to the first data line DL-1, and the second driving signal SG2 may cause interference to the second data line DL-2.

The above-mentioned interference may be eliminated or reduced by the first offset line OE-1 and the second offset line OE-2. When the first driving signal SG1 is applied to the (1-1)-th line portion LP11, a first offset signal O-SG1 may be applied to the first offset line OE-1, and when the second driving signal SG2 is applied to the (1-2)-th portion LP12, a second offset signal O-SG2 may be applied to the second offset line OE-2. The first offset signal O-SG1 may be the offset signal of the first driving signal SG1. For example, a signal of the first offset signal O-SG1 may be offset or delayed relative to a signal of the first driving signal SG1. In an embodiment, the amplitude of the composite signal of the first offset signal O-SG1 and the first driving signal SG1 is reduced more than the amplitude of the first driving signal SG1. The first offset signal O-SG1 may be the reverse phase signal of the first driving signal SG1. That is, the first offset signal O-SG1 may be the same signal as the second driving signal SG2. The second offset signal O-SG2 may be the offset signal of the second driving signal SG2. For example, a signal of the second offset signal O-SG2 may be offset or delayed relative to a signal of the second driving signal SG2. In an embodiment, the amplitude of the composite signal of the second offset signal O-SG2 and the second driving signal SG2 is reduced more than the amplitude of the second driving signal SG2. The second offset signal O-SG2 may be a reverse phase signal of the second driving signal SG2. That is, the second offset signal O-SG2 may be the same signal as the first driving signal SG1.

Interference caused by a first parasitic capacitor PRC10 formed between the first data line DL-1 and the (1-1)-th line portion LP11 and interference caused by a second parasitic capacitor PRC20 formed between the first data line DL-1 and the first offset line OE-1 may offset each other. Noise generated in the first data line DL-1 by the first driving signal SG1 provided to the (1-1)-th line portion LP11 may be reduced by the first offset signal O-SG1 provided to the first offset line OE-1. For the same reason, interference caused by a third parasitic capacitor PRC30 formed between the second data line DL-2 and the (1-2)-th line portion LP12 and interference caused by a fourth parasitic capacitor PRC40 formed between the second data line DL-2 and the second offset line OE-2 may offset each other.

FIG. 24B is used to explain the offset signals O-SG1 and O-SG2 which may be changed according to a first distance L1 between the data line DL and the first line portion LP1 and a second distance L2 between the data line DL and the offset line OE. FIG. 24A illustrates the arrangement relationship of the first data line DL-1, the (1-1)-th line portion LP11, and the first offset line OE-1 and the arrangement relationship of the second data line DL-2, the (1-2)-th line portion LP12, and the second offset line OE-2, in which the first distance L1 and the second distance L2 are the same as each other, but in an embodiment of the inventive concept, the first distance L1 and the second distance L2 may be different from each other.

When the second distance L2 is smaller than the first distance L1, the amplitude of the offset signals O-SG1 and O-SG2 may be smaller than the amplitude of the driving signals SG1 and SG2, and when the second distance L2 is greater than the first distance L1, the amplitude of the offset signals O-SG1 and O-SG2 may be greater than the amplitude of the driving signals SG1 and SG2. The offset signals O-SG1 and O-SG2 may be set to have an amplitude sufficient to completely eliminate noise generated by the driving signals SG1 and SG2.

A first parasitic capacitance PRC-1 between the data line DL and the first line portion LP1, an amplitude V1m of the driving signals SG1 and SG2, a second parasitic capacitance PRC-2 between the data line DL and the offset line OE, and an amplitude V2m of the offset signals O-SG1 and O-SG2 may satisfy Equation 1 below.

$$PRC\text{-}1 \times |V1m| = PRC\text{-}2 \times |V2m| \qquad \text{[Equation 1]}$$

When the driving signals SG1 and SG2 are applied to the first line portion LP1, noise generated in the data line DL is determined by a first charged charge amount between the first line portion LP1 and the driving signals SG1 and SG2. The first charged charge amount is proportional to the amplitude of the first parasitic capacitance PRC-1 and the driving signals SG1 and SG2. In particular, the amplitude of the driving signals SG1 and SG2 may be selected to be a maximum value.

A second charged charge amount between the data line DL and the offset line OE may offset the first charged charge amount, and when the absolute values of the second charged charge amount and the first charged charge amount are the same as each other, the offset signals O-SG1 and O-SG2 may completely eliminate noise generated by the driving signals SG1 and SG2.

Figure 25A:
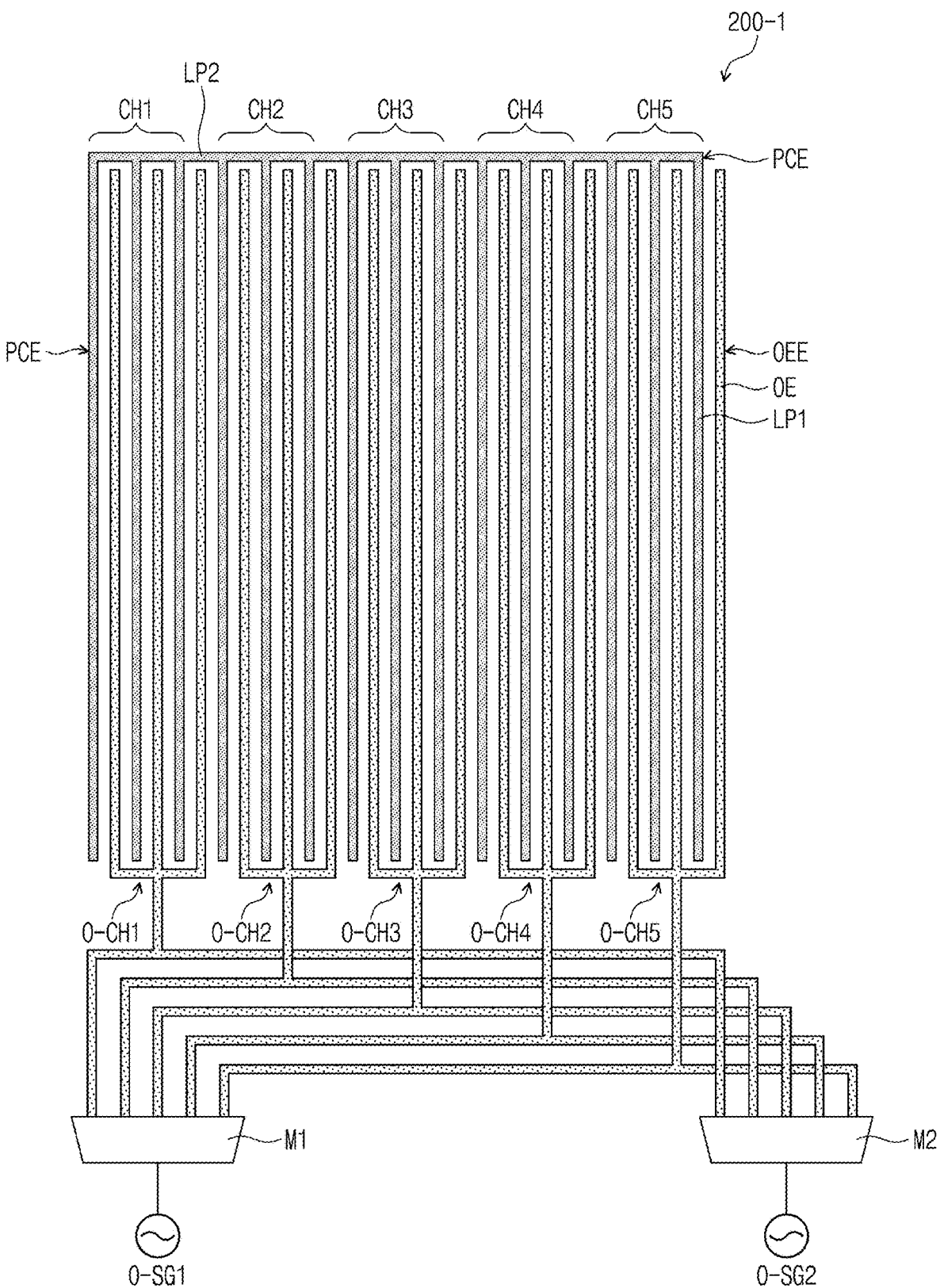
FIGS. 25A to 25C are plan views of the charging electrode layer according to an embodiment of the inventive concept.
Figure 25B:
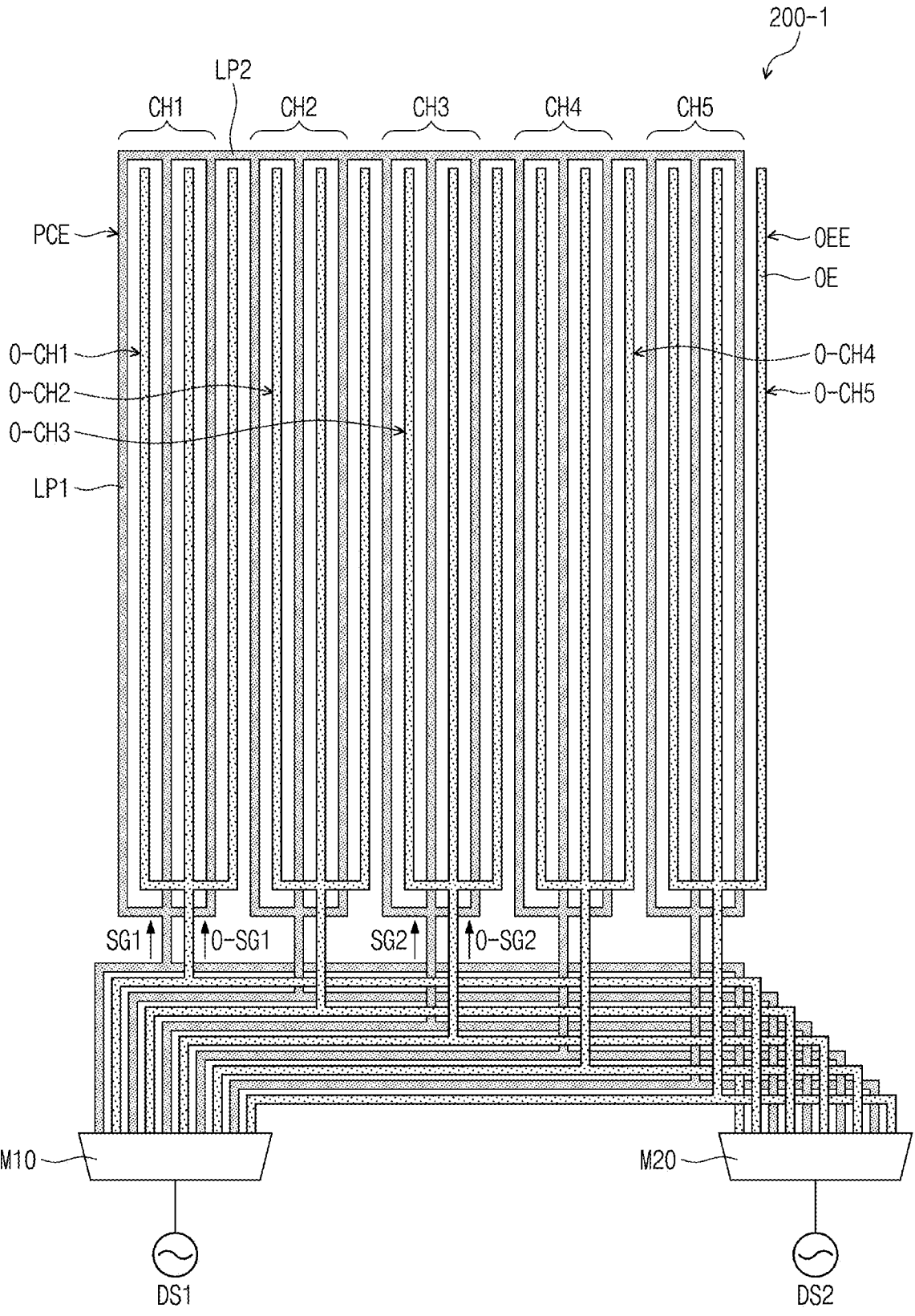
Figure 25C:
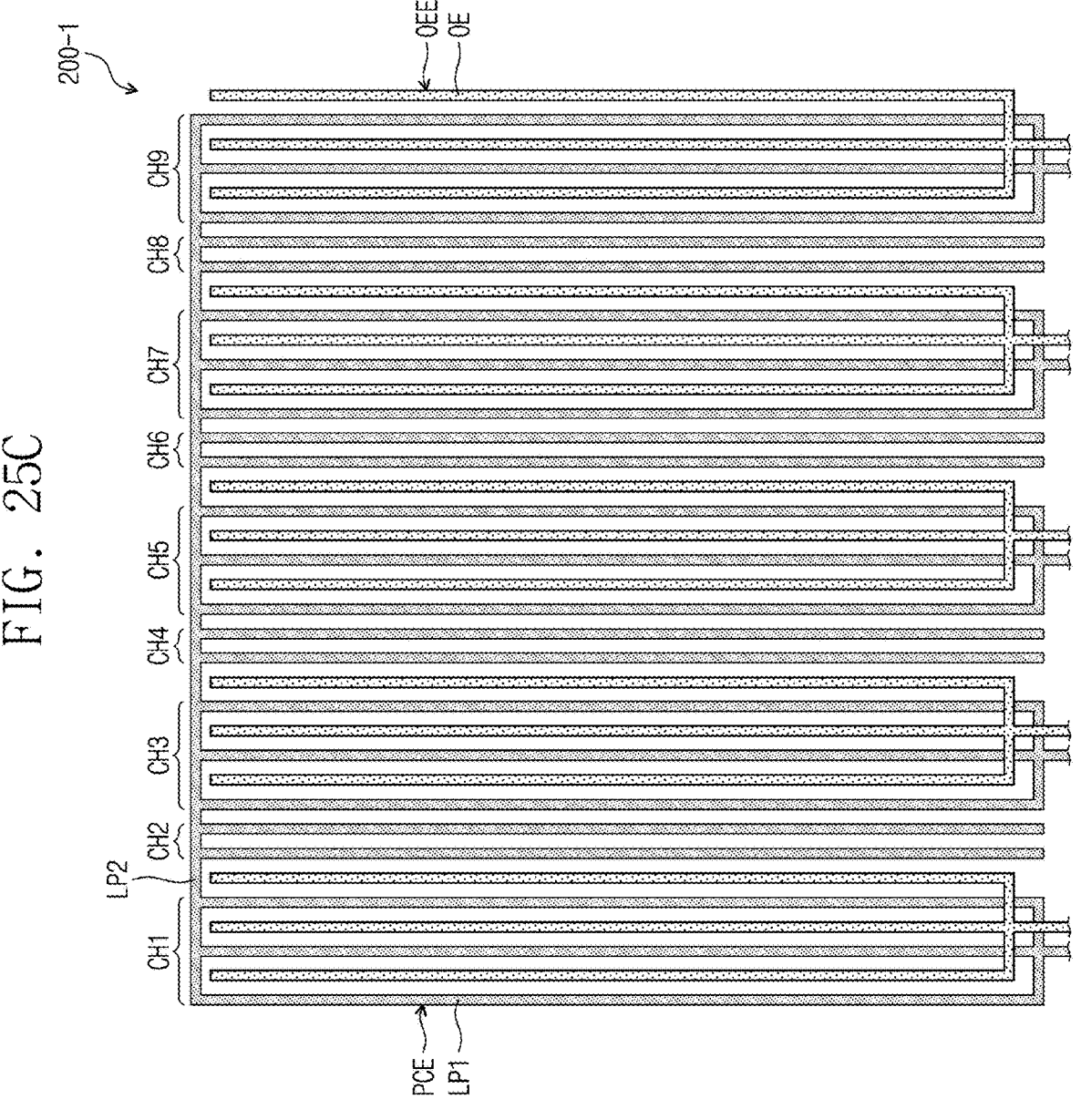

FIGS. 25A to 25C are plan views of the charging electrode layer 200-1 according to an embodiment of the inventive concept.

FIG. 25A illustrates a first multiplexer (mux) circuit M1 and a second multiplexer (mux) circuit M2 included in the sensor driver 200C illustrated in FIG. 4, together with charging electrode PCE and the offset electrode OEE. The first mux circuit M1 and the second mux circuit M2 may be electrically connected to the offset electrode OEE through a circuit board.

In this embodiment, the charging electrode PCE including five channels CH1 to CH5 and the offset electrode OEE including five offset channels O-CH1 to O-CH5 are exemplarily illustrated. The first line portions LP1 of each of the five channels CH1 to CH5 may receive a same driving signal, and the offset lines OE of each of the five offset channels O-CH1 to O-CH5 may receive a same offset signal. A data line may be disposed between the first line portion LP1 and the offset line OE which are adjacent to each other.

Each of the first mux circuit M1 and the second mux circuit M2 is electrically connected to the five offset channels O-CH1 to O-CH5. The first mux circuit M1 may receive the first offset signal O-SG1 as a first input signal and selectively provide the first input signal to a plurality of offset lines OE in response to a control signal. The first mux circuit M1 may output the first offset signal O-SG1 selectively input to the five offset channels O-CH1 to O-CH5. The first mux circuit M1 may output the first offset signal O-SG1 to an offset channel corresponding to a channel to which the first driving signal is applied.

The second mux circuit M2 may selectively provide a second input signal to a plurality of offset lines OE in response to a control signal. The second mux circuit M2 may receive the second offset signal O-SG2 as a second input signal and selectively output the second offset signal O-SG2 to the five offset channels O-CH1 to O-CH5. The second mux circuit M2 may output the second offset signal O-SG2 to an offset channel corresponding to a channel to which the second driving signal is applied.

As illustrated in FIG. 25B, each of a first mux circuit M10 and a second mux circuit M20 may be electrically connected to the five channels CH1 to CH5 and the five offset channels O-CH1 to O-CH5.

The first mux circuit M10 may receive a first input signal DS1 and selectively output it to the five channels CH1 to CH5 and the five offset channels O-CH1 to O-CH5. The first mux circuit M10 may output the first input signal DS1 as a first driving signal SG1 and a second offset signal O-SG2. The second mux circuit M20 may receive a second input signal DS2 and selectively output it to the five channels CH1 to CH5 and the five offset channels O-CH1 to O-CH5. The second mux circuit M20 may output the second input signal DS2 as a second driving signal SG2 and a first offset signal O-SG1. However, during a specific time period, the second mux circuit M20 may output the second input signal DS2 to a channel to which the first input signal DS1 is not applied among the five channels CH1 to CH5, and output the second input signal DS2 to an offset channel to which the first input signal DS1 is not applied among the offset channels O-CH1 to O-CH5.

In this case, the second input signal DS2 may be a reverse phase signal of the first input signal DS1. During a specific time period, when the first input signal DS1 is output to one of the five channels CH1 to CH5 as a first driving signal SG1, the second input signal DS2 is output to another one of the five channels CH1 to CH5 as a second driving signal SG2 to form a current path. During a same time period, the second input signal DS2 is applied to an offset channel corresponding to a channel to which the first driving signal SG1 is applied as a first offset signal O-SG1. Accordingly, the interference of the first input signal DS1 with respect to a corresponding data line may be offset by the second input signal DS2 applied to an offset channel. During a same time period, the first input signal DS1 is applied to an offset channel corresponding to a channel to which the second driving signal SG2 is applied as a second offset signal O-SG2. Accordingly, the interference of the second input signal DS2 with respect to a corresponding data line may be offset by the first input signal DS1 applied to an offset channel.

In an embodiment of the inventive concept, FIG. 25B illustrates a state in which the first input signal DS1 is applied to the first channel CH1 as a first driving signal SG1, the first input signal DS1 is applied to the third offset channel O-CH3 as a second offset signal O-SG2, the second input signal DS2 is applied to the third channel CH3 as a second driving signal SG2, and the second input signal DS2 is applied to the first offset channel O-CH1 as a first offset signal O-SG1.

FIG. 25C exemplarily illustrates the charging electrode PCE including first to ninth channels CH1 to CH9. According to this embodiment, the channels are divided into channels usable as charging channels and channels usable as non-charging channels. The even-numbered channels CH2, CH4, CH6, and CH8 define non-charging channels because they do not receive a driving signal, and the odd-numbered channels CH1, CH3, CH5, CH7, and CH9 may charging channels because they can receive a driving signal. In this embodiment, it is illustrated that the first line portions LP1 of the charging channel are disposed in a higher quantity than the first line portions LP1 of the non-charging channel, but embodiments of the inventive concept are not limited thereto. The offset line OE of the offset electrode OEE is disposed to correspond only to the charging channel.

Figure 26:
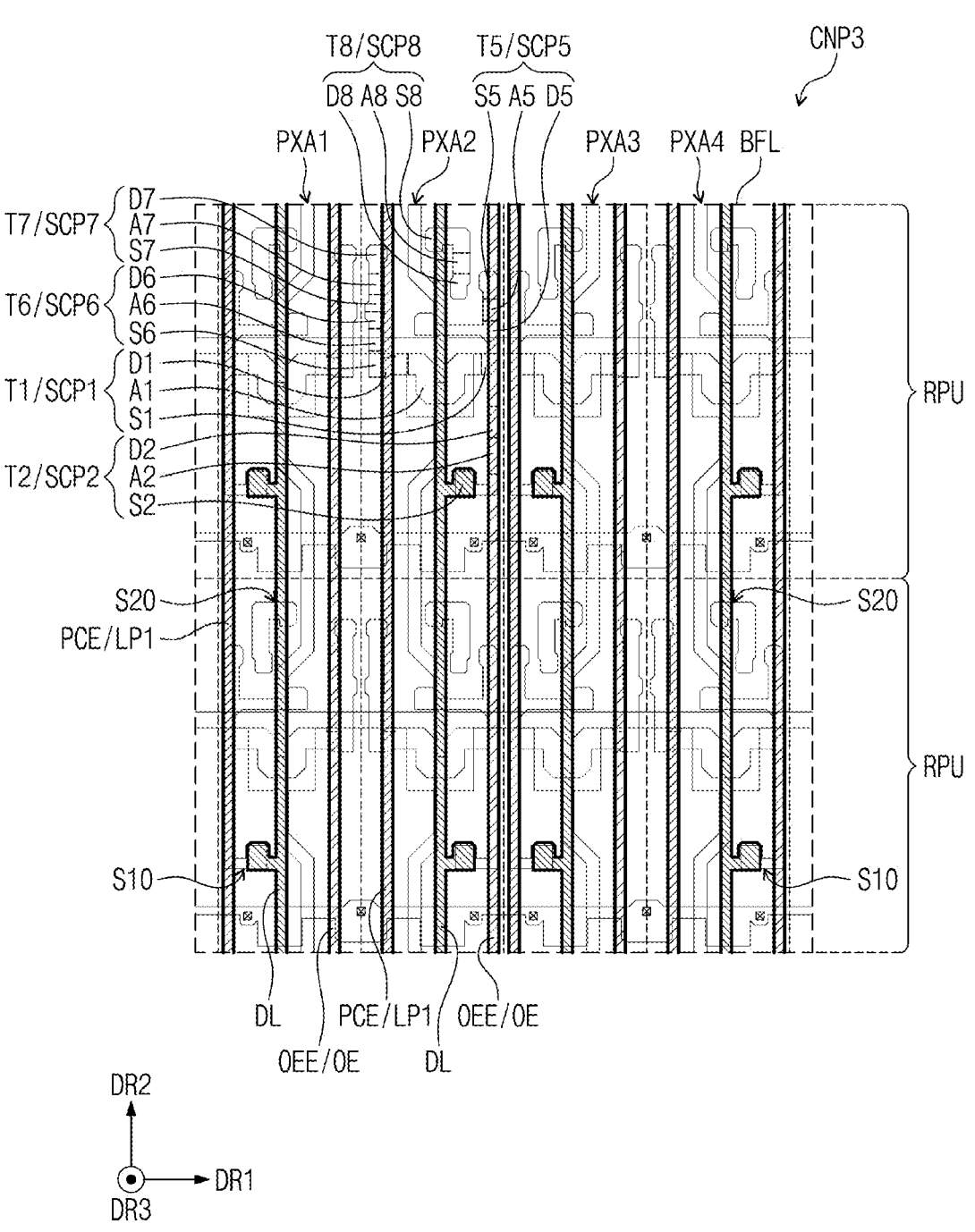
FIG. 26 is a plan view of the third source/drain layer according to an embodiment of the inventive concept.

FIG. 26 is a plan view of the third source/drain layer CNP3 according to an embodiment of the inventive concept. Hereinafter, a description will be given, focusing on differences from the embodiment of FIG. 23.

The data line DL is disposed in each of the first to fourth pixel regions PXA1, PXA2, PXA3, and PXA4. The first line portion LP1 and the offset line OE may be disposed on both sides of the data line DL in each of the first to fourth pixel regions PXA1, PXA2, PXA3, and PXA4. Since a driving signal and an offset signal are respectively applied to the first line portion LP1 and the offset line OE disposed at the boundary of two adjacent pixel regions among the first to fourth pixel regions PXA1, PXA2, PXA3, and PXA4, the two signals may offset each other.

According to the above description, an input by a pen as well as a body part of a user may be sensed. It is possible to sense both an input by a body part of a user in a capacitive method and an input by a passive-type pen in an electromagnetic induction method.

By disposing the charging electrode on a layer different from that of the input sensor, it is possible to form the charging electrode with increased design freedom and reduced resistance. The charging electrode may generate an induced magnetic field with high intensity.

During the pen charging driving mode, interference between the charging electrode and the data line may be prevented or reduced. It is also possible to prevent the display quality of the display panel from deteriorating.

Although the above has been described with reference to embodiments of the inventive concept, those skilled in the art or those of ordinary skill in the art will understand that various modifications and changes can be made to the inventive concept within the scope that does not depart from the spirit and technical field of the inventive concept.

What is claimed is:

1. An electronic device comprising:
a base layer;
a light-emitting element disposed above the base layer;
an input sensor disposed above the light-emitting element;
a data line disposed above the base layer; and
a charging electrode disposed below the light-emitting element and including a plurality of first line portions, wherein each of the first line portions overlap the data line in a plan view, wherein the charging electrode generates an induced magnetic field when a first one of the plurality of first line portions receives a first driving signal and a second and other one of the plurality of first line portions receives a second driving signal whose phase is delayed from the first driving signal, and the second driving signal applied to the second of the plurality of first line portions produces a parasitic capacitance with the data line that offsets a parasitic capacitance produced by the first driving signal applied to the first of the plurality of first line portions.

2. The electronic device of claim 1, wherein the second driving signal is a reverse phase signal of the first driving signal.

3. The electronic device of claim 1, wherein:
the charging electrode further comprises a second line portion connecting the plurality of first line portions to each other and extending in a direction crossing the plurality of first line portions; and
the plurality of first line portions comprise (1-1)-th line portions defining a plurality of charging channels that receive one of the first driving signal and the second driving signal.

4. The electronic device of claim 3, wherein a first one of the plurality of charging channels receives the first driving signal and a second one of the plurality of charging channels receives the second driving signal.

5. The electronic device of claim 1, wherein the charging electrode comprises a first charging electrode and a second charging electrode which are electrically separated from each other.

6. The electronic device of claim 5, wherein:
the plurality of first line portions extend in a first direction; and
some of the plurality of first line portions of the first charging electrode and some of the plurality of first line portions of the second charging electrode are alternately disposed in a second direction crossing the first direction.

7. The electronic device of claim 1, wherein:
the light-emitting element comprises a first light-emitting element, a second light-emitting element, and a third light-emitting element arranged in a first direction;
the data line extends in a second direction perpendicular to the first direction and comprises a first data line, a second data line, and a third data line respectively corresponding to the first light-emitting element, the second light-emitting element, and the third light-emitting element; and
the plurality of first line portions extend in the first direction or in a cross direction crossing the first direction and the second direction.

8. The electronic device of claim 1, wherein:
the base layer comprises a plurality of pixel regions arranged in a n rows and m columns, wherein n and m are natural numbers greater than or equal to 2;
the light-emitting element is disposed to correspond to each of the plurality of pixel regions; and
the plurality of first line portions are disposed in a one-to-one correspondence with the n rows.

9. The electronic device of claim 1, wherein:
the base layer comprises a first resin layer and a second resin layer disposed on the first resin layer; and
the charging electrode is disposed between the first resin layer and the second resin layer.

10. The electrode device of claim 1, wherein the charging electrode is disposed on a same layer as the data line.

11. The electronic device of claim 1, wherein:

the light-emitting element comprises a first electrode, a light-emitting layer disposed on the first electrode, and a second electrode disposed on the light-emitting layer; and the charging electrode is disposed below the second electrode.

12. The electronic device of claim 1, wherein the input sensor comprises a first electrode and a second electrode crossing the first electrode.

13. The electronic device of claim 1, wherein the input sensor comprises a third electrode and a fourth electrode crossing the third electrode, wherein each of the third electrode and the fourth electrode generates an induced current by a magnetic field generated by an input device.

14. The electronic device of claim 13, wherein the input device comprises an RLC resonance circuit which is charged by the induced magnetic field generated by the charging electrode, and the induced magnetic field generated by the charging electrode generates a current in the input device that emits a magnetic field from the input device that induces a current in the third electrode and the fourth electrode of the input sensor that is transmitted to a sensor driver to calculate coordinate information of an input.

15. An electronic device comprising:

a base layer;

a light-emitting element disposed above the base layer;

an input sensor disposed above the light-emitting element;

a data line disposed above the base layer; and a charging electrode disposed below the light-emitting element and including a plurality of first line portions, wherein each of the first line portions cross the data line in a plan view, wherein the charging electrode generates an induced magnetic field when a first one of the plurality of first line portions receives a first driving signal and a second other one of the plurality of first line portions receives a second driving signal whose phase is delayed from the first driving signal, the plurality of first line portions further comprise (1-2)-th line portions defining a plurality of non-charging channels that do not receive the first driving signal and the second driving signal, and each of the plurality of non-charging channels is disposed between two adjacent charging channels among the plurality of charging channels.

16. An electronic device comprising:

a base layer comprising a plurality of pixel regions comprising a first pixel region and a second pixel region which are disposed in a first direction;

a plurality of light-emitting elements comprising a first light-emitting element corresponding to the first pixel region and a second light-emitting element corresponding to the second pixel region and disposed above the base layer;

a plurality of data lines comprising a first data line extending in a second direction crossing the first direction and corresponding to the first pixel region and a second data line extending in the second direction and corresponding to the second pixel region;

a charging electrode disposed below the first light-emitting element and the second light-emitting element and comprising a plurality of first line portions extending in the second direction; and an offset electrode disposed below the first light-emitting element and the second light-emitting element and including a plurality of offset lines extending in the second direction, wherein:

the plurality of first line portions comprise a (1-1)-th line portion disposed on one side of the first data line and a (1-2)-th line portion disposed on one side of the second data line in the first direction; and the plurality of offset lines comprise a first offset line disposed on the other side of the first data line and a second offset line disposed on the other side of the second data line in the first direction, wherein:

the first data line is disposed between the (1-1)-th line portion and the first offset line in the first direction; and the second data line is disposed between the (1-2)-th line portion and the second offset line in the first direction, wherein the charging electrode generates an induced magnetic field when the (1-1)-th line portion receives a first driving signal and the (1-2)-th line portion receives a second driving signal whose phase delayed from the first driving signal; and an amplitude of a composite signal of the first driving signal and a first offset signal is less than an amplitude of the first driving signal when the (1-1)-th line portion receives the first driving signal and the first offset line receives the first offset signal.

17. The electronic device of claim 16, wherein the second driving signal is a reverse phase signal of the first driving signal.

18. The electronic device of claim 16, wherein the first offset signal is a reverse phase signal of the first driving signal.

19. The electronic device of claim 16, wherein:

an amplitude of a composite signal of the second driving signal and a second offset signal is less than an amplitude of the second driving signal when the (1-2)-th line portion receives the second driving signal and the second offset line receives the second offset signal.

20. The electronic device of claim 16, wherein, in the first direction, a first distance between the first data line and the (1-1)-th line portion and a second distance between the first data line and the first offset line are substantially equal to each other.

21. The electronic device of claim 16, wherein:

in the first direction, a first distance between the first data line and the (1-1)-th line portion is different from a second distance between the first data line and the first offset line; and when the second distance is greater than the first distance, a maximum amplitude of the first offset signal is greater than a maximum amplitude of the first driving signal.

22. The electronic device of claim 21, wherein a parasitic capacitance between the first data line and the (1-1)-th line portion multiplied by an amplitude of the first driving signal is equal to a parasitic capacitance between the first data line and the first offset line multiplied by an amplitude of the first offset signal.

23. The electronic device of claim 16, wherein the charging electrode further comprises a second line portion connecting a plurality of first line portions to each other.

24. The electronic device of claim 16, wherein:

some of the plurality of pixel regions are disposed between the first pixel region and the second pixel region in the first direction; and some of the plurality of first line portions are disposed between the (1-1)-th line portion and the (1-2)-th line portion.

25. The electronic device of claim 16, further comprising a sensor driver electrically connected to the plurality of offset lines, wherein the sensor driver comprises:

a first multiplexer circuit electrically connected to the plurality of offset lines and selectively providing a first input signal to the plurality of offset lines; and a second multiplexer circuit electrically connected to the plurality of offset lines and selectively providing a second input signal to the plurality of offset lines.

26. The electronic device of claim 25, wherein:

each of the first multiplexer circuit and the second multiplexer circuit is further electrically connected to the plurality of first line portions; and when the second driving signal and the first offset signal are the reverse phase signals of the first driving signal, the first multiplexer circuit provides the first driving signal as the first input signal to the (1-1)-th line portion, the second multiplexer circuit provides the second driving signal as the second input signal to the (1-2)-th line portion, and the second multiplexer circuit provides the second driving signal as the first offset signal to the first offset line.

27. The electronic device of claim 26, wherein the plurality of offset lines define a plurality of offset channels, wherein:

offset lines of a first offset channel corresponding to the first charging channel among the plurality of offset channels include the first offset line and receive the first offset signal; and offset lines of a second offset channel corresponding to the second charging channel among the plurality of offset channels include the second offset line and receive a second offset signal different from the first offset signal.

28. The electronic device of claim 26, wherein:

each of the first light-emitting element and the second light-emitting element comprises a first electrode, a light-emitting layer disposed on the first electrode, and a second electrode disposed on the light-emitting layer;

the second electrode of the first light-emitting element and the second electrode of the second light-emitting element have an integral shape; and the charging electrode is disposed below the second electrode of the first light-emitting electrode and the second electrode of the second light-emitting element, which have the integral shape.

29. The electronic device of claim 16, wherein:

at least some of the plurality of first line portions define a plurality of charging channels;

first line portions of a first charging channel among the plurality of charging channels comprise the (1-1)-th line portion and receive the first driving signal; and first line portions of a second charging channel among the plurality of charging channels comprise the (1-2)-th line portion and receive the second driving signal.

30. The electronic device of claim 29, wherein:

some of the plurality of first line portions define a plurality of non-charging channels; and each of the plurality of non-charging channels is disposed between two adjacent charging channels among the plurality of charging channels.

* * * * *